United States Patent
Hase et al.

(10) Patent No.: US 8,314,655 B2
(45) Date of Patent: Nov. 20, 2012

(54) RF POWER AMPLIFIER AND RF POWER MODULE USING THE SAME

(75) Inventors: Masatoshi Hase, Kodaira (JP); Masahiro Ito, Tachikawa (JP); Takashi Soga, Takasaki (JP); Satoshi Tanaka, Kokubunji (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/345,895

(22) Filed: Jan. 9, 2012

(65) Prior Publication Data
US 2012/0112838 A1 May 10, 2012

Related U.S. Application Data

(62) Division of application No. 12/696,376, filed on Jan. 29, 2010, now Pat. No. 8,098,102.

(30) Foreign Application Priority Data

Feb. 3, 2009 (JP) ................ 2009-022266
Feb. 26, 2009 (JP) ................ 2009-043640

(51) Int. Cl.
*H03F 3/68* (2006.01)
(52) U.S. Cl. ............... 330/126; 330/124 R; 330/295
(58) Field of Classification Search ............ 330/295, 330/124 R, 126, 296
See application file for complete search history.

(56) References Cited

U.S. PATENT DOCUMENTS

| 6,151,509 A * | 11/2000 | Chorey ............... 455/552.1 |
| 6,919,762 B2 | 7/2005 | Akamine et al. |
| 7,368,988 B2 | 5/2008 | Matsumoto et al. |
| 8,103,226 B2 * | 1/2012 | Andrys et al. ......... 455/127.1 |

FOREIGN PATENT DOCUMENTS

| JP | 2004-193846 A | 7/2004 |
| JP | 2005-217558 A | 8/2005 |
| JP | 2006-270670 A | 10/2006 |

OTHER PUBLICATIONS

Bult, Klaas et al, "A Class of Analog CMOS Circuits Based on the Square-Law Characteristic of an MOS Transistor in Saturation", IEEE Journal of Solid-State Circuits, vol. SC-22, No. 3, Jun. 1987, pp. 357-365.
Razavi, Behzad, "Design of Analog CMOS Integrated Circuits", Maruzen Co., Ltd 2003, cover page, pp. 32-33 (English translation, McGraw Hill Companies Inc., 2001, 5 pages).

\* cited by examiner

*Primary Examiner* — Hieu Nguyen
(74) *Attorney, Agent, or Firm* — Mattingly & Malur, PC

(57) ABSTRACT

The RF power amplifier circuit including multiple amplification stages has a previous-stage amplifier, a next-stage amplifier and a controller. The previous-stage amplifier responds to an RF transmission input signal. The next-stage amplifier responds to an amplification signal output by the previous-stage amplifier. In response to an output-power-control voltage, the controller controls the former- and next-stage amplifiers in quiescent current and gain. In response to the output-power-control voltage, the quiescent current and gain of the previous-stage amplifier are continuously changed according to a first continuous function, whereas those of the next-stage amplifier are continuously changed according to a second continuous function. The second continuous function is higher than the first continuous function by at least one in degree. The RF power amplifier circuit brings about the effect that the drop of the power added efficiency in low and middle power modes is relieved.

10 Claims, 16 Drawing Sheets

RF POWER AMPLIFIER AND RF POWER MODULE USING THE SAME

CROSS-REFERENCES

This application is a divisional application of U.S. Ser. No. 12/696,376, filed Jan. 29, 2010, which is hereby incorporated by reference.

This application claims priority to JP 2009-022266, filed Feb. 3, 2009 and JP 2009-043640, filed Feb. 26, 2009.

FIELD OF THE INVENTION

The present invention relates to an RF power amplifier circuit and an RF power amplifier module using the same. Particularly, it relates to a technique useful for relieving the drop of PAE (Power Added Efficiency) of an RF power amplifier circuit including multiple amplification stages in low and middle power modes.

BACKGROUND OF THE INVENTION

Mobile communication systems typified by e.g. GSM (Global System for Mobile Communications) and GPRS (General Packet Radio Service) have been used almost all over the world, and are expected to continue to be used in the future. Mobile communication systems such as GSM and GPRS require controlling the transmitted power of a mobile data terminal according to the communication distance between a base station and the mobile data terminal. The transmitted power control is implemented by controlling the power gain of an RF power amplifier circuit incorporated in a mobile data terminal by use of a control voltage.

The Japanese Unexamined Patent Publication No. JP-A-2004-193846 describes a means to change the gate bias voltage of a transistor of each of multiple amplification stages of an RF power amplifier circuit of a radio communication system according to an output-power-control voltage.

Further, the Japanese Unexamined Patent Publication No. JP-A-2006-270670 likewise describes a means to change the gate bias voltage of a transistor of each of multiple amplification stages of an RF power amplifier circuit of a radio communication system according to an output-power-control voltage. A biasing circuit operable to generate a gate bias voltage for an N-channel MOS FET of each of the multiple amplification stages includes a biasing transistor which is connected with the corresponding N-channel MOS FET to form a current mirror. The gate and drain of the biasing transistor are connected together, whereby the biasing transistor is diode-connected. Each biasing transistor is supplied with a bias current through the drain of a corresponding P-channel MOS FET. The sources of the P-channel MOS FETs are connected to a power source, and the gates of the P-channel MOS FETs are controlled by a voltage from an output terminal of an operational amplifier. The bias currents from the P-channel MOS FETs are controlled by a voltage drop by a resistance connected with a non-inverting input of the operational amplifier. The voltage drop by the resistance is controlled by an output-power-control voltage, which is supplied to an inverting input of the operational amplifier.

In the Japanese Unexamined Patent Publication No. JP-A-2005-217558, it is described, as a means for increasing the power efficiency in a low power mode, to switch stepwise the gate bias voltage of a transistor of the final stage amplifier of multiple stages' amplifiers of an RF power amplifier, which is supplied with a power source controlled according to an output-level-control signal, according to an output-level-control signal thereby to make the bias voltage in the low power mode lower than that in the high power mode.

In the RF power amplifier circuit as described in the JP-A-2006-270670, the drain current of the P-channel MOS FET for bias current setting is supplied to an input terminal of a square-root circuit; an output current resulting from the square root conversion, which arises from an output terminal of the square-root circuit, is supplied to the resistance for bias current setting. Hence, the bias current of the transistor of each of multiple amplification stages of an RF power amplifier circuit takes a value in proportion to the square of the output-power-control voltage, and therefore a sharp change of the transmitted power in response to a change of the output-power-control voltage can be lightened.

SUMMARY OF THE INVENTION

In mobile communication systems including GSM and GPRS, GMSK (Gaussian filtered Minimum Shift Keying) has been used as a digital modulation method, and TDMA (Time Division Multiple Access) has been used as a duplex method. Therefore, a signal subjected to digital modulation needs to be transmitted, as a square shaped pulse signal of a predetermined period, from an RF power amplifier incorporated in a mobile data terminal to a base station. The shape of a pulse in case that the RF power amplifier sends out a transmit signal, and the shape of modulation spectrum at the time of pulse rising and falling are standardized according to a standard for mobile communication systems in allowable values. Meanwhile, it has been known that when there is a discontinuity in the rate of change of power gain with respect to the control voltage, the pulse takes on a shape as departing from the standard, and a spurious comes up in the modulation spectrum. To avoid such problems, it is effective to increase the power gain of the RF power amplifier continuously and monotonously with respect to an increase of the control voltage. Using the RF power amplifier as described in JP-A-2005-217558, the power efficiency in the low power mode can be increased, and however the bias voltage of the transistor of the final stage amplifier is discontinuously switched in step. As a result, in the RF power amplifier as described in JP-A-2005-217558, a spurious occurs at the time of ramp-up/ramp-down. This problem was revealed in the study by the inventors.

The inventors was involved in the research and development of an RF power amplifier circuit to be incorporated in a mobile data terminal prior to the invention.

FIG. 2 is a diagram showing the composition of an RF power amplifier circuit configured of three amplification stages, which was examined by the inventors prior to the invention.

In the RF power amplifier circuit shown in FIG. 2, an input RF signal $P_{in}$ of transmission, hereinafter referred to as "RF transmission input signal", and supplied to an input terminal 103, is amplified by amplifiers 105, 106 and 107 in the stages, and an output RF signal $P_{out}$ of transmission, hereinafter referred to as "RF transmission output signal", is thus generated and arises from an output terminal 104. In order to convert the input and output impedances of the amplifiers 105, 106 and 107 in the stages thereby to reduce the reflection loss of transmit signals attributed to impedance mismatch, the amplification transistors 105, 106 and 107 are connected with matching networks (MN) 108, 109 and 110 composed of passive elements. The power source voltage $V_{dd}$ is supplied through source-voltage-supply terminals 101, 101A, 101B and 101C. The power gain of the RF power amplifier with multiple amplification stages is controlled by a procedure including the steps of: converting an output-power-control voltage $V_{apc}$ supplied to the terminal 102 into a current in a linear voltage-current converter 118; supplying the resulting current to diode-connected bias transistors 112, 113 and 114; and setting the value of quiescent currents (bias currents) on the amplification transistors 105, 106 and 107. To prevent high-level amplified RF carrier signals flowing into the diode-connected bias transistors 112, 113 and 114 with low impedances, the diode-connected bias transistors 112, 113 and 114 are connected with resistances 115, 116 and 117 respectively.

Next, the function of controlling the power of transmitted RF carrier signal of the RF power amplifier circuit of three amplification stages shown in FIG. 2 will be described.

The control of power of transmitted RF carrier signal is performed based on the mechanism as described below, in which the property of the gains of amplification of the amplification transistors 105, 106 and 107 depending on the values of quiescent currents (bias currents) thereof is used.

On application of the output-power-control voltage $V_{apc}$ to the input terminal 102 of the voltage-current converter 118, a divided voltage generated by voltage-dividing resistances 129 and 130 is supplied to the inverting input of the operational amplifier 128. Then, a circuit constituted by the operational amplifier 128, P-channel MOS FET 126 and resistance 127 is activated, and a current in proportion to the divided voltage flows into a series connected circuit including the P-channel MOS FET 126 and resistance 127. The combinations of P-channel MOS FETs 126 and 122, N-channel MOS FETs 124 and 125, and P-channel MOS FETs 123, 119, 120 and 121 each form a current mirror circuit; a current corresponding to a current flowing into the P-channel MOS FET 126 multiplied by a mirror ratio will flow through the diode-connected bias transistors 112, 113 and 114. The bias transistors 112, 113 and 114 and amplification transistors 105, 106 and 107 also form current mirror circuits; the current multiplied by the respective mirror ratios will flow into the amplification transistors 105, 106 and 107, and the values of quiescent currents (bias currents) will be set.

Usually, the mirror ratios of the current mirror circuits are selected so that in case that the output-power-control voltage $V_{apc}$ reaches a maximum, the maximum output power $P_{out}$(max) according to the standard for mobile communication systems agrees with the quiescent current (bias current) achieved by the RF power amplifier circuit of three amplification stages shown in FIG. 2.

FIG. 3 is a diagram showing the dependency of the current density Jq of quiescent current (bias current) flowing the amplification transistor 105, 106 or 107 of each of three amplification stages of the RF power amplifier circuit shown in FIG. 2 and examined by the inventors prior to the invention with respect to the output-power-control voltage $V_{apc}$. In FIG. 3, the vertical axis of FIG. 3 shows the value of the current density Jq of quiescent current (bias current) flowing each amplification transistor, and the horizontal axis shows the value of the output-power-control voltage $V_{apc}$. A quiescent current (bias current) having the maximum value Jq_max of the current density corresponding to the maximum value $V_{apc}$(max) of the output-power-control voltage $V_{apc}$ flows each amplification transistor.

As shown in FIG. 3, the current densities Jq of quiescent currents (bias currents) which flow through the first-stage amplification transistor 105, second-stage amplification transistor 106, and third-stage amplification transistor 107 respectively in response to the value of the same output-power-control voltage $V_{apc}$ take the same value.

As to the RF power amplifier circuit organized in multiple amplification stages, the first-stage amplification transistor 105 has a relatively small device size, the second-stage amplification transistor 106 has a middle device size, and the third- or final-stage amplification transistor 107 has a relatively large device size. In other words, with such RF power amplifier circuit, the amplification transistors of the amplification stages are made larger in device size according to an increase in signal level of RF input signals from the first to final amplification stage through the middle one, and thus PAE of the RF power amplifier circuit is improved. If the amplification transistors of the first and middle amplification stages have a device size as large as that the final-stage amplification transistor has, a needlessly larger quiescent current (bias current) in comparison to a small signal level of RF input signals will go through the amplification transistors of the first and middle amplification stages, leading to a drop of PAE of the RF power amplifier circuit. The device capacities of the first-stage amplification transistor 105, second-stage amplification transistor 106 and third-stage amplification transistor 107 of the RF power amplifier circuit are set so that the power efficiency of each amplification stage reaches the maximum in case that the RF power amplifier circuit generates a maximum output power $P_{out}$(max) according to the standard. Adequate settings of the device capacities of the amplification transistors of the amplification stages of the RF power amplifier circuit, and of the values of current densities Jq of the quiescent currents (bias current) minimize the signal loss of the amplification stages owing to the impedance mismatch at the time of producing the maximum output power $P_{out}$(max), and maximize the power efficiency of the amplification stages.

In this way, the device capacities of the amplification transistors of the amplification stages are made larger in the order of the first stage, the middle stage, and the final stage, whereby the device capacities are optimized. As a result, PAE of the RF power amplifier circuit at the time of producing the maximum output power $P_{out}$(max) can be improved.

However, the study by the inventors has revealed that PAE drops in case that the RF power amplifier circuit generates an output power $P_{out}$ lower than the maximum output power $P_{out}$(max). Now, the cause of the drop of PAE in low and middle power modes will be explained below.

When the output power $P_{out}$ generated by the RF power amplifier circuit lowers below the maximum output power $P_{out}$(max), the signal loss owing to the impedance mismatch of the first and second stages of the preceding amplification stages is increased. As a result, the input voltage amplitude $V_{min}$ of the final amplification stage, i.e. third stage, is made smaller. At that time, the value of quiescent current (bias current) of the final amplification stage, i.e. third stage is also lowered, and the input voltage amplitude $V_{min}$ of the final amplification stage, i.e. third stage is dropped more remarkably. Therefore, the power efficiency of the final amplification stage, i.e. third stage is lowered in low and middle power modes, and thus PAE of the RF power amplifier circuit is dropped. The mechanism of this will be described below in detail.

The power efficiency η of each of the amplification transistors of the first to third stages of the RF power amplifier circuit in case that the amplification transistors are in a class-A operation in which the amplification transistors generate densities $J_{cm}$ of currents with positive- and negative-cycle output signal amplitudes with respect to the current density Jq of quiescent current (bias current) is given by the following Expression (1):

$$\eta = \frac{1}{2}\left(\frac{j_{cm}}{J_q}\right)^2 \qquad (1)$$

If the transconductance and input voltage amplitude of each amplification transistor are represented by $g_m$ and $V_{min}$, the density $J_{cm}$ of current with the output signal amplitude concerning each amplification transistor can be given by the following Expression (2):

$$j_{cm} = g_m \cdot V_{min} = \sqrt{2\beta \cdot j_q} \cdot V_{min} \qquad (2)$$

Substituting the density $J_{cm}$ given by Expression (2) for the density $J_{cm}$ of Expression (1), the following Expression (3) can be gained:

$$\eta = \frac{\beta \cdot V_{min}^2}{J_q} \qquad (3)$$

It is clear from Expression (3) that a remarkable reduction of the input voltage amplitude $V_{min}$ of the final amplification stage, i.e. third stage rather than the density Jq of quiescent current (bias current) thereof lowers the power efficiency η of the amplification transistor of the final amplification stage, i.e. third stage.

The invention was made as a result of the study by the inventors prior to the invention as described above.

Therefore, it is an object of the invention to relieve the drop of PAE of an RF power amplifier circuit including multiple amplification stages in low and middle power modes.

Further, it is another object of the invention to make smaller the drop in output power for transmission when the power source voltage of an RF power amplifier circuit stays fallen.

The above and other objects of the invention and novel features thereof will become apparent from the description hereof and the accompanying drawings.

Of embodiments of the invention herein disclosed in the first aspect of the invention, a representative one will be described below in brief.

An RF power amplifier (313) that such embodiment of the invention offers has a previous-stage amplifier (310), a next-stage amplifier (311), and a controller (312).

The previous-stage amplifier (310) responds to an RF transmission input signal ($P_{in}$) accepted through an input terminal. The next-stage amplifier (311) responds to an amplified signal arising from an output terminal of the previous-stage amplifier (310) and accepted through an input terminal.

The controller (312) controls quiescent currents of the previous-stage amplifier (310) and next-stage amplifier (311) in response to a power control voltage ($V_{apc}$), thereby to control gains of the previous-stage amplifier (310) and next-stage amplifier (311) (see FIG. 1).

In response to the power control voltage ($V_{apc}$), the quiescent current and gain of the previous-stage amplifier (310) are changed continuously according to a first continuous function (2ndAmp), and the quiescent current and gain of the next-stage amplifier (311) are changed continuously according to a second continuous function (3rdAmp).

The second continuous function (3rdAmp) is higher than the first continuous function (2ndAmp) by at least one in degree (see FIG. 4).

Of embodiments of the invention herein disclosed in the second aspect of the invention, a representative one will be described below in brief.

An RF power amplifier circuit according to an embodiment includes an amplifier (Q1), and a controller (1100, 1101).

In response to an RF transmission input signal supplied through an input terminal, the amplifier (Q1) generates an RF transmission output signal, which is output through an output terminal thereof.

The controller (1100, 1101) includes a first control unit (1100) and a second control unit (1101).

In response to an output-power-control voltage ($V_{apc}$) supplied through a first input control terminal, the first control unit (1100) generates a first output current ($I_{IN}$), which is output through a first output control terminal.

In response to the first output current ($I_{IN}$) of the first control unit (1100) supplied to a second input control terminal, the second control unit (1101) generates a second output current ($I_{SQR}$) for deciding a quiescent current of an amplification transistor (Q1) of the amplifier, and outputs the current from a second output control terminal.

The maximum value ($V_{apc}$(max)) of the output-power-control voltage ($V_{apc}$) is set to a predetermined voltage value; the maximum value ($I_{IN}$(max)) of the first output current ($I_{IN}$), which arises from the first output control terminal of the first control unit (1100), is set to a predetermined current value.

The second control unit (1101) includes MOS transistors (M1-M4) which generate the second output current ($I_{SQR}$) in response to the first output current ($I_{IN}$) from the first control unit (1100) (see FIG. 13).

The MOS transistors (M1-M4) of the second control unit (1101) respond to the first output current ($I_{IN}$) set to the predetermined maximum value ($I_{IN}$(max)) of the first control unit (1100), and operate in its subthreshold region (see FIGS. 14 and 15).

The MOS transistors of the second control unit (1101) operate in a subthreshold region in which the source-gate voltage thereof is lower than the threshold voltage. Thus, it becomes possible for the second control unit (1101) to operate on a lower power source voltage ($V_{DD}$), and therefore it becomes possible to make smaller the drop in transmitted power when the source voltage of an RF power amplifier circuit stays fallen.

An advantage that the representative embodiment of the invention in connection with the first aspect offers is as follows in brief. That is, it is possible to relieve the drop of PAE of an RF power amplifier circuit including multiple amplification stages in low and middle power modes.

The effect achieved by the representative embodiment of the invention herein disclosed in the second aspect is as follows in brief.

That is, it is possible to relieve the drop of the transmitted power when the source voltage of an RF power amplifier circuit stays fallen.

DETAILED DESCRIPTION OF THE PREFERRED EMBODIMENTS

Figure 1:
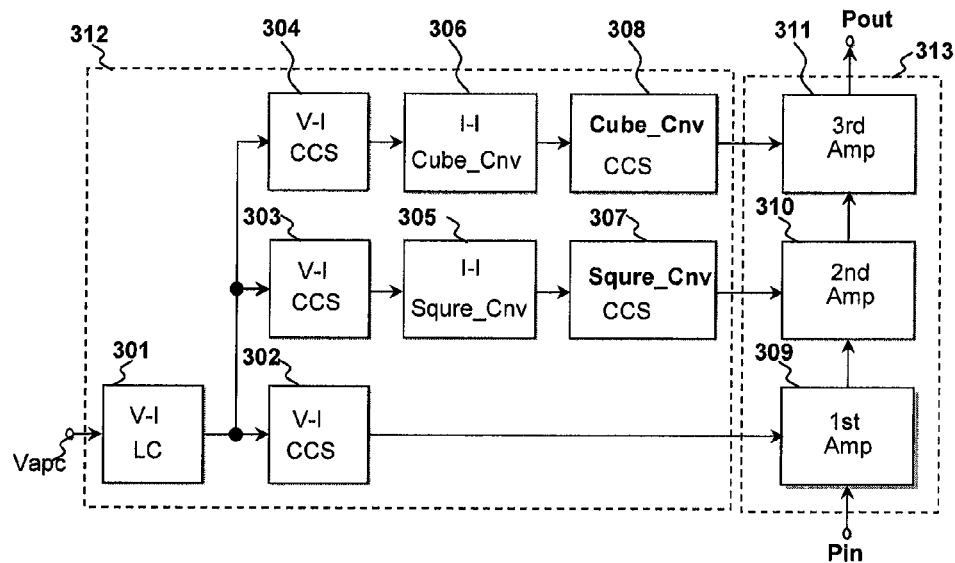
FIG. 1 is a block diagram showing the composition of an RF power amplifier circuit according to Embodiment 3_1 of the invention.

1. Summary of the preferred embodiments of the invention made in consideration of the first noticed point First, the preferred embodiments of the invention herein disclosed and made in consideration of the first noticed point will be outlined. Here, the reference numerals, characters and signs for reference to the drawings, which are accompanied with pairs of round brackets, only exemplify what the concepts of components and elements referred to by the numerals, characters and signs contain.

[1] An RF power amplifier circuit (313) according to a preferred embodiment of the invention includes: a previous-stage amplifier (310); a next-stage amplifier (311); and a controller (312).

The previous-stage amplifier (310) responds to an RF transmission input signal ($P_{in}$) accepted through an input terminal. The next-stage amplifier (311) responds to an amplified signal arising from an output terminal of the previous-stage amplifier (310) and accepted through an input terminal.

The controller (312) controls quiescent currents of the previous-stage amplifier (310) and next-stage amplifier (311) in response to a power control voltage ($V_{apc}$) supplied to a control input terminal thereof, thereby to control the gains of the previous-stage amplifier (310) and next-stage amplifier (311) (see FIG. 1).

In response to the power control voltage ($V_{apc}$), the quiescent current and gain of the previous-stage amplifier (310) are continuously changed according to a first continuous function (2ndAmp), and the quiescent current and gain of the next-stage amplifier (311) are continuously changed according to a second continuous function (3rdAmp).

Figure 4:
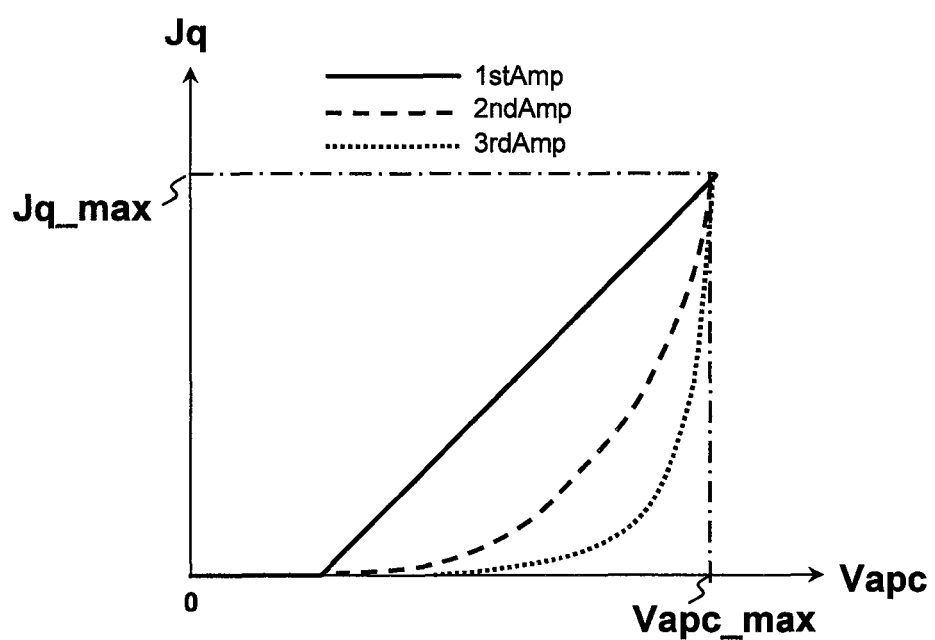
FIG. 4 is a diagram showing the characteristics of current densities of quiescent currents of the first- to third-stage amplifiers of the RF power amplifier circuit shown in FIG. 1 with respect to the output-power-control voltage.

The second continuous function (3rdAmp) is higher than the first continuous function (2ndAmp) by at least one in degree (see FIG. 4).

According to the above embodiment, it is possible to relieve the drop of PAE of an RF power amplifier circuit including multiple amplification stages in low and middle power modes.

According to a preferred embodiment, an amplification transistor of the next-stage amplifier (311) is set to be larger than an amplification transistor of the previous-stage amplifier (310) in device size.

In response to the power control voltage ($V_{apc}$) of a predetermined level, the quiescent current of the next-stage amplifier (311) is set to be lower than the quiescent current of the previous-stage amplifier (310) in current density (see FIG. 4).

According to the preferred embodiment, the increase of signal loss owing to the impedance mismatch of the former amplification stage can be prevented from causing a larger drop in the amplitude of an input voltage of the latter amplification stage in comparison to the density of the quiescent current of the latter amplification stage in case that the RF power amplifier circuit generates RF transmission output signals of low and middle powers.

According to another preferred embodiment, the quiescent current and gain of the previous-stage amplifier (309) are continuously changed following a linear characteristic curve given by a first continuous function (1stAmp) in response to the power control voltage ($V_{apc}$), and the quiescent current and gain of the next-stage amplifier (310, 311) are continuously changed following a square or cubic characteristic curve given by a second continuous function (2ndAmp, 3rdAmp) in response to the power control voltage ($V_{apc}$) (see FIG. 4).

According to another preferred embodiment, the controller (610, 620, 630) generates a first bias current continuously changed following the linear characteristic curve, and a second bias current continuously changed following the square or cubic characteristic curve in response to the power control voltage ($V_{apc}$).

The RF power amplifier circuit (313) further includes a first biasing transistor (631) and a second biasing transistor (632, 633).

The first biasing transistor (631) is current-mirror connected with the amplification transistor (641) of the previous-stage amplifier, and the second biasing transistor (632, 633) is current-mirror connected with the amplification transistor (642, 643) of the next-stage amplifier.

Figure 6:
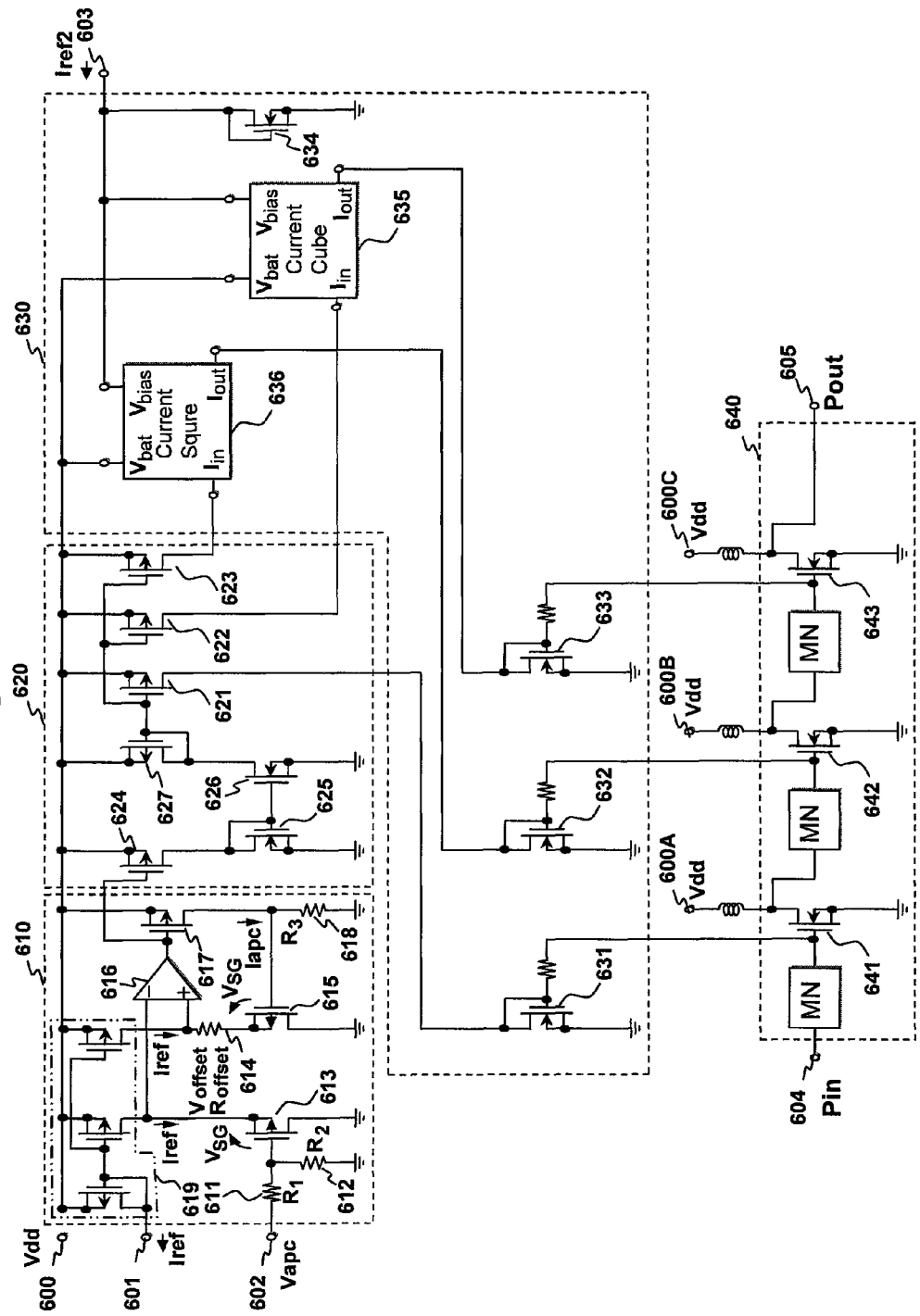
FIG. 6 is a block diagram showing the composition of an RF power amplifier circuit according to Embodiment 3_3 of the invention, which is a specific form thereof.

The first and second bias currents generated by the controller (610, 620, 630) are supplied to the first biasing transistor (631), and the second biasing transistor (632, 633), respectively (see FIG. 6).

According to a more preferred embodiment, the controller (610, 620) is composed of a monolithic integrated circuit including a CMOS transistor (see FIG. 6).

According to a still more preferred embodiment, the amplification transistor (641) of the previous-stage amplifier, the amplification transistor (642, 643) of the next-stage amplifier, the first biasing transistor (631) and the second biasing transistor (632, 633) are composed of MOS transistors (see FIG. 6).

Figure 12:
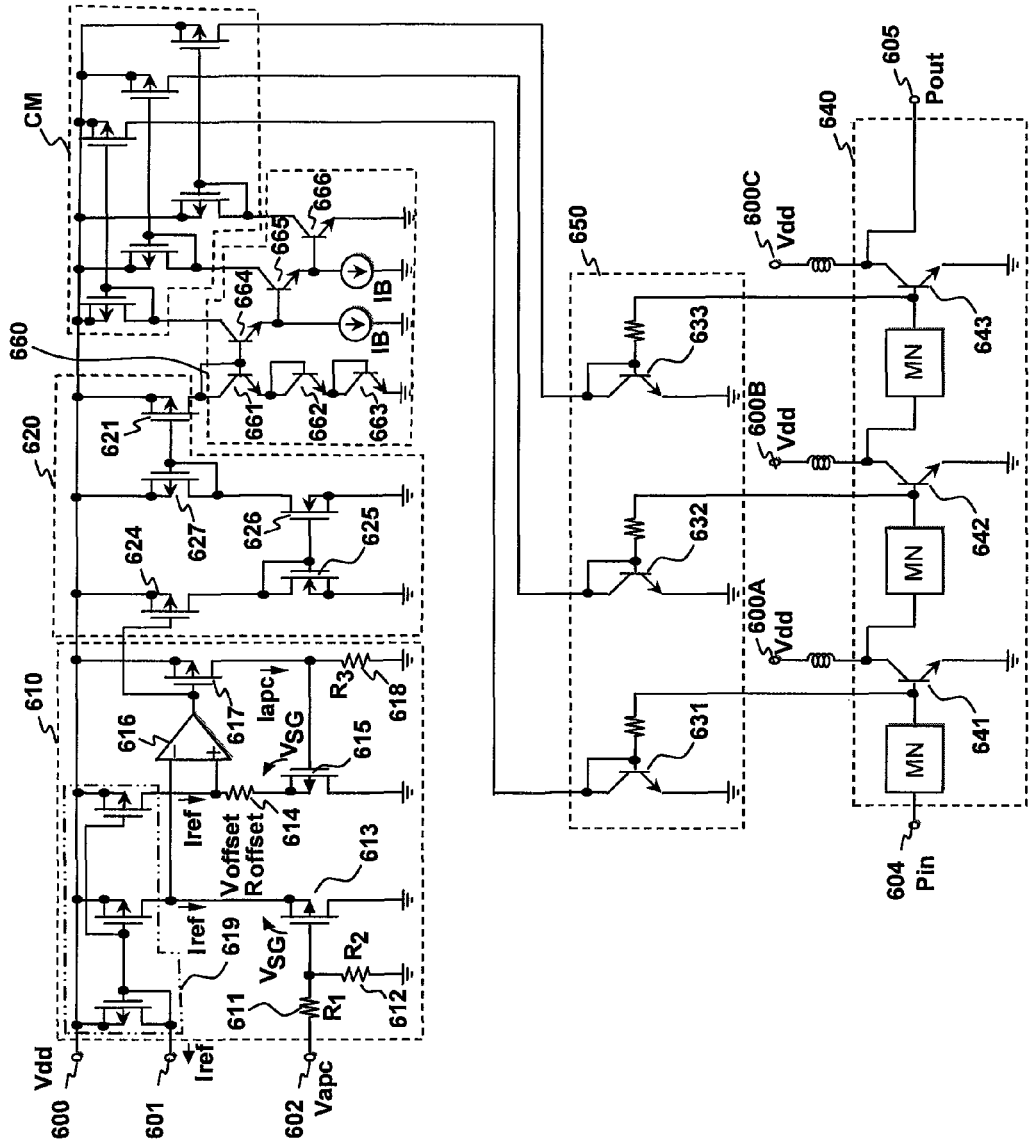
FIG. 12 is a block diagram showing the composition of an RF power amplifier circuit according to another embodiment of the invention, in which NPN type heterojunction bipolar transistors, such as HBTs, are used instead of N-channel MOS FETs used as the amplification transistors and biasing transistors in the RF power amplifier circuit according to Embodiment 3_3 shown in FIG. 6.

According to a specific embodiment, the amplification transistor (641) of the previous-stage amplifier, the amplification transistor (642, 643) of the next-stage amplifier, the first biasing transistor (631), and the second biasing transistor (632, 633) are composed of bipolar transistors (see FIG. 12).

According to a more specific embodiment, the MOS transistor is an LDMOS transistor.

According to a still more specific embodiment, the bipolar transistor is a heterojunction bipolar transistor.

[2] From another viewpoint of the invention, an RF power amplifier module according to a preferred embodiment thereof includes: a first RF power amplifier circuit (911) operable to amplify an RF transmission input signal ($P_{in\_GSM}$) of a first frequency band; a second RF power amplifier circuit (921) operable to amplify an RF transmission input signal ($P_{in\_DCS}$) of a second frequency band; and an output power controller (930, 915).

The output power controller (930, 915) includes a first power detector (932), a second power detector (933), and an error amplifier (934).

The first power detector (932) detects a level of a first RF transmission signal arising from an output terminal of the first RF power amplifier circuit (911).

The second power detector (933) detects a level of a second RF transmission signal arising from an output terminal of the second RF power amplifier circuit (921).

Figure 9:
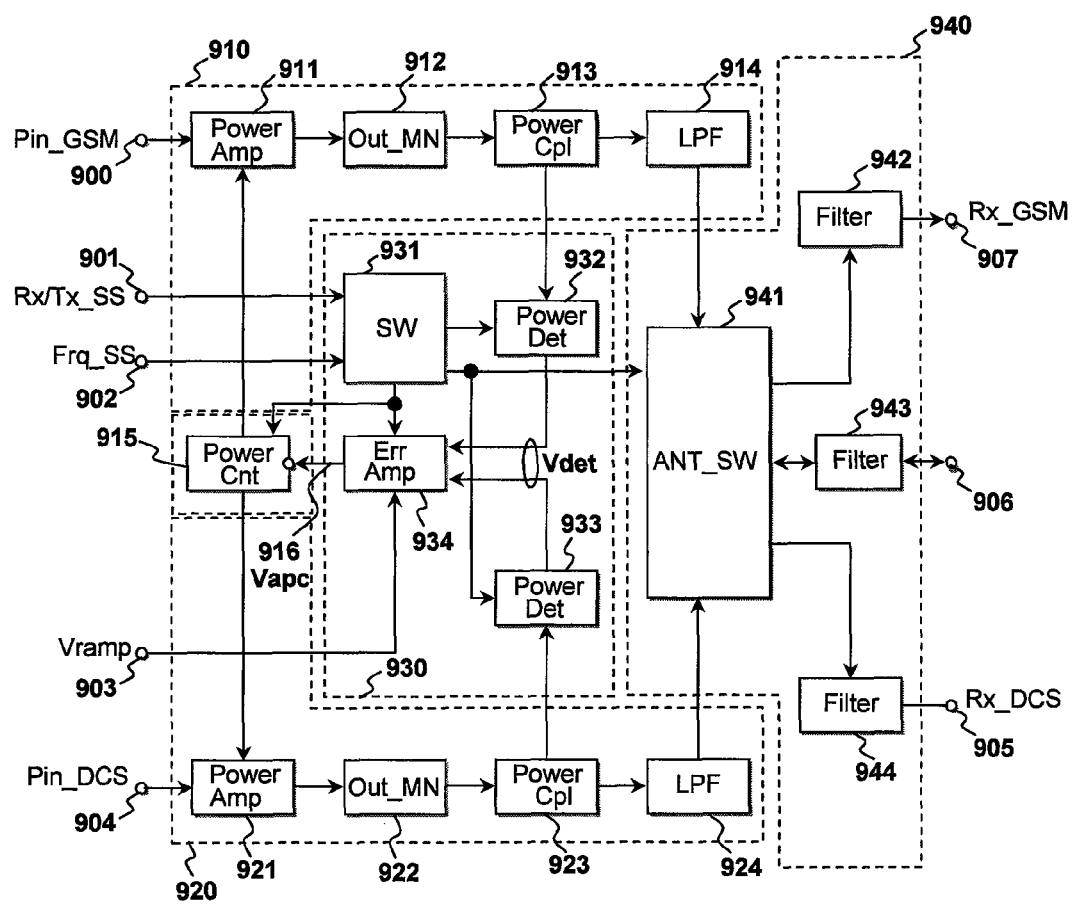
FIG. 9 is a block diagram showing the composition of an RF power amplifier module according to Embodiment 3_4 of the invention.

The error amplifier (934) generates a power control voltage ($V_{apc}$) according to a difference between an external control voltage ($V_{ramp}$), and a detection output voltage ($V_{det}$) from each of the first power detector (932) and second power detector (933) (see FIG. 9).

Each RF power amplifier circuit (313) of the first RF power amplifier circuit (911) and second RF power amplifier circuit (921) has a previous-stage amplifier (310), a next-stage amplifier (311), and a controller (312).

The previous-stage amplifier (310) responds to an RF transmission input signal ($P_{in}$) accepted through an input terminal. The next-stage amplifier (311) responds to an amplification signal arising from an output terminal of the previous-stage amplifier (310) and accepted through an input terminal.

The controller (312) controls quiescent currents of the previous-stage amplifier (310) and next-stage amplifier (311) in response to the power control voltage ($V_{apc}$) supplied to a control input terminal, thereby to control gains of the previous-stage amplifier (310) and next-stage amplifier (311) (see FIG. 1).

In response to the power control voltage ($V_{apc}$), the quiescent current and gain of the previous-stage amplifier (310) are continuously changed following a first continuous function (2ndAmp), and the quiescent current and gain of the next-stage amplifier (311) are continuously changed following a second continuous function (3rdAmp).

The second continuous function (3rdAmp) is higher than the first continuous function (2ndAmp) by at least one in degree (see FIG. 4).

According to the above embodiment, it is possible to relieve the drop of PAE of an RF power amplifier circuit including multiple amplification stages in low and middle power modes.

2. Summary of the preferred embodiments of the invention made in consideration of the second noticed point The preferred embodiments of the invention herein disclosed and made in consideration of the second noticed point will be outlined first. Here, the reference numerals, characters and signs for reference to the drawings, which are accompanied with pairs of round brackets, only exemplify what the concepts of components and elements referred to by the numerals, characters and signs contain.

[1] An RF power amplifier circuit according to a preferred embodiment of the invention includes an amplifier (Q1), and a controller (1100, 1101).

The amplifier (Q1) responds to an RF transmission input signal accepted through an input terminal, generates an RF transmission output signal, and outputs the signal through an output terminal thereof.

The controller (1100, 1101) has a first control unit (1100) and a second control unit (1101).

The first control unit (1100) responds to an output-power-control voltage ($V_{apc}$) supplied to a first input control terminal, generates a first output current ($I_{IN}$), and outputs the first current through a first output control terminal.

The second control unit (1101) responds to the first output current ($I_{IN}$) of the first control unit (1100) supplied to a second input control terminal, generates a second output current ($I_{SQR}$) for deciding the quiescent current of an amplification transistor (Q1) of the amplifier to output the second output current through a second output control terminal thereof.

The maximum value ($V_{apc}$(max)) of the output-power-control voltage ($V_{apc}$) is set to a predetermined voltage value, whereby the maximum value ($I_{IN}$(max)) of the first output current ($I_{IN}$), which arises from the first output control terminal of the first control unit (1100), is set to a predetermined current value.

Figure 13:
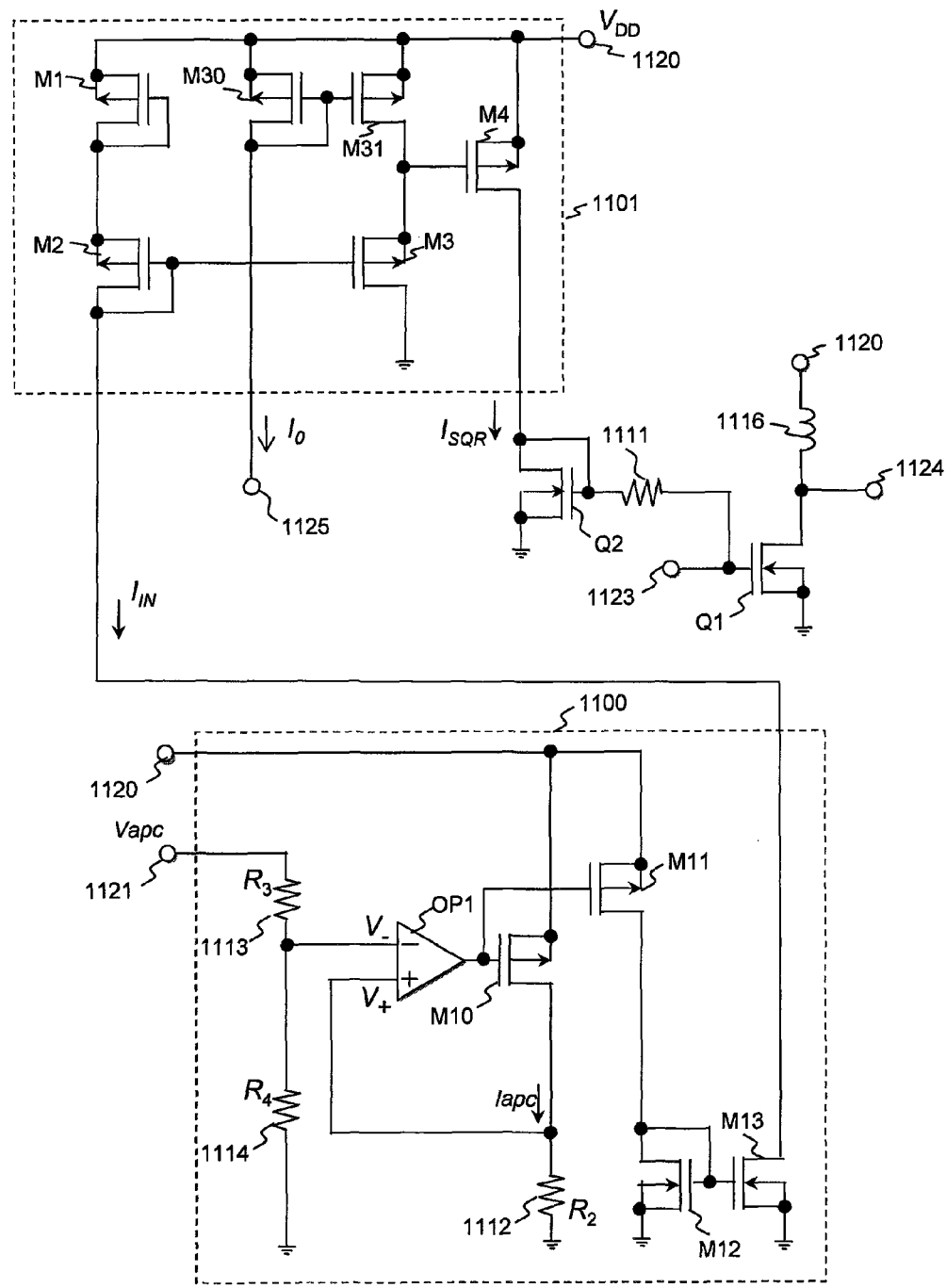
FIG. 13 is a block diagram showing the composition of an RF power amplifier circuit according to Embodiment 4_1 of the invention devised from the second noticed point.

The second control unit (1101) includes a plurality of MOS transistors (M1-M4) which generate the second output current ($I_{SQR}$) in response to the first output current ($I_{IN}$) from the first control unit (1100) (see FIG. 13).

Figure 14:
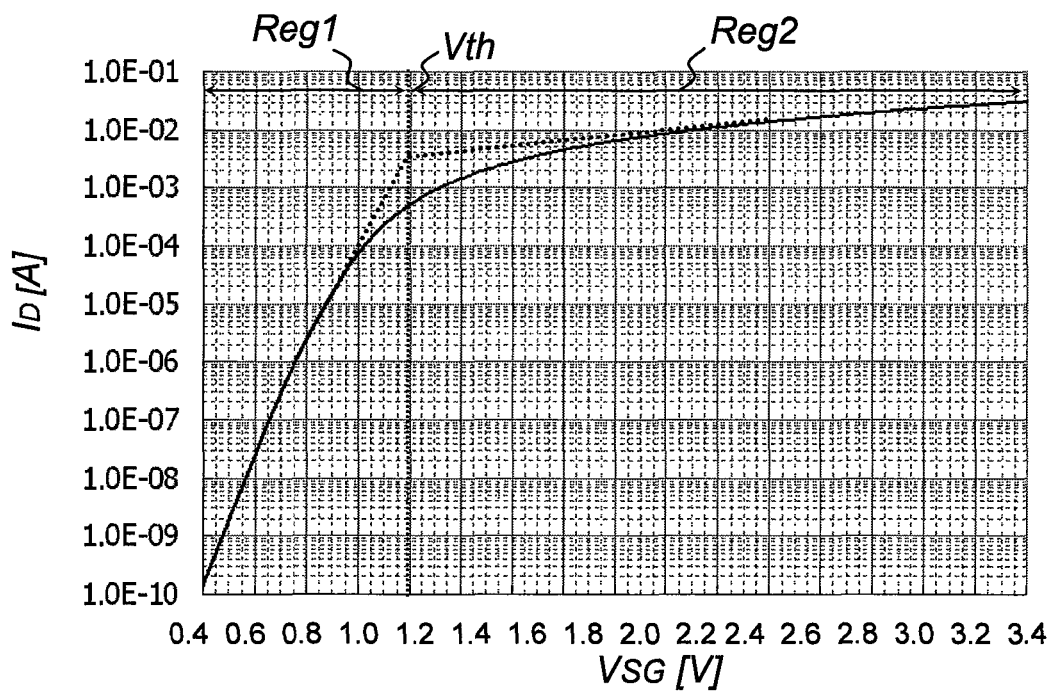
FIG. 14 is a diagram for explaining the subthreshold characteristic of a MOS transistor.
Figure 15:
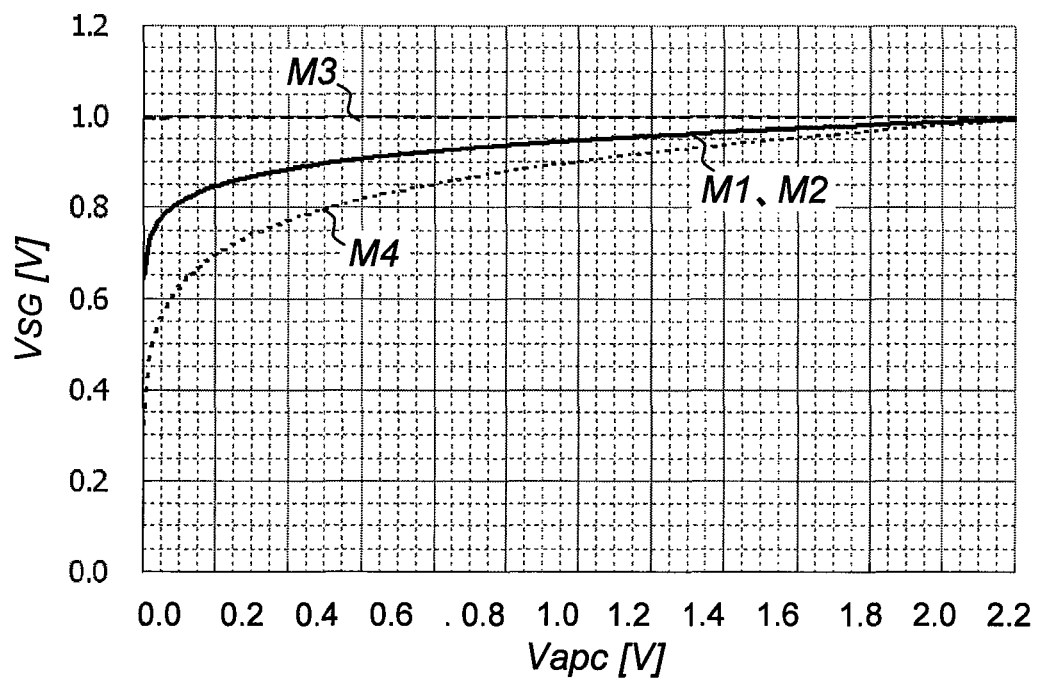
FIG. 15 is a diagram showing results of simulation of the characteristics the four MOS transistors M1 to M4 included in the current-square-converter circuit 1101 of FIG. 13, which shows that the four MOS transistors M1 to M4 can operate in the subthreshold regions within a predetermined range of the output-power-control voltage $V_{apc}$.

The MOS transistors (M1-M4) of the second control unit (1101) respond to the first output current ($I_{IN}$) set to the predetermined maximum value ($I_{IN}$(max)) of the first control unit (1100), and operate in its subthreshold region (see FIGS. 14 and 15).

According to the above embodiment, the MOS transistors of the second control unit (1101) operate in a subthreshold region in which the source-gate voltage thereof is lower than the threshold voltage. Thus, it becomes possible for the second control unit (1101) to operate on a lower source voltage ($V_{DD}$), and therefore it becomes possible to make smaller the drop in transmitted power when the source voltage of an RF power amplifier circuit stays fallen.

According to a preferred embodiment, the amplifier (Q1) is a next-stage amplifier of multiple stages' amplifiers.

The multiple stages' amplifiers include a previous-stage amplifier (Q715, 716) operable to supply an amplified RF signal to the next-stage amplifier.

In response to the output-power-control voltage ($V_{apc}$), a quiescent current of the previous-stage amplifier (Q715, Q716) is changed continuously according to a first continuous function, and a quiescent current of the next-stage amplifier (Q1) is changed continuously according to a second continuous function.

Figure 7:
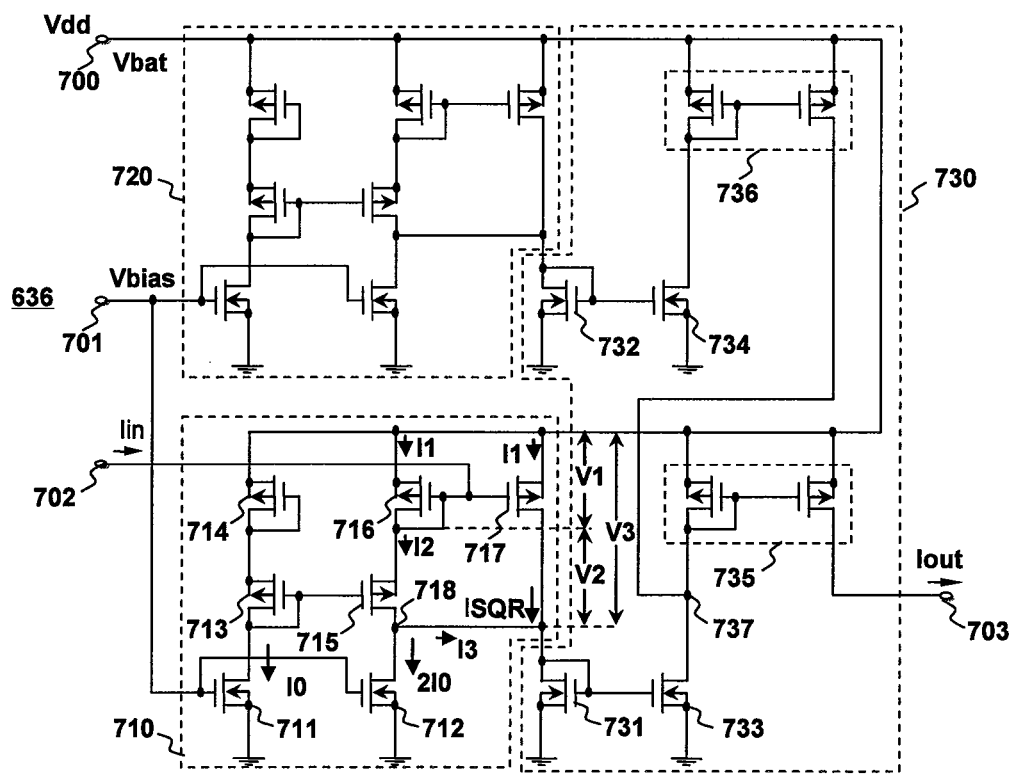
FIG. 7 is a diagram showing the composition of the current-square circuit included in the current-current continuous function generator circuit of an RF power amplifier circuit according to Embodiment 3_3 of the invention shown in FIG. 8.

The second continuous function is higher than the first continuous function by at least one in degree (see FIG. 7).

According to the above preferred embodiment, it becomes possible to make smaller the drop of PAE of an RF power amplifier circuit including multiple amplification stages in low and middle power modes.

According to another preferred embodiment, an amplification transistor (Q1) of the next-stage amplifier is set to be larger than an amplification transistor (Q715, Q716) of the previous-stage amplifier in device size.

According to another preferred embodiment, the MOS transistors (M1-M4) of the second control unit (1101) include a first MOS transistor (M1), a second MOS transistor (M2), a third MOS transistor (M3), and a fourth MOS transistor (M4).

The first MOS transistor (M1) has a gate and a drain connected with each other, and the second MOS transistor (M2) has a gate and drain connected with each other.

A drain-source current path of the first MOS transistor (M1) is connected with a drain-source current path of the second MOS transistor (M2) in series, and the first output current ($I_{IN}$) from the first control unit (1100) can be supplied to the series-connected drain-source current paths.

The gate of the second MOS transistor (M2) is connected with a gate of the third MOS transistor (M3) arranged so that a substantially fixed bias current ($I_0$) can be flowed therethrough, and a source of the third MOS transistor (M3) is connected with a gate of the fourth MOS transistor (M4) arranged so that the second output current ($I_{SQR}$) can be flowed therethrough.

Figure 19:
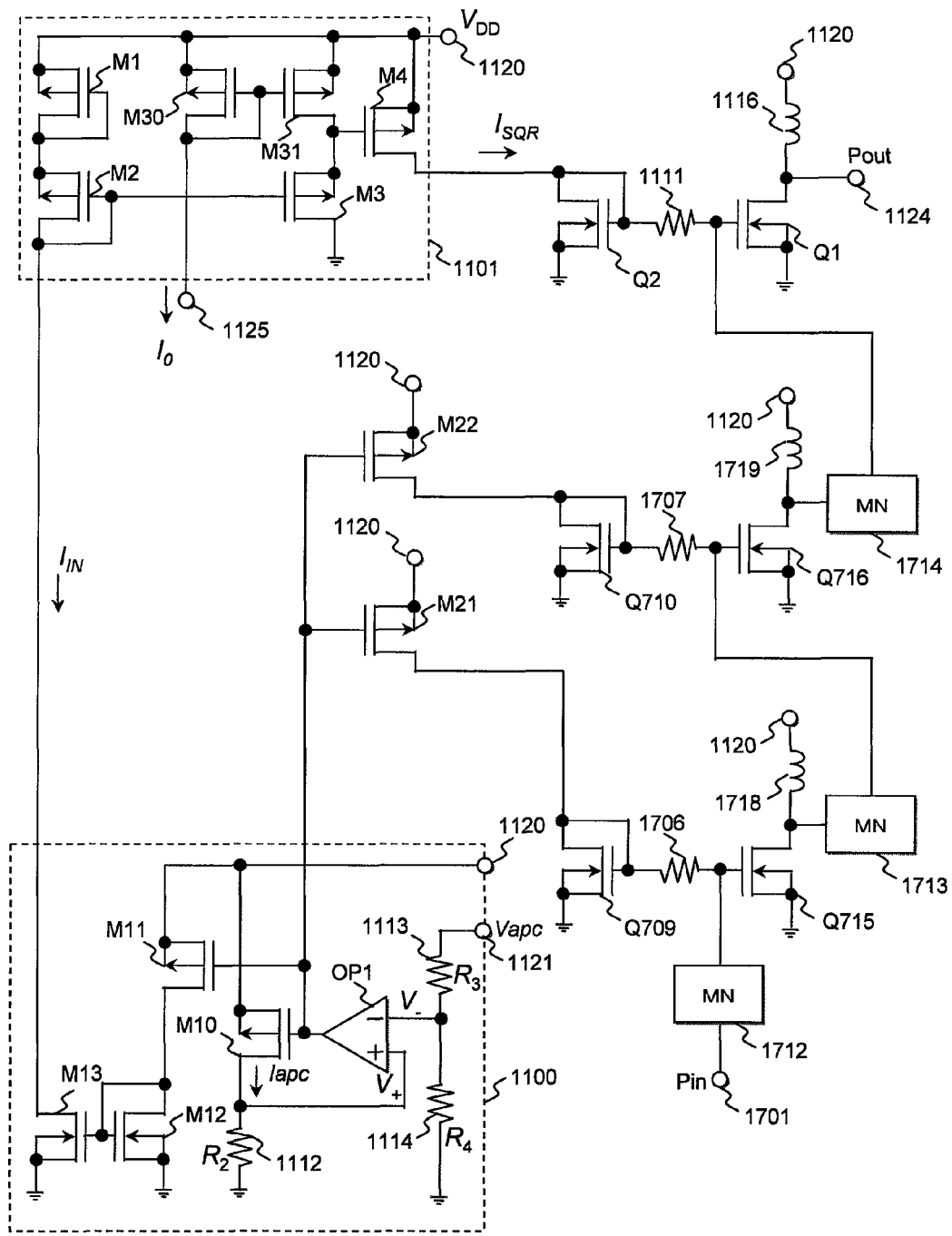
FIG. 19 is a diagram showing the composition of an RF power amplifier circuit having amplifiers of multiple stages according to Embodiment 4_3 of the invention devised from the second noticed point.

The second output current ($I_{SQR}$) is a current in proportion to the square of the first output current ($I_{IN}$) (see FIG. 19).

According to another preferred embodiment, the RF power amplifier circuit further includes a first biasing transistor (Q709, Q710), and a second biasing transistor (Q2).

The first biasing transistor (Q709, Q710) is current-mirror connected with the amplification transistor (Q715, Q716) of the previous-stage amplifier, and the second biasing transistor (Q2) is current-mirror connected with the amplification transistor (Q1) of the next-stage amplifier.

A first bias current for continuously changing the quiescent current of the previous-stage amplifier (Q715, Q716) according to the first continuous function is supplied to the first biasing transistor (Q709, Q710).

Figure 18:
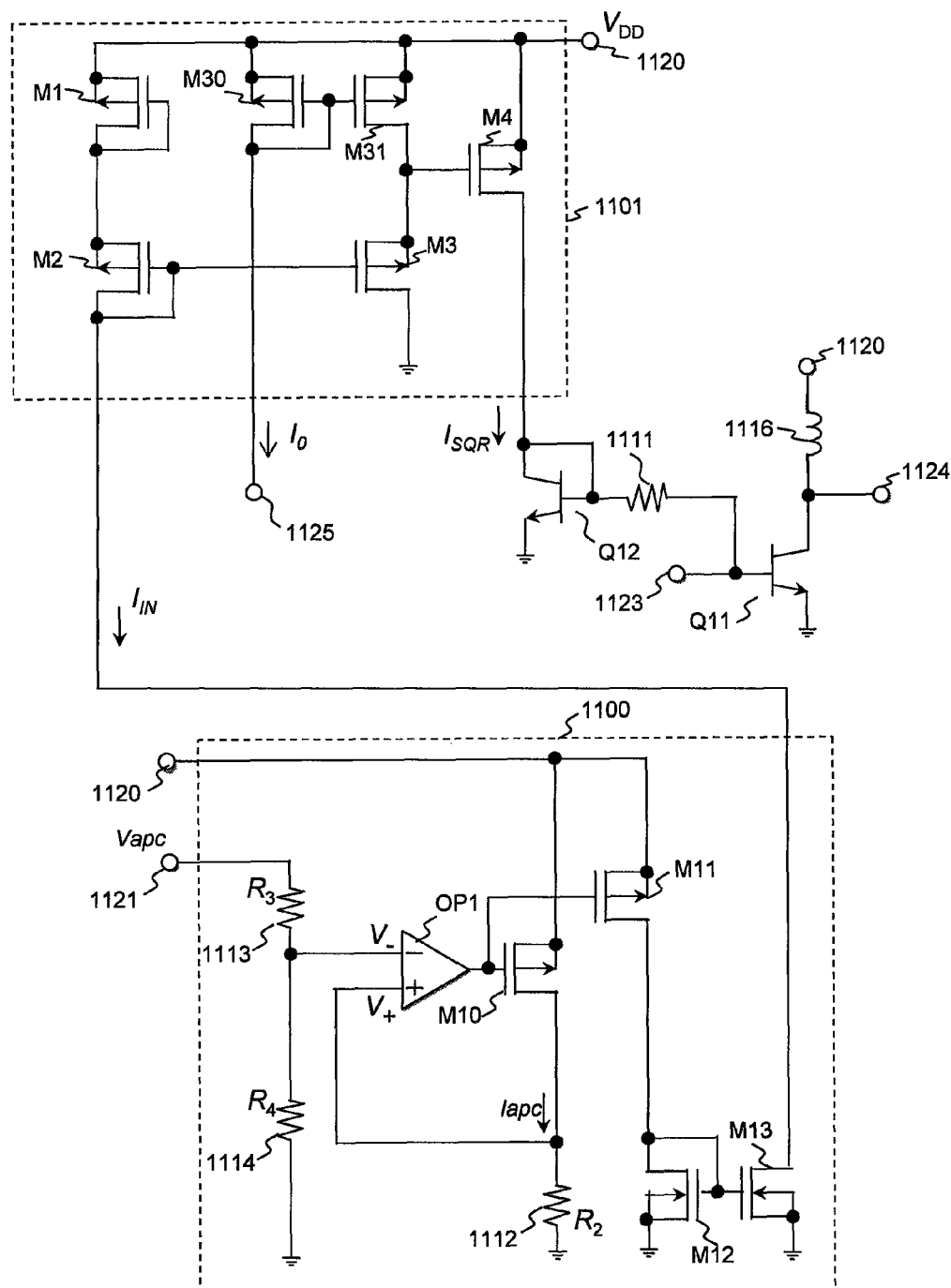
FIG. 18 is a diagram showing the composition of an RF power amplifier circuit according to Embodiment 4_2 of the invention devised from the second noticed point.

A second bias current for continuously changing the quiescent current of the next-stage amplifier (Q1) according to the second continuous function is supplied to the second biasing transistor (Q2) (see FIGS. 18 and 19).

According to a specific embodiment, the controller (1100, 1101) is composed of a monolithic integrated circuit including a CMOS transistor.

According to another specific embodiment, the amplification transistor (Q715, Q716) of the previous-stage amplifier, the amplification transistor (Q1) of the next-stage amplifier, and the first biasing transistor (Q709, Q710), and the second biasing transistor (Q2) are each composed of a MOS transistor (see FIG. 19).

According to another specific embodiment, the amplification transistor (Q715, Q716) of the previous-stage amplifier, the amplification transistor (Q1) of the next-stage amplifier, and the first biasing transistor (Q709, Q710), and second biasing transistor (Q2) are each composed of a bipolar transistor (see FIG. 18).

According to a more specific embodiment, the MOS transistor is an LDMOS transistor.

According to another more specific embodiment, the bipolar transistor is a heterojunction bipolar transistor.

[2] From another viewpoint of the invention, an RF power module according to a preferred embodiment thereof includes: a first RF power amplifier circuit (1811) operable to amplify an RF transmission input signal (Pin_GSM) of a first frequency band; a second RF power amplifier circuit (1821) operable to amplify an RF transmission input signal (Pin_DCS) of a second frequency band; and an output-power controller (1830, 1815).

The output-power controller (1830, 1815) includes: a first power detector (1832); a second power detector (1833); an error amplifier (1834).

The first power detector (1832) detects a level of a first RF transmission signal arising from an output terminal of the first RF power amplifier circuit (1811).

The second power detector (1833) detects a level of a second RF transmission signal arising from an output terminal of the second RF power amplifier circuit (1821).

Figure 20:
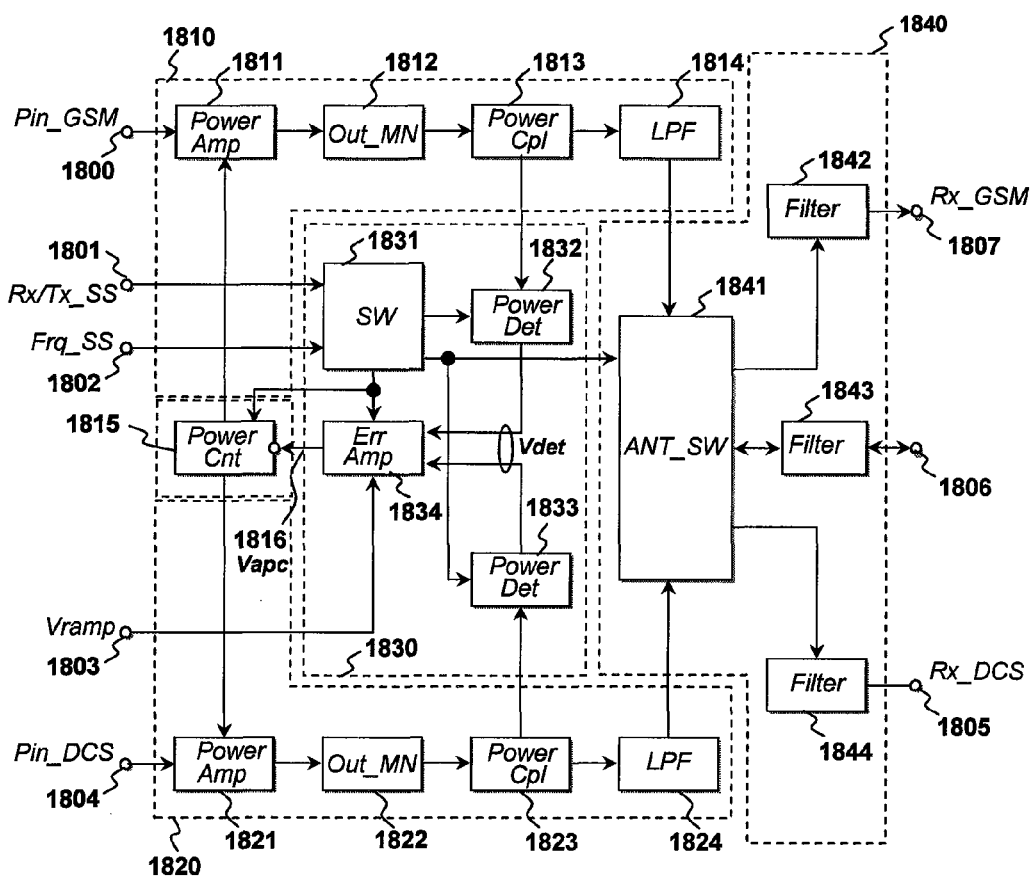
FIG. 20 is a block diagram showing the composition of an RF power module according to Embodiment 4_4 of the invention devised from the second noticed point.

The error amplifier (1834) generates an output-power-control voltage ($V_{apc}$) according to a difference between an external control voltage ($V_{ramp}$), and a detection output voltage ($V_{det}$) from each of the first power detector (1832) and second power detector (1833) (see FIG. 20).

Each of the first RF power amplifier circuit (1811) and second RF power amplifier circuit (1821) has an amplifier (Q1), and a controller (1100, 1101).

The amplifier (Q1) responds to an RF transmission input signal accepted through an input terminal, generates an RF transmission output signal, and outputs the signal through an output terminal thereof.

The controller (1100, 1101) includes a first control unit (1100) and a second control unit (1101).

The first control unit (1100) responds to an output-power-control voltage ($V_{apc}$) supplied to a first input control terminal, generates a first output current ($I_{IN}$), and outputs the current from a first output control terminal.

The second control unit (1101) responds to the first output current ($I_{IN}$) of the first control unit (1100) supplied to a second input control terminal, generates a second output current ($I_{SQR}$) for deciding the quiescent current of an amplification transistor (Q1) of the amplifier to output the second output current through a second output control terminal thereof.

The maximum value ($V_{apc}(\max)$) of the output-power-control voltage ($V_{apc}$) is set to a predetermined voltage value, whereby the maximum value ($I_{IN}(\max)$) of the first output current ($I_{IN}$), which arises from the first output control terminal of the first control unit (1100), is set to a predetermined current value.

The second control unit (1101) includes MOS transistors (M1-M4) which generate the second output current ($I_{SQR}$) in response to the first output current ($I_{IN}$) from the first control unit (1100) (see FIG. 13).

The MOS transistors (M1-M4) of the second control unit (1101) respond to the first output current ($I_{IN}$) set to the predetermined maximum value ($I_{IN}(\max)$) of the first control unit (1100), and operate in its subthreshold region (see FIGS. 14 and 15).

According to the above embodiment, the MOS transistors of the second control unit (1101) operate in a subthreshold region in which the source-gate voltage thereof is lower than the threshold voltage. Thus, it becomes possible for the second control unit (1101) to operate on a lower source voltage ($V_{DD}$), and therefore it becomes possible to make smaller the drop in transmitted power when the source voltage of an RF power amplifier circuit stays fallen.

3. Details of the embodiments of the invention made in consideration of the first noticed point Next, the embodiments of the invention made in consideration of the first noticed point will be described further in detail. It is noted that in all the drawings for description of the best forms for embodying the invention, members having identical functions are identified by the same reference numeral or character to avoid the repetition of the description.

[Embodiment 3_1]

<<Composition of RF Power Amplifier Circuit>>

FIG. 1 is a block diagram showing the composition of an RF power amplifier circuit according to Embodiment 3_1 of the invention.

The RF power amplifier circuit 313 shown in FIG. 1 is connected with a quiescent-current controller 312. The RF power amplifier circuit 313 includes a first-stage amplifier 309, a second-stage amplifier 310, and a third-stage amplifier 311, which are connected to form multiple stages. An RF transmission input signal $P_{in}$ is supplied to an input terminal of the first-stage amplifier 309. An amplified RF carrier signal emerging at an output terminal of the first-stage amplifier 309 is fed to an input terminal of the second-stage amplifier 310. An amplified RF carrier signal emerging at an output terminal of the second-stage amplifier 310 is provided to an input terminal of the third-stage amplifier 311. Then, an RF transmission output signal $P_{out}$ arises from an output terminal of the third-stage amplifier 311. In the RF power amplifier circuit 313, the device sizes of amplification transistors of respective amplification stages are made larger from stage to stage in the order of the first-stage amplifier 309 of the first stage, second-stage amplifier 310 of the middle stage, and third-stage amplifier 311 of the final stage. If the amplification transistors are field effect transistors, the device sizes thereof depend on the ratio (W/L) of the channel width (W) with respect to the channel length (L). However, if the amplification transistors are bipolar transistors, the device sizes thereof depend on the emitter area ($A_E$).

In response to supply of an output-power-control voltage $V_{apc}$, the quiescent-current controller 312 generates first, second and third bias voltages. The first to third bias voltages are supplied to the first-stage amplifier 309, second-stage amplifier 310, and third-stage amplifier 311, respectively. The quiescent-current controller 312 includes: a voltage-current linear converter 301; a voltage-current conversion coefficient setting units 302, 303 and 304; a current-current square converter 305; a current-current cubic converter 306; a current-current square conversion coefficient setting unit 307; and a current-current cubic conversion coefficient setting unit 308.

<<Operation of the RF Power Amplifier Circuit>>

The RF power amplifier circuit 313 shown in FIG. 1, which has the above-described composition, operates as described below.

The RF transmission input signal $P_{in}$ supplied to the input terminal of the first-stage amplifier 309 is amplified by the first-stage amplifier 309 to generate a first amplified RF carrier signal, which arises at the output terminal thereof. The first amplified RF carrier signal is amplified by the second-stage amplifier 310 to generate a second amplified RF carrier signal, which arises at the output terminal thereof. The second amplified RF carrier signal is amplified by the third-stage amplifier 311 to generate an RF transmission output signal $P_{out}$, which arises at the output terminal thereof.

The quiescent-current controller 312, which is supplied with the output-power-control voltage $V_{apc}$, operates in the way as described below, and controls the quiescent current of each of the first-stage amplifier 309, second-stage amplifier 310 and third-stage amplifier 311 of the RF power amplifier circuit 313, in which the first- to third stages' amplifiers are three-stage-cascade connected.

On supply of the output-power-control voltage $V_{apc}$ to the quiescent-current controller 312, the voltage-current linear converter 301 generates a converted-output current in proportion to the output-power-control voltage $V_{apc}$.

The voltage-current conversion coefficient setting unit 302 sets a conversion coefficient so that the quiescent current of the first-stage amplifier 309 is set to a desired value in response to the converted-output current from the voltage-current linear converter 301. Using the conversion coefficient, the voltage-current conversion coefficient setting unit 302 multiplies the converted-output current of the voltage-current linear converter 301 linearly. The output current thus linearly multiplied by the voltage-current conversion coefficient setting unit 302 is supplied to the first-stage amplifier 309, and converted into a first bias voltage by the first biasing transistor therein. The first biasing transistor and first-stage amplification transistor are current-mirror-connected in the first-stage amplifier 309. Therefore, the quiescent current of the first-stage amplification transistor will be controlled linearly in response to the output-power-control voltage $V_{apc}$.

The voltage-current conversion coefficient setting unit 303 sets a conversion coefficient so that the quiescent current of the second-stage amplifier 310 is set to a desired value in response to the converted-output current from the voltage-current linear converter 301. Using the conversion coefficient, the voltage-current conversion coefficient setting unit 303 multiplies the converted-output current of the voltage-current linear converter 301 linearly. The output current thus linearly multiplied by the voltage-current conversion coefficient setting unit 303 is supplied to the current-current square converter 305, in which the converted-output current from the voltage-current linear converter 301 is multiplied according to a square characteristic curve of the current-current square converter 305. The current-current square conversion coefficient setting unit 307 sets a conversion coefficient for the square multiplication in the current-current square converter 305. The output current from a combination of the current-current square converter 305 and current-current square conversion coefficient setting unit 307, which follows a square characteristic curve, is supplied to the second-stage amplifier 310, and converted into a second bias voltage by the second biasing transistor therein. The second biasing transistor and second-stage amplification transistor are current-mirror-connected in the second-stage amplifier 310. Therefore, the quiescent current of the second-stage amplification transistor will be controlled according to a square characteristic curve in response to the output-power-control voltage $V_{apc}$.

The voltage-current conversion coefficient setting unit 304 sets a conversion coefficient so that the quiescent current of the third-stage amplifier 311 is set to a desired value in response to the converted-output current from the voltage-current linear converter 301. Using the conversion coefficient, the voltage-current conversion coefficient setting unit 304 multiplies the converted-output current of the voltage-current linear converter 301 linearly. The output current thus linearly multiplied by the voltage-current conversion coefficient setting unit 304 is supplied to the current-current cubic converter 306, in which the converted-output current from the voltage-current linear converter 301 is multiplied according to a cubic characteristic curve of the current-current cubic converter 306. The current-current cubic conversion coefficient setting unit 308 sets a conversion coefficient for the cubic multiplication in the current-current cubic converter 306. The output current from a combination of the current-current cubic converter 306 and current-current cubic conversion coefficient setting unit 308, which follows a cubic characteristic curve, is supplied to the third-stage amplifier 311, and converted into a third bias voltage by the third biasing transistor therein. The third biasing transistor and third-stage amplification transistor are current-mirror-connected in the third-stage amplifier 311. Therefore, the quiescent current of the third-stage amplification transistor will be controlled according to a cubic characteristic curve in response to the output-power-control voltage $V_{apc}$.

FIG. 4 is a diagram showing the characteristics of current densities Jq of quiescent currents of the first-stage amplifier 309, second-stage amplifier 310 and third-stage amplifier 311 of the RF power amplifier circuit 313 shown in FIG. 1 with respect to the output-power-control voltage $V_{apc}$.

In FIG. 4, the vertical axis shows the value of the current density Jq of quiescent current (bias current) flowing through each amplification transistor, and the horizontal axis shows the value of the output-power-control voltage $V_{apc}$. Further, in the drawing, the solid line 1stAmp represents the quiescent current density Jq of the first-stage amplifier 309 of the top stage, the coarser broken line 2ndAmp represents the quiescent current density Jq of the second-stage amplifier 310 of the middle stage, and the dotted line 3rdAmp represents the quiescent current density Jq of the third-stage amplifier 311 of the final stage.

As shown in FIG. 4, the settings are made so that while RF transmission output signals $P_{out}$ of the low and middle powers are generated, the quiescent current densities Jq of the first-stage amplifier 309 of the top stage, the second-stage amplifier 310 of the middle stage, and the third-stage amplifier 311 of the final stage take on the largest value (for 1stAmp), an intermediate value (for 2ndAmp) and the smallest value (for 3rdAmp) with respect to the output-power-control voltage $V_{apc}$ of the same level, respectively. Incidentally, in the example of FIG. 4, the quiescent current density Jq (=1stAmp) of the first-stage amplifier 309 of the top stage, the quiescent current density Jq (=2ndAmp) of the second-stage amplifier 310 of the middle stage, and the quiescent current density Jq (=3rdAmp) of the third-stage amplifier 311 of the final stage with respect to the maximum level of output-power-control voltage $V_{apc\_max}$ at the time of producing the maximum output power $P_{out}$(max) are substantially the same maximum value Jq_max.

With regard to the method of controlling the quiescent current density of each respective stage of the RF power amplifier circuit 313 of FIG. 1, which has been described with reference to FIG. 4, the settings are made so that the values of the quiescent current densities with respect to the output-power-control voltage $V_{apc}$ of the same level become smaller in order, like the top stage takes a larger current density value than the middle stage, and the middle stage larger than the final one, i.e. the next-stage is smaller in quiescent current density. Therefore, the increase of signal loss owing to the impedance mismatch of the former amplification stage can be prevented from causing a larger drop in the amplitude of an input voltage of the latter amplification stage in comparison to the density of the quiescent current of the latter amplification stage at the time of producing the RF transmission output signals $P_{out}$ of low and middle powers. Hence, using the RF power amplifier circuit according to Embodiment 3_1 of the invention shown in FIG. 1, the drop of PAE of an RF power amplifier circuit including multiple amplification stages in low and middle power modes can be relieved.

The current-current square converter 305 and current-current cubic converter 306 included in the quiescent-current controller 312 of the RF power amplifier circuit according to Embodiment 3_1 of the invention shown in FIG. 1 may have any circuit compositions as long as they respond to an input current and respectively output currents in proportion to the square and cube of the input current according to continuous functions.

Figure 2:
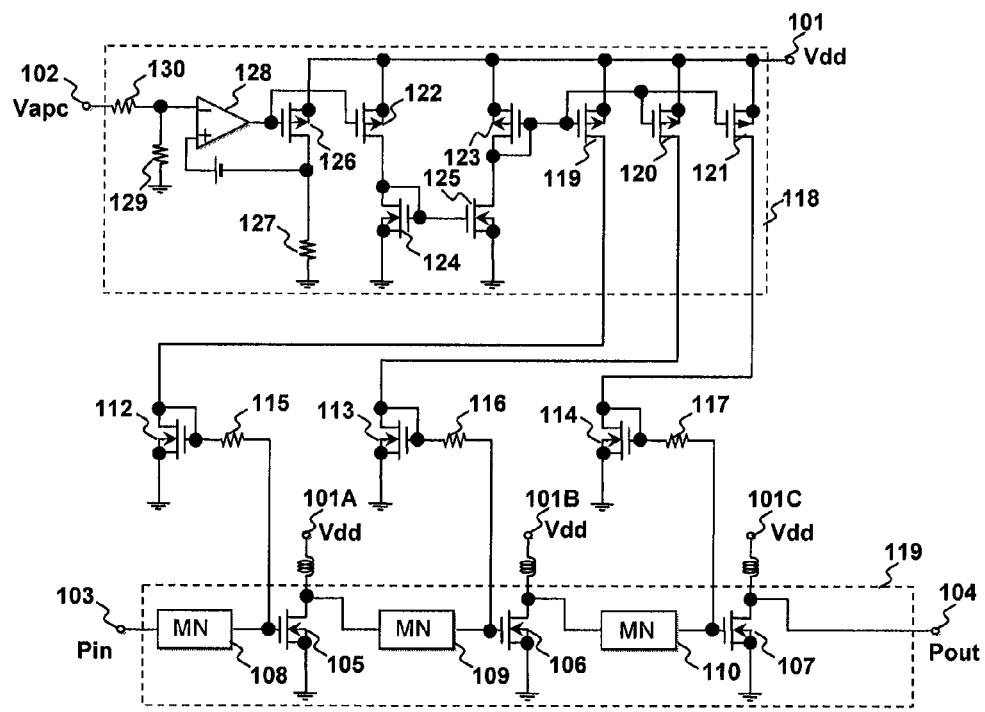
FIG. 2 is a diagram showing the composition of an RF power amplifier circuit configured of three amplification stages, which was examined by the inventors prior to the invention.
Figure 3:
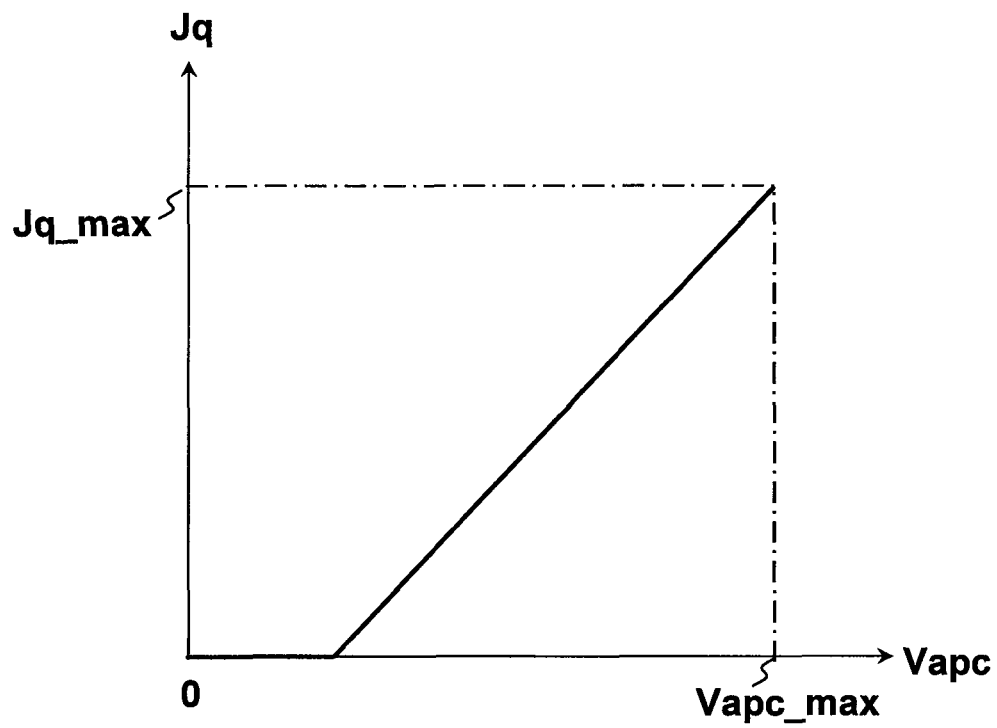
FIG. 3 is a diagram showing the dependency of the current density of quiescent current flowing into the amplification transistor of each of three amplification stages of the RF power amplifier circuit shown in FIG. 2 with respect to the output-power-control voltage.
Figure 10:
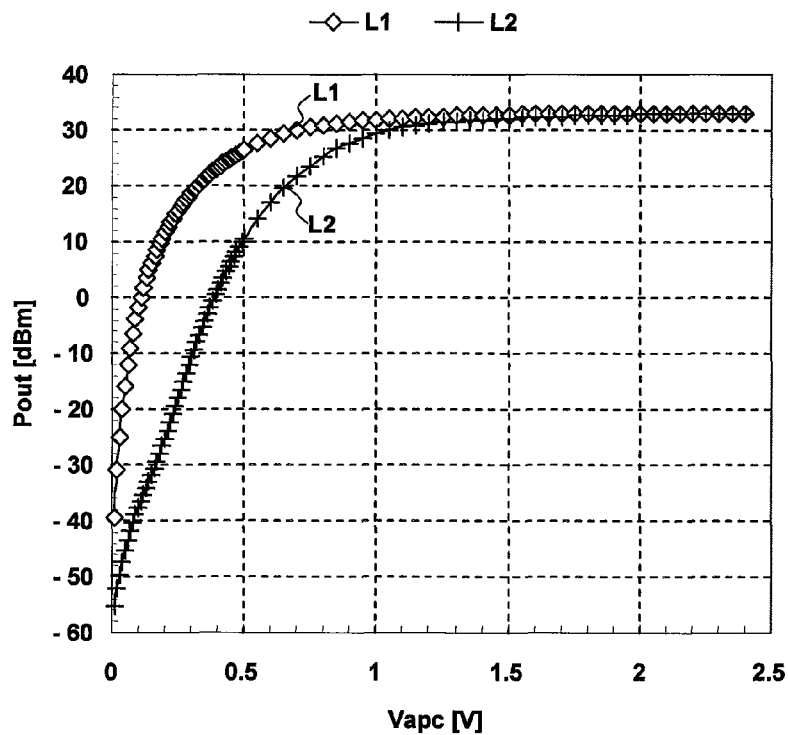
FIG. 10 is a diagram showing the characteristics of the output-power-control voltage vs. RF transmission output signal in connection with the RF power amplifier circuit according to Embodiment 3_1 of the invention shown in FIG. 1, and the RF power amplifier circuit shown in FIG. 2 and examined by the inventors prior to the invention.

FIG. 10 is a diagram showing the characteristics of the output-power-control voltage $V_{apc}$ vs. RF transmission output signal $P_{out}$ in connection with the RF power amplifier circuit according to Embodiment 3_1 of the invention shown in FIG. 1, and the RF power amplifier circuit shown in FIG. 2 and examined by the inventors prior to the invention.

In FIG. 10, the characteristic curve L1 shows the characteristic of the output-power-control voltage $V_{apc}$ vs. RF transmission output signal $P_{out}$ in connection with the RF power amplifier circuit shown in FIG. 2 and examined by the inventors prior to the invention, whereas the curve L2 shows the characteristic of the output-power-control voltage $V_{apc}$ vs. RF transmission output signal $P_{out}$ concerning the RF power amplifier circuit according to Embodiment 3_1 of the invention shown in FIG. 1.

What is found first from the characteristic curve L2 of the output-power-control voltage $V_{apc}$ vs. RF transmission output signal $P_{out}$ concerning the RF power amplifier circuit according to Embodiment 3_1 shown in FIG. 1, which is shown in FIG. 10, is there is no discontinuous point in the changing pattern thereof. Second, it is found that the change of the RF transmission output signal $P_{out}$ which would be caused in response to the change in the output-power-control voltage $V_{apc}$ is more gradual as to the characteristic curve L2 of FIG. 10 in comparison to the curve L1 of FIG. 10.

Figure 11:
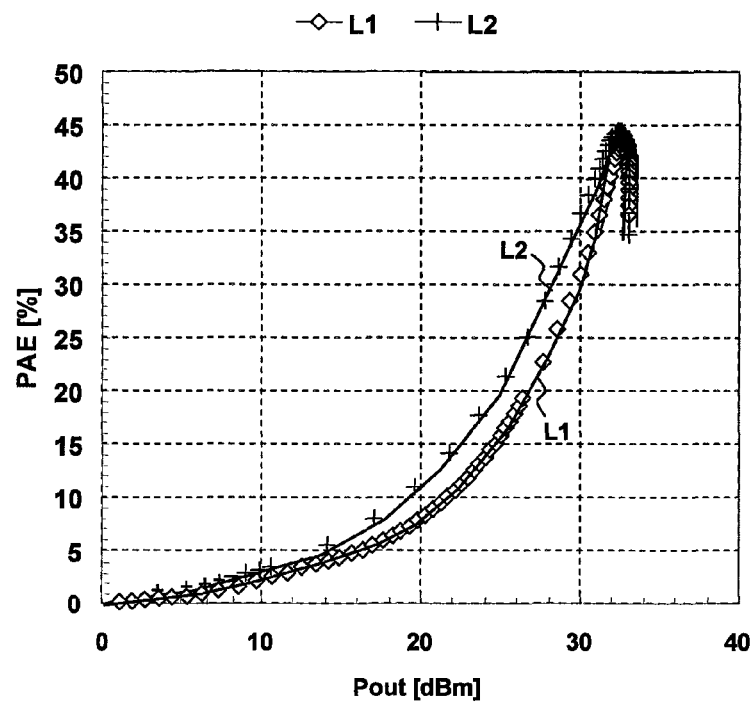
FIG. 11 is a diagram showing the characteristics of the RF transmission output signal vs. PAE (Power Added Efficiency) in connection with the RF power amplifier circuit according to Embodiment 3_1 of the invention shown in FIG. 1, and the RF power amplifier circuit shown in FIG. 2 and examined by the inventors prior to the invention.

FIG. 11 is a diagram showing the characteristics of the RF transmission output signal $P_{out}$ vs. PAE (Power Added Efficiency) in connection with the RF power amplifier circuit according to Embodiment 3_1 of the invention shown in FIG. 1, and the RF power amplifier circuit shown in FIG. 2 and examined by the inventors prior to the invention.

In FIG. 11, the characteristic curve L1 shows the characteristic of the RF transmission output signal $P_{out}$ vs. PAE (Power Added Efficiency) in association with the RF power amplifier circuit shown in FIG. 2 and examined by the inventors prior to the invention, whereas the curve L2 shows the characteristic of the RF transmission output signal $P_{out}$ vs. PAE (Power Added Efficiency) in association with the RF power amplifier circuit according to Embodiment 3_1 of the invention shown in FIG. 1.

It is found that the power added efficiencies (PAE) with respect to the RF transmission output signals $P_{out}$ with low and middle powers up to or including about 30 dBm are improved further in regard to the curve L2 of FIG. 11, in comparison to the curve L1 of FIG. 11.

[Embodiment 3_2]

<<Another Composition of RF Power Amplifier Circuit>>

Figure 5:
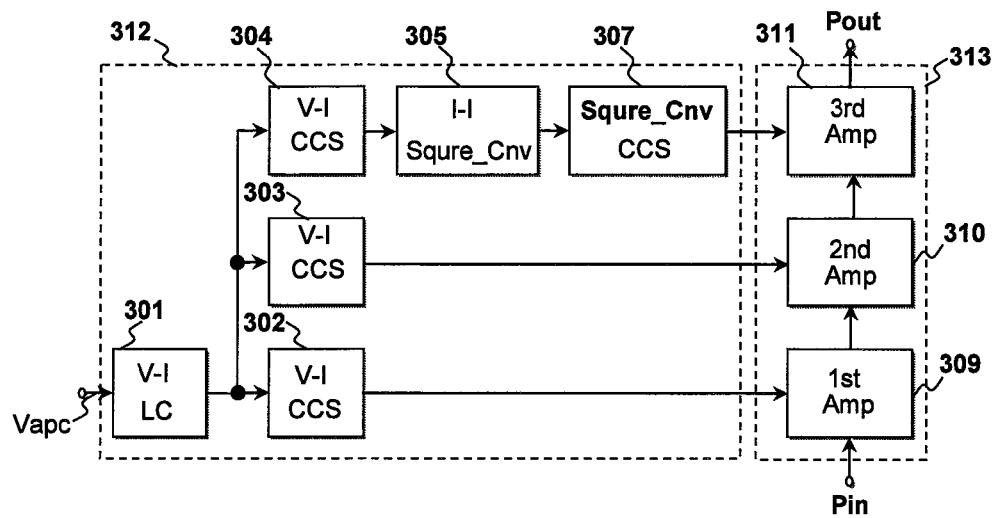
FIG. 5 is a block diagram showing the composition of an RF power amplifier circuit according to Embodiment 3_2 of the invention, which is a modification thereof.

FIG. 5 is a block diagram showing the composition of an RF power amplifier circuit according to Embodiment 3_2 of the invention, which is a modification thereof.

The RF power amplifier circuit according to Embodiment 3_2 of the invention shown in FIG. 5 differs from the RF power amplifier circuit according to Embodiment 3_1 shown in FIG. 1 in that the quiescent-current controller 312 of FIG. 5 does not have the current-current square converter 305 and current-current square conversion coefficient setting unit 307 as connected between the output of the voltage-current conversion coefficient setting unit 303 of the quiescent-current controller 312 of FIG. 1, and the second-stage amplifier 310 of the RF power amplifier circuit 313.

Therefore, in the RF power amplifier circuit according to Embodiment 3_2 of the invention shown in FIG. 5, the quiescent current of the first-stage amplification transistor of the first-stage amplifier 309, and the quiescent current of the second-stage amplification transistor of the second-stage amplifier 310 are controlled linearly in response to the output-power-control voltage $V_{apc}$. However, with respect to the output-power-control voltage $V_{apc}$ of the same level at the time of producing the RF transmission output signals $P_{out}$ of the low and middle powers, the current density Jq of quiescent current of the second-stage amplification transistor included in the second-stage amplifier 310 is set to a smaller value in comparison to the current density Jq of quiescent current of the first-stage amplification transistor included in the first-stage amplifier 309.

The second difference of the RF power amplifier circuit according to Embodiment 3_2 of the invention shown in FIG. 5 from the RF power amplifier circuit according to Embodiment 3_1 of the invention shown in FIG. 1 is that the current-current square converter 305 and current-current square conversion coefficient setting unit 307 of the quiescent-current controller 312 shown in FIG. 1 are connected between the output of the voltage-current conversion coefficient setting unit 304 and the third-stage amplifier 311 of the RF power amplifier circuit 313 in the quiescent-current controller 312 shown in FIG. 5.

Therefore, in the RF power amplifier circuit according to Embodiment 3_2 of the invention shown in FIG. 5, the quiescent current of the third-stage amplification transistor of the third-stage amplifier 311 will be controlled according to a square characteristic curve in response to the output-power-control voltage $V_{apc}$. However, with respect to the output-power-control voltage $V_{apc}$ of the same level at the time of producing the RF transmission output signals $P_{out}$ of low and middle powers, the current density Jq of quiescent current of the third-stage amplification transistor of the third-stage amplifier 311 is set to a smaller value in comparison to the current density Jq of quiescent current of the first-stage amplification transistor of the first-stage amplifier 309, and the current density Jq of quiescent current of the second-stage amplification transistor of the second-stage amplifier 310.

In regard to the RF power amplifier circuit according to Embodiment 3_2 of the invention shown in FIG. 5, the increase of signal loss owing to the impedance mismatch of the former amplification stage can be prevented from causing a larger drop in the amplitude of an input voltage of the latter amplification stage in comparison to the density of the quiescent current of the latter amplification stage at the time of producing the RF transmission output signals $P_{out}$ of low and middle powers as in Embodiment 3_1 of the invention shown in FIG. 1. In addition, the RF power amplifier circuit according to Embodiment 3_2 of the invention shown in FIG. 5 is more simplified in circuit composition in comparison to the RF power amplifier circuit according to Embodiment 3_1 of the invention shown in FIG. 1, achieving the effect of the reduction in the circuit size.

[Embodiment 3_3]

<<Specific Composition of the RF Power Amplifier Circuit>>

FIG. 6 is a circuit schematic showing the composition of an RF power amplifier circuit as a specific form according to Embodiment 3_3 of the invention.

Like the RF power amplifier circuit shown in FIG. 1, the RF power amplifier circuit 640 shown in FIG. 6 is connected with a quiescent-current controller (610, 620, 630). The RF power amplifier circuit 640 includes a first-stage amplifier 641, a second-stage amplifier 642 and a third-stage amplifier 643, which are connected to form multiple stages. The RF power amplifier circuit 640 is supplied with an RF transmission input signal $P_{in}$ through an input terminal 604 thereof. The RF power amplifier circuit 640 generates an RF transmission output signal $P_{out}$, and outputs the signal through an output terminal 605 thereof. To power-source terminals 600A, 600B and 600C of the RF power amplifier circuit 640, a power source voltage $V_{dd}$ is supplied.

To an input terminal of the first-stage amplifier 641, an RF transmission input signal $P_{in}$ is supplied through an input-stage input matching network (MN). An amplified RF carrier signal arising from an output terminal of the first-stage amplifier 641 is supplied to an input terminal of the second-stage amplifier 642 through a middle-stage input matching network (MN). An amplified RF carrier signal arising from an output terminal of the second-stage amplifier 642 is supplied to an input terminal of the third-stage amplifier 643 through an output-stage input matching network (MN). Then, an RF transmission output signal $P_{out}$ arises from an output terminal of the third-stage amplifier 643. Also, in this RF power amplifier circuit 640, the amplification transistors of the respective amplification stages are increased in device size in the order of the first-stage amplifier 641 of the top stage, the second-stage amplifier 642 of the middle stage and the third-stage amplifier 643 of the final stage.

The quiescent-current controller shown in FIG. 6 is constituted by a voltage-current linear converter circuit 610, a voltage-current linear conversion coefficient setting circuit 620, and a current-current continuous function generator circuit 630. Particularly, the current-current continuous function generator circuit 630 as shown in FIG. 6 is coordinative, in operational function, to a set of the current-current square converter 305, current-current cubic converter 306, current-current square conversion coefficient setting unit 307, and current-current cubic conversion coefficient setting unit 308 of the quiescent-current controller 312 shown in FIG. 1.

The voltage-current linear converter circuit 610 as shown in FIG. 6 includes resistances 611, 612, 614 and 618, P-channel MOS FETs 613, 615 and 617, a current mirror circuit 619, and an operational amplifier 616, and is coordinative, in operational function, to the voltage-current linear converter 301 of the quiescent-current controller 312 shown in FIG. 1.

In the voltage-current linear converter circuit 610 of FIG. 6, the output-power-control voltage $V_{apc}$ supplied through the input terminal 602 is divided by voltage-dividing resistances 611 and 612. The divided voltage is supplied to an inverting input of the operational amplifier 616 through the P-channel MOS FET 613. An output voltage of the operational amplifier 616 is fed to the P-channel MOS FET 617, and an output-power-control current $I_{apc}$ is flowed into the P-channel MOS FET 617. Further, a combination of the current mirror circuit 619, P-channel MOS FETs 613 and 615 identical in device size, and offset resistance 614 generates an offset voltage $V_{offset}$ at the inverting input of the operational amplifier 616. The offset voltage Voffset is the product of the resistance value $R_{offset}$ of the resistance 614 and a reference current $I_{ref}$ flowing through the current mirror circuit 619.

The output-power-control current of the $I_{apc}$ voltage-current linear converter circuit 610 can be determined as described below. In response to the input reference current $I_{ref}$ flowing into the input terminal 601 of the current mirror circuit 619, output reference currents $I_{ref}$ are made to flow into the P-channel MOS FETs 613 and 615, and resistance 614 respectively. Therefore, the voltage $V_+$ of the non-inverting input of the operational amplifier 616, and the voltage $V_-$ of the inverting input thereof are given by the following Expressions (4) and (5).

$$V_+ = R_3 \cdot I_{apc} + V_{SG} + R_{offset} \cdot I_{ref} \qquad (4)$$

$$V_- = V_{apc} \frac{R_2}{R_1 + R_2} + V_{SG} \qquad (5)$$

In Expressions (4) and (5), $R_3$ represents the resistance value of the resistance 618; $I_{apc}$ represents a current flowing into the resistance 618 and P-channel MOS FET 617; $V_{SG}$ represents a source-gate voltage of the P-channel MOS FETs 613 and 615; $R_{offset}$ represents the resistance value of the resistance 614; $I_{ref}$ represents the output reference current of the current mirror circuit 619; $R_1$ and $R_2$ represent the resistance values of the resistances 611 and 612 respectively; and $V_{apc}$ represents the output-power-control voltage $V_{apc}$ supplied to the input terminal 602. The operational amplifier 616 provides the P-channel MOS FET 617 with an output voltage which causes the voltages $V_+$ and $V_-$ at its two inputs to match with each other. Therefore, the output-power-control current $I_{apc}$ can be determined by Expression (6), which is derived from Expressions (4) and (5); the output-power-control current $I_{apc}$ follows a linear continuous function with respect to the output-power-control voltage $V_{apc}$.

$$I_{apc} = \frac{R_2 \cdot V_{apc}}{R_3 \cdot (R_1 + R_2)} - \frac{R_{offset}}{R_3} \cdot I_{ref} \qquad (6)$$

It is clear from Expression (6) that a linear relationship (according to a linear continuous function) is established between the output-power-control current $I_{apc}$ and output-power-control voltage $V_{apc}$ only in an operational region where the absolute value of the first term of Expression (6) in proportion to the output-power-control voltage $V_{apc}$ is larger than the absolute value of the second term of Expression (6) in proportion to the offset voltage $V_{offset}$ ($=R_{offset} \cdot I_{ref}$). In such condition, it is avoided that a feeble noise component contained in the output-power-control voltage $V_{apc}$ causes an RF transmission output signal $P_{out}$ generated from an RF power amplifier circuit to fluctuate.

The voltage-current linear conversion coefficient setting circuit 620 includes a plurality of current mirror circuits. The quiescent current of the first-stage amplifier 641 of the top stage in the RF power amplifier circuit 640 is decided by multiplication of the mirror ratio of the P-channel MOS FETs 617 and 624, the mirror ratio of the N-channel MOS FETs 625 and 626, and the mirror ratio of the P-channel MOS FETs 627 and 621.

The output current of the P-channel MOS FET 621 of the voltage-current linear conversion coefficient setting circuit 620 is supplied to the biasing N-channel MOS FET 631 with its gate and drain connected together in the current-current continuous function generator circuit 630. The biasing N-channel MOS FET 631, and the source-grounded N-channel MOS FET of the first-stage amplifier 641 of the top stage of the RF power amplifier circuit 640 are current-mirror-connected. Therefore, the quiescent current of the source-grounded N-channel MOS FET of the first-stage amplifier 641 of the top stage is set by an output current of the P-channel MOS FET 621. Thus, the quiescent current of the first-stage amplifier 641 of the top stage forms a linear continuous function with respect to the output-power-control voltage $V_{apc}$.

The output current of another P-channel MOS FET 623 of the voltage-current linear conversion coefficient setting circuit 620 is supplied to a current-input terminal $I_{in}$ of a current-square circuit 636 included in the current-current continuous function generator circuit 630. An output current arising from the current-output terminal $I_{out}$ of the current-square circuit 636, which is in proportion to the square of input current, is supplied to the biasing N-channel MOS FET 632 with its gate and drain connected together in the current-current continuous function generator circuit 630. The biasing N-channel MOS FET 632, and the source-grounded N-channel MOS FET of the second-stage amplifier 642 of the middle stage of the RF power amplifier circuit 640 are current-mirror-connected. Therefore, the quiescent current of the source-grounded N-channel MOS FET of the second-stage amplifier 642 of the middle stage is set by an output current of the P-channel MOS FET 621. Thus, the quiescent current of the second-stage amplifier 642 of the middle stage forms a continuous function of the square of the output-power-control voltage $V_{apc}$.

Further, the output current of another P-channel MOS FET 622 of the voltage-current linear conversion coefficient setting circuit 620 is supplied to a current-input terminal $I_{in}$ of a current-cube circuit 635 included in the current-current continuous function generator circuit 630. An output current arising from the current-output terminal $I_{out}$ of the current-cube circuit 635, which is in proportion to the cube of input current, is supplied to the biasing N-channel MOS FET 633 with its gate and drain connected together in the current-current continuous function generator circuit 630. The biasing N-channel MOS FET 633, and the source-grounded N-channel MOS FET of the third-stage amplifier 643 of the final stage of the RF power amplifier circuit 640 are current-mirror-connected. Therefore, the quiescent current of the source-grounded N-channel MOS FET of the third-stage amplifier 643 of the final stage is set by an output current of the P-channel MOS FET 622. Thus, the quiescent current of the third-stage amplifier 643 of the final stage forms a continuous function of the cube of the output-power-control voltage $V_{apc}$.

<<Composition of the Current-Square Circuit>>

FIG. 7 is a diagram showing the composition of the current-square circuit 636 included in the current-current continuous function generator circuit 630 of the RF power amplifier circuit according to Embodiment 3_3 of the invention shown in FIG. 6.

The current-square circuit 636 shown in FIG. 7 includes a current-square base circuit 710, an error-correction circuit 720, and a current-subtraction circuit 730. The current-square circuit 636 generates an output current $I_{out}$ in proportion to the square of current $I_{in}$ supplied to the input terminal 702, and outputs it from the output terminal 703.

The current-square base circuit 710 includes five P-channel MOS FETs 713, 714, 715, 716 and 717 substantially identical in channel length Lp and channel width Wp, and two N-channel MOS FETs 711 and 712 substantially identical in channel length Ln. The channel width Wn712 of the N-channel MOS FET 712 is set to be substantially double the channel width Wn711 of the N-channel MOS FET 711.

Hence, in response to a bias voltage $V_{bias}$ supplied to the bias-supply terminal 701, a bias current $I_0$ and a bias current $2I_0$ which is double the bias current $I_0$ are flowed into the N-channel MOS FET 711 and N-channel MOS FET 712, respectively. Further, the same current $I_1$ is flowed in the two P-channel MOS FETs 716 and 717, which are current-mirror-connected, and a current $I_2$ is flowed into the P-channel MOS FET 715 connected with the P-channel MOS FET 716 with its gate and drain diode-connected in response to the input current $I_{in}$ supplied to the current-input terminal 702.

Representing the voltage across the diode-connected P-channel MOS FET 716 by $V_1$, the source-drain voltage of the P-channel MOS FET 715 by $V_2$, the source-drain voltage of the P-channel MOS FET 717 by $V_3$, the threshold voltage of the five P-channel MOS FETs 713 to 717 and two N-channel MOS FETs 711 and 712 by $V_{TH}$, and their channel conductance by $\beta$, and the output current of the current-square base circuit 710 of the current-square circuit 636 by $I_{SQR}$, the following relations stand up:

$$I_0 = \frac{\beta}{2}\left(\frac{V_3}{2} - V_{TH}\right)^2 = \frac{\beta}{8}(V_3 - 2V_{TH})^2 \tag{7}$$

$$I_1 = \frac{\beta}{2}(V_1 - V_{TH})^2 \tag{8}$$

$$I_2 = I_1 + I_{IN} = \frac{\beta}{2}(V_2 - V_{TH})^2 \tag{9}$$

$$V_3 = V_1 + V_2 \tag{10}$$

$$I_{SQR} = I_1 + I_3 = I_1 + I_2 - 2I_0 \tag{11}$$

From Expressions (9) and (11), the output current $I_{SQR}$ of the current-square base circuit 710 of the current-square circuit 636 can be determined as expressed by:

$$I_{SQR} = 2I_1 - 2I_0 + I_{IN} \tag{12}$$

From Expressions (8) and (9), the sum of the currents $I_1$ and $I_2$ can be determined as follows:

$$I_1 + I_2 = \frac{\beta}{2}(V_1 - V_{TH})^2 + \frac{\beta}{2}(V_2 - V_{TH})^2 \tag{13}$$

$$= \frac{\beta}{2}(V_1^2 - 2V_1 V_{TH} + V_{TH}^2 + V_2^2 - 2V_2 V_{TH} + V_{TH}^2)$$

Further, from Expressions (10) and (13), the sum of the currents $I_1$ and $I_2$ can be determined as expressed by:

$$I_1 + I_2 = \frac{\beta}{2}(V_1^2 + V_2^2 - 2V_3 V_{TH} + 2V_{TH}^2) \tag{14}$$

$$= \frac{\beta}{2}\left(\frac{1}{2}(V_1 + V_2)^2 + \frac{1}{2}(V_1 - V_2)^2 + 2V_{TH}^2 - 2V_3 V_{TH}\right)$$

$$= \frac{\beta}{4}(V_3^2 - 4V_3 V_{TH} + 4V_{TH}^2 + (V_1 - V_2)^2)$$

$$= \frac{\beta}{4}((V_3 - 2V_{TH})^2 + (V_1 - V_2)^2)$$

From Expressions (8) and (9), the current $I_{in}$ supplied to the input terminal 702, which is the difference between the currents $I_2$ and $I_1$, can be determined as expressed by:

$$I_{IN} = I_2 - I_1 = \frac{\beta}{2}(V_2 - V_{TH})^2 - \frac{\beta}{2}(V_1 - V_{TH})^2 \tag{15}$$

$$= \frac{\beta}{2}((V_2 - V_{TH}) + (V_1 - V_{TH}))((V_2 - V_{TH}) - (V_1 - V_{TH}))$$

$$= \frac{\beta}{2}((V_2 + V_1 - 2V_{TH})(V_2 - V_1))$$

From Expressions (10) and (15), the following expression can be derived.

$$I_{IN} = \frac{\beta}{2}((V_3 - 2V_{TH})(V_2 - V_1)) \tag{16}$$

Then, from Expression (16), the following expression can be derived.

$$(V_2 - V_1)^2 = \frac{4I_{IN}^2}{\beta^2(V_3 - 2V_{TH})^2} \tag{17}$$

The following expression can be derived from Expression (7).

$$(V_3 - 2V_{TH})^2 = \frac{8I_0}{\beta} \quad (18)$$

Substituting Expressions (17) and (18) into Expression (14), the following expression can be obtained:

$$I_1 + I_2 = \frac{\beta}{4}((V_3 - 2V_{TH})^2 + (V_1 - V_2)^2) \quad (19)$$

$$= 2I_0 + \frac{I_{IN}^2}{8I_0}$$

The output current $I_{SQR}$ of the current-square base circuit 710 of the current-square circuit 636 can be determined from Expressions (11) and (19) as expressed by:

$$I_{SQR} = I_1 + I_2 - 2I_0 \quad (20)$$

$$= 2I_0 + \frac{I_{IN}^2}{8I_0} - 2I_0 = \frac{I_{IN}^2}{8I_0}$$

It is clear from Expression (20) that the value of output current $I_{SQR}$ of the current-square base circuit 710 changes continuously in inverse proportion to the value of bias current $I_0$, and in proportion to the square of the value of input current $I_{in}$ to the current-input terminal 702.

However, when the input current $I_{in}$ to the current-input terminal 702 reduces to an extremely small value substantially as small as zero, and then the output current $I_{SQR}$ of the current-square base circuit 710 becomes an extremely small value as small as zero substantially, the voltage at the circuit connection node 718 decreases. The decrease in voltage at the circuit connection node 718 makes it difficult to flow the bias current $2I_0$ through the N-channel MOS FET 712, and thus the output current $I_{SQR}$ of the current-square base circuit 710 ends up containing an error current component. Such error current component has a source voltage fluctuation dependency and a temperature fluctuation dependency.

The error-correction circuit 720 and current-subtraction circuit 730 of the current-square circuit 636 operate so as to compensate an error current component contained in the output current $I_{SQR}$ of the current-square circuit 636. Like the current-square base circuit 710, the error-correction circuit 720 includes five P-channel MOS FETs and two N-channel MOS FETs. However, unlike the current-square base circuit 710, the error-correction circuit 720 is not provided with the input current $I_{in}$ supplied to the current-input terminal 702.

An error-compensating current which is an output of the error-correction circuit 720 is supplied to a current mirror constituted by N-channel MOS FETs 732 and 734 of the current-subtraction circuit 730; the output current $I_{SQR}$ of the current-square base circuit 710 is provided to a current mirror constituted by N-channel MOS FETs 731 and 733 of the subtraction circuit 730. In addition, to a circuit connection node 737 connected with the drain of the N-channel MOS FET 733 of the current mirror, the error-compensating current, which is an output of the error-correction circuit 720, is supplied through the current mirror 736, and the current mirror constituted by the N-channel MOS FETs 732 and 734. Therefore, an error current component contained in the output current $I_{SQR}$ when the value of input current $I_{in}$ supplied to the current-input terminal 702 of the current-square base circuit 710 is extremely small can be canceled by the error-compensating current of output of the error-correction circuit 720 at the circuit connection node 737 connected with the drain of the N-channel MOS FET 733 of the current mirror. In addition, when the input current $I_{in}$ supplied to the current-input terminal 702 of the current-square base circuit 710 has a large value, the output current $I_{SQR}$ of the current-square base circuit 710, which has a value given by Expression (20), is flowed into the current mirror of the subtraction circuit 730 constituted by the N-channel MOS FETs 731 and 733 and into another current mirror 735 constituted by two P-channel MOS FETs, and then output from the output terminal 703 of the current-square circuit 636 as the output current $I_{out}$ of the current-square circuit 636.

Now, the following reference publication discloses a technique to generate an output current in proportion to the square of the value of input current according to Expression (20) by use of an analog CMOS circuit:

KLAAS BULT et al, "A CLASS of Analog CMOS Circuits Based on the Square-Law Characteristic of an MOS Transistor in Saturation", IEEE JOURNAL OF SOLID-STATE CIRCUITS, VOL. SC-22, No. 3, JUNE 1987, PP. 357-365.

<<Composition of the Current-Cube Circuit>>

Figure 8:
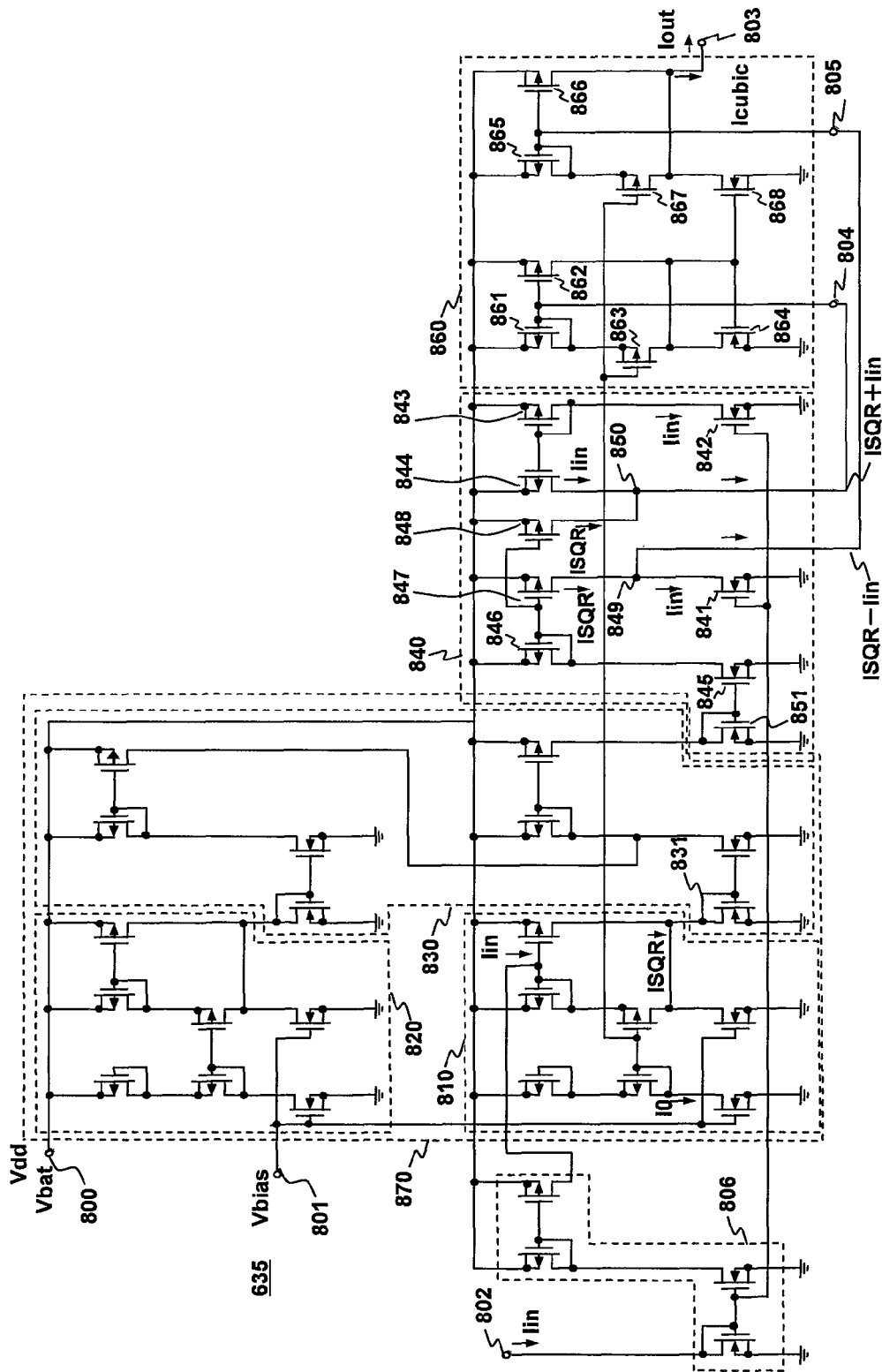
FIG. 8 is a diagram showing the composition of the current-cube circuit included in the current-current continuous function generator circuit of an RF power amplifier circuit according to Embodiment 3_3 of the invention shown in FIG. 9.

FIG. 8 is a diagram showing the composition of the current-cube circuit 635 included in the current-current continuous function generator circuit 630 of the RF power amplifier circuit according to Embodiment 3_3 of the invention shown in FIG. 6.

The current-cube circuit 635 shown in FIG. 8 includes a current-square circuit 870, a current-addition/subtraction circuit 840, and a current-multiplier circuit 860. The current-square circuit 870 of the current-cube circuit 635 includes a current-square base circuit 810, an error-correction circuit 820, and a current-subtraction circuit 830.

In the current-square base circuit 810 of FIG. 8, the value of output current $I_{SQR}$ of the current-square base circuit 810 changes continuously in inverse proportion to the value of bias current $I_0$, and in proportion to the square of the value of input current $I_{in}$ to the current-input terminal 802, according to Expression (20) as in the current-square base circuit 710 shown in FIG. 7. The bias current $I_0$ of the current-square base circuit 810 of FIG. 8 is flowed into the N-channel MOS FET of the current-square base circuit 810 of FIG. 8 in response to the bias voltage $V_{bias}$ supplied to the bias-supply terminal 801 as in the current-square base circuit 710 of FIG. 7.

The error-correction circuit 820 and current-subtraction circuit 830 of FIG. 8 operate so as to compensate an error current component contained in the output current $I_{SQR}$ of the current-square base circuit 810, in the same way as the error-correction circuit 720 and current-subtraction circuit 730 of FIG. 7.

As the output current $I_{SQR}$ of the current-subtraction circuit 830 of the current-square circuit 870 is supplied to a current mirror constituted by N-channel MOS FETs 851 and 845 of the current-addition/subtraction circuit 840 of FIG. 8, the current $I_{SQR}$ goes through a current mirror constituted by P-channel MOS FETs 846, 847 and 848 of the current-addition/subtraction circuit 840 of FIG. 8.

An input current $I_{in}$ supplied through the input terminal 802 of the current-cube circuit 635 of FIG. 8 is provided to a current mirror 806 including two N-channel MOS FETs and two P-channel MOS FETs. The current $I_{in}$ is flowed into N-channel MOS FETs 841 and 842 of the current-addition/subtraction circuit 840 connected with the current mirror 806, and also through the P-channel MOS FETs 843 and 844 of the current-addition/subtraction circuit 840. As a result, a subtraction current $I_{SQR}-I_{in}$ flows from a circuit connection node 849, which the drains of the N-channel MOS FET 841 and P-channel MOS FET 847 are connected to in the current-addition/subtraction circuit 840, into an input terminal 805 of the current-multiplier circuit 860. An addition current $I_{SQR}+I_{in}$ flows from a circuit connection node 850, which the drains of the P-channel MOS FETs 848 and 844 are connected to in the current-addition/subtraction circuit 840, into an input terminal 804 of the current-multiplier circuit 860.

The current-multiplier circuit 860 of the current-cube circuit 635 of FIG. 8 includes six P-channel MOS FETs 861 to 863, and 865 to 867, and two N-channel MOS FETs 864 and 868. The gates of the two N-channel MOS FETs 864 and 868 of the current-multiplier circuit 860 are both biased by the gate voltage of the N-channel MOS FET which the bias current $I_0$ flows into inside the current-square base circuit 810. As in the case of the analog-current multiplier as described in the reference publication presented by KLAAS BULT et al., the current-multiplier circuit 860 generates, in response to the subtraction current $I_{SQR}-I_{in}$ and addition current $I_{SQR}+I_{in}$, a multiplication output current $I_{cubic}$ given by:

$$I_{cubic} = \frac{I_{SQR} I_{IN}}{2I_0} \tag{21}$$

Substituting $I_{SQR}$ given by Expression (20) for that of Expression (21), the following Expression (22) can be gained.

$$I_{cubic} = \frac{I_{SQR} I_{IN}}{2I_0} = \frac{I_{IN}^3}{16 I_0^2} \tag{22}$$

It can be seen from Expression (22) that the value of the output current $I_{cubic}$ ($I_{out}$) of the current-cube circuit 635 shown in FIG. 8 changes continuously in inverse proportion to the square of the bias current $I_0$, and in proportion to the cube of the input current $I_{in}$ of the current-input terminal 802.

The current-cube circuit 635 described with reference to FIG. 8 once generates a current according to a square characteristic curve by use of the current-square circuit 870, thereafter generates subtraction and addition currents from a current according to a linear characteristic curve with respect to the input current $I_{in}$ and the output current $I_{SQR}$ of the current-square circuit 870 by use of the current-addition/subtraction circuit 840, and a multiplication output current $I_{cubic}$ from the subtraction and addition currents by use of the current-multiplier circuit 860, thereby generating a current according to a cubic characteristic curve. Thus, achieved is the effect that the circuit for producing a current according to a cubic characteristic curve with respect to the input current $I_{in}$ is simplified in composition, whereby the RF power amplifier circuit can be reduced in size.

[Embodiment 3_4]

<<Composition of RF Power Amplifier Module>>

FIG. 9 is a block diagram showing the composition of an RF power amplifier module according to Embodiment 3_4 of the invention.

The RF power amplifier module shown in FIG. 9 supports GSM low and high bands, namely two frequency bands (880-915 MHz for GSM900, and 1710-1785 MHz for DCS1800). The RF power amplifier module shown in FIG. 9 includes an RF power transmitter circuit 910 for GSM900 low frequency band, an RF power transmitter circuit 920 for DCS1800 high frequency band, a transmitted-power feedback circuit 930, a signal-route switching circuit 940, and an output-power-control circuit 915. A mobile data terminal is constructed by connecting a modulator circuit in RF IC, which supplies an RF transmission signal $P_{in}\_GSM/P_{in}\_DCS$, to the RF power amplifier module at e.g. a transmitter-signal input terminal 900/904, connecting a demodulator circuit operable to demodulate an RF received signal Rx_DCS/Rx_GSM of the received-signal output terminal 905/907, connecting, at control terminals 901, 902 and 903, a baseband signal processing semiconductor IC operable to generate a control signal, and connecting a sending/receiving antenna at an antenna terminal 906.

The RF power transmitter circuit 910 supporting the GSM900 low frequency band includes an RF power amplifier 911, an output matching network 912, a coupler 913, a low-pass filter 914, and an output-power-control circuit 915, whereas the RF power transmitter circuit 920 supporting DCS1800 high frequency band includes an RF power amplifier 921, an output matching network 922, a coupler 923, a low-pass filter 924, and an output-power-control circuit 915.

The transmitted-power feedback circuit 930 connected with the RF power transmitter circuit 910 supporting the low band and the RF power transmitter circuit 920 supporting the high band includes power detector circuits 932 and 933, an error amplifier 934, and a circuit switch 931. The signal-route switching circuit 940 connected with the RF power transmitter circuit 910 supporting the low band and the RF power transmitter circuit 920 supporting the high band includes an antenna switch 941, and ESD (Electro-Static Destruction) filters 942, 943 and 944.

In the RF power amplifier module shown in FIG. 9, the output-power-control circuit 915 connected to the error amplifier 934 of the transmitted-power feedback circuit 930 controls the transmitted-power level of the RF power amplifier 911 included in the RF power transmitter circuit 910 supporting the GSM900 frequency band, and the transmitted-power level of the RF power amplifier 921 included in the RF power transmitter circuit 920 supporting the DCS1800 frequency band. Specifically, the output-power-control voltage $V_{apc}$ at an output terminal 916 of the error amplifier 934 of the transmitted-power feedback circuit 930 is supplied to a control input terminal of the output-power-control circuit 915, whereby the RF power amplifier 911 supporting the low band, and the RF power amplifier 921 supporting the high band are controlled in transmitted-power level.

The RF power amplifier 911 supporting the low band and the RF power amplifier 921 supporting the high band may be composed of any one of the RF power amplifier circuit according to Embodiment 3_1 of the invention shown in FIG. 1, the RF power amplifier circuit according to Embodiment 3_2 of the invention shown in FIG. 5, and the RF power amplifier circuit according to Embodiment 3_3 of the invention as shown in FIG. 6. The transmitted-power feedback circuit 930, and output-power-control circuit 915 can be used commonly by the RF power transmitter circuit 910 supporting the low band, and the RF power transmitter circuit 920 supporting the high band. Therefore, it is possible to reduce the RF power amplifier module in size.

The output matching networks 912 and 922, which are connected with output terminals of the RF power amplifier circuits 911 and 921 respectively, have the function of minimizing the reflection loss of an RF transmission signal owing to a load impedance mismatch in connection with the sending/receiving antenna. The couplers 913 and 923 have the function of supplying part of RF transmission signals supplied from the output matching networks 912 and 922 to the transmitted-power feedback circuit 930, and feeding almost all of the remaining part of the RF transmission signals to the low-pass filters 914 and 924. The low-pass filters 914 and 924 have the function of attenuating harmonic distortions caused at the time of amplification of RF transmission signals by the RF power amplifier circuits 911 and 921. The power detector circuits 932 and 933 have the function of supplying the error amplifier 934 with detection output voltages $V_{det}$ corresponding to RF signal powers supplied from the couplers 913 and 923. The error amplifier 934 amplifies a difference between an external control voltage $V_{ramp}$ supplied through the control terminal 903 and the detection output voltage $V_{det}$ from each of the power detector circuits 932 and 933, and then generates an output-power-control voltage $V_{apc}$ so as to minimize the difference. Further, the ESD filters 942, 943 and 944 serve to prevent the static electricity coming through external terminals 907, 906 and 905 from destructing the RF power amplifier module, and to attenuate spurious. The antenna switch 941 performs sending and receiving actions, and switches the signal transmission route of RF signals output or supplied through the antenna terminal 906 according to sending and receiving actions in the GSM900 frequency band, and sending and receiving actions in the DCS1800 frequency band. Specifically, the antenna switch 941 functions so that an RF signal output from the RF power transmitter circuit 910 is conveyed to the antenna terminal 906 at the time of sending in the GSM900 frequency band; an RF signal supplied through the antenna terminal 906 is conveyed to the received-signal output terminal 907 at the time of receiving in the GSM900 frequency band; an RF signal gained from an output of the RF power transmitter circuit 920 is conveyed to the antenna terminal 906 at the time of sending in the DCS1800 frequency band; a signal supplied through the antenna terminal 906 is conveyed to the received-signal output terminal 905 at the time of receiving in the DCS1800 frequency band. The circuit switch 931 has the functions of switching the actions of the output-power-control circuit 915, the power detector circuits 932 and 933, the error amplifier 934, and the antenna switch 941 in response to a sending/receiving action switching signal, and a low/high-sending-frequency-band select signal, supplied to the control terminals 901 and 902.

In the sending action, the RF power amplifier module according to this embodiment amplifies, in power, RF transmission signals of the low/high frequency band supplied through the transmitter-signal input terminals 900 and 904 to a desired output power level in the RF power transmitter circuits 910 and 920, passes the resultant signals through the signal-route switching circuit 940, and then outputs RF transmission signals through the antenna terminal 906. The output power level in the sending action is controlled by indirectly changing the output-power-control voltage $V_{apc}$ from the output terminal 916 of the error amplifier 934 by use of the external control voltage $V_{ramp}$ supplied through the control terminal 903. Further, in the receiving action, RF received signals of the low/high frequency band supplied through the antenna terminal 906 are conveyed to the received-signal output terminals 907 and 905.

In the action of sending an RF transmission signal of the low band, i.e. GSM900 frequency band, the RF power transmitter circuit 910 supporting the low band, the transmitted-power feedback circuit 930, and the output-power-control circuit 915 form a feedback loop. The output-power-control circuit 915 controls, in response to the output-power-control voltage $V_{apc}$, the transmitted-power level of the RF power amplifier circuit 911 included in the RF power transmitter circuit 910 supporting the low band so as to minimize the difference between the external control voltage $V_{ramp}$ supplied to the control terminal 903, and the detection output voltage $V_{det}$ from the power detector circuit 932. As a result, it becomes possible to reduce the fluctuation in the transmitted output level of the RF power transmitter circuit 910 supporting the low band owing to the change in external environment, such as the change in the source voltage, the change in the temperature, and the change in load to the sending/receiving antenna.

In the action of sending an RF transmission signal of the high band, i.e. DCS1800 frequency band, the RF power transmitter circuit 920 supporting the high band, the transmitted-power feedback circuit 930, and the output-power-control circuit 915 form a feedback loop. The output-power-control circuit 915 controls, in response to the output-power-control voltage $V_{apc}$, the transmitted-power level of the RF power amplifier circuit 921 included in the RF power transmitter circuit 920 supporting the high band so as to minimize the difference between the external control voltage $V_{ramp}$ supplied to the control terminal 903, and the detection output voltage $V_{det}$ from the power detector circuit 933. As a result, it becomes possible to reduce the fluctuation in the transmitted output level of the RF power transmitter circuit 920 supporting the high band owing to the change in external environment, such as the change in the source voltage, the change in the temperature, and the change in load of the sending/receiving antenna.

As to specific circuit compositions for the output matching networks 912 and 922, the couplers 913 and 923, and the low-pass filters 914 and 924, which are included the RF power transmitter circuits 910 and 920 of the RF power amplifier module shown in FIG. 9, and the transmitted-power feedback circuit 930, and the signal-route switching circuit 940, various compositions may be adopted for them. Therefore, their descriptions are omitted here.

While the invention made by the inventor has been specifically described above focusing on various embodiments thereof, it is not so limited. It is obvious that various changes and modifications may be made without departing from the scope of the invention.

[Other Embodiment]

In regard to the embodiment described with reference to FIG. 1, for example, the application of the invention to an RF power amplifier circuit of a three-stage composition has been described. However, as to the invention, the amplifiers of the stages may be operated in any manner as long as the gain of a next-stage amplifier is controlled according to a continuous function higher than that involved in the gain control of a previous-stage amplifier by at least one degree. An RF power amplifier circuit of multiple-stages according to the invention may include RF power amplifiers of any number of stages.

Further, the multiple stages' amplifiers included in the RF power amplifier circuit having multiple stages may be controlled in response to an output-power-control voltage $V_{apc}$ so that the quiescent currents of the first-, second-, third-, and next-stage amplifiers follow linear, quadratic, cubic, and higher-power continuous functions respectively. The circuit pattern or form and type of the amplifiers of the respective stages do not matter.

Setting the ratio of the channel width of the N-channel MOS FET 712 of the current-square base circuit 710 of the current-square circuit 736 shown in FIG. 7 so as to be smaller than double the channel width of the N-channel MOS FET 711, for example, it is possible to cause an offset difference between currents flowing into the N-channel MOS FETs 731 and 732 of the current mirrors of the current-subtraction circuit 730. For instance, if the smaller ratio is set to 1.75, $1.75I_0$ of $2I_0$ of the first term of the right-hand side of Expression (19) flows into the N-channel MOS FET 712, and the remaining $0.25I_0$ flows into the N-channel MOS FET 731 of the current-subtraction circuit 730.

On the other hand, with the error-correction circuit 720, the ratio of the channel width of the N-channel MOS FET corresponding to the N-channel MOS FET 712 of the current-square base circuit 710 is set so as to be smaller than double the channel width of the N-channel MOS FET corresponding to the N-channel MOS FET 711 of the current-square base circuit 710. Consequently, $1.75I_0$ of $2I_0$ of the first term of the right-hand side of Expression (19) flows through the N-channel MOS FET of the error-correction circuit 720, which corresponds to the N-channel MOS FET 712 of the current-square base circuit 710, and the remaining $0.25I_0$ runs through the N-channel MOS FET 732 of the current-subtraction circuit 730.

Therefore, the offset current of $0.25I_0$ flowing through the N-channel MOS FET 731 of the current-subtraction circuit 730, and the offset current of $0.25I_0$ flowing through the N-channel MOS FET 732 can cancel out each other at the circuit connection node 735 of the current-subtraction circuit 730. Also, in this case, an output current having a value following to Expression (20) can generated and output through the output terminal 703 of the current-square circuit 636 of FIG. 7 consequently.

In case of generating an output current in proportion to the fourth power of the input current $I_{in}$ larger than the third power of the input current $I_{in}$, or a continuous function of a higher degree, the following embodiments may be adopted.

When the continuous function of a higher degree has, as its degree, an even number expressed by 2n (n: a natural number), and therefore it contains a term in proportion to the 2n-th power of the input current $I_{in}$, a continuous function generator circuit formed by connecting successively n stages each including the current-square circuit 870 in connection with the embodiment of the invention described with reference to FIG. 8 is used. A continuous function having as its degree, an even number can be generated and output from each node between the successively-connected n stages of the continuous function generator circuit.

In contrast, when the continuous function of a higher degree has, as its degree, an odd number expressed by 2n+1 (n: a natural number), and therefore it contains a term in proportion to the (2n+1)-th power of the input current $I_{in}$, the current-cube circuit 635 including the current-square circuit 870 with the current-addition/subtraction circuit 840 and current-multiplier circuit 860 of FIG. 8 connected thereto, which has been described in connection with the embodiment of the invention described with reference to FIG. 8, is used. Then, a continuous function of the cube is generated first. Second, a signal of the continuous function of the cube is supplied to an input terminal of the second current-square circuit 870, thereby generating a continuous function of the fifth power and outputting it from an output terminal of the second current-square circuit 870. Subsequently, a signal according to the continuous function of the fifth power is supplied to an input terminal of the third current-square circuit 870, thereby generating a continuous function of the seventh power and outputting it from an output terminal of the third current-square circuit 870. After that, a continuous function having the degree of any odd number can be generated in the same way.

For example, in regard to the embodiments described with reference to FIGS. 6 to 8, the RF power amplifier circuit may be constructed by a monolithic integrated circuit which incorporates a CMOSFET (Complementary MOSFET). However, the invention is not limited to the embodiments.

While in the embodiment described with reference to FIG. 6, MOS FETs are used as the amplification transistors 641, 642 and 643, and biasing transistors 631, 632 and 633 of the RF power amplifier circuit, other types of transistors, e.g. LDMOSFET (Laterally Diffused MOS FET), BJT (Bipolar Junction Transistor), HBT (Hetero-junction Bipolar Transistor), MESFET (Metal Semiconductor Field Effect Transistor), and HEMT (High Electron Mobility Transistor), may be used instead.

In such case, an RF power amplifier module can be formed by arranging the amplification transistors 641, 642, and 643, and biasing transistors 631, 632 and 633 of the RF power amplifier circuit in a compound semiconductor chip of e.g. GaAs, and the output-power-control circuit of the RF power amplifier circuit in a CMOS silicon semiconductor chip.

FIG. 12 is a block diagram showing the composition of an RF power amplifier circuit according to an embodiment of the invention, in which NPN type heterojunction bipolar transistors (HBTs) are used instead of N-channel MOS FETs used as the amplification transistors 641, 642 and 643, and biasing transistors 631, 632 and 633 in the RF power amplifier circuit according to Embodiment 3_3 shown in FIG. 6.

In the RF power amplifier circuit shown in FIG. 12, the output-power-control current $I_{apc}$ of the voltage-current linear converter circuit 610 follows a linear continuous function with respect to the output-power-control voltage $V_{apc}$ as shown by Expression (6) as in the RF power amplifier circuit as shown in FIG. 6. Therefore, the output current of the P-channel MOS FET 621 the of the voltage-current linear conversion coefficient setting circuit 620 of the RF power amplifier circuit shown in FIG. 12 follows a linear continuous function with respect to the output-power-control voltage $V_{apc}$ as in the RF power amplifier circuit according to Embodiment 3_3. The output current from the P-channel MOS FET 621 is supplied to three bipolar transistors 661, 662 and 663 connected in series in the current-current continuous function generator circuit 660 as an input current. The current-current continuous function generator circuit 630 includes three bipolar transistors 664, 665 and 666 connected dependently, in which the collector current of the first transistor 664 is in proportion to the input current linearly; the collector current of the second transistor 665 is in proportion to the square of the input current; the collector current of the third transistor 665 is in proportion to the cube of the input current. The collector currents of the first, second and third transistors 664, 665 and 666 are supplied through a current mirror CM to base-collector-connected biasing transistors 631, 632 and 633 of the bias-voltage generator circuit 650, respectively.

Therefore, the quiescent current of the amplification transistor 641 of the first-stage amplifier of the top stage of the RF power amplifier circuit 640 follows a linear continuous function of the output-power-control voltage $V_{apc}$; the quiescent current of the amplification transistor 642 of the second-stage amplifier of the middle stage follows a continuous function of the square of the output-power-control voltage $V_{apc}$; the quiescent current of the amplification transistor 643 of the third-stage amplifier of the final stage follows a continuous function of the cube of the output-power-control voltage $V_{apc}$.

As to the above embodiments, the examples of application of the invention to the GSM900 frequency band as a low band and the DCS1800 frequency band as a high band has been described mainly. However, the effect of the invention is not achieved exclusively in the application to the GSM900 and DCS1800 frequency bands. The invention is applicable to other GSM frequency bands, such as a GSM850 frequency band for the low band, and a PCS1900 frequency band for the high band.

In addition, the invention can be adopted widely for RF power amplifier circuits in other communication systems such as WCDMA (Wide-band Code Division Multiple Access), WiMAX (Worldwide Interoperability for Microwave Access), and LTE (Long Term Evolution) except GSM, and other frequency bands.

4. Details of the embodiments of the invention made in consideration of the second noticed point Next, the embodiments of the invention made in consideration of the second noticed point will be described further in detail. It is noted that in all the drawings for description of the best forms for embodying the invention, members having identical functions are identified by the same reference numeral or character to avoid the repetition of the description.

First, the second noticed point that the inventors eyed will be described.

Of mobile communication systems, GSM (Global System for Mobile Communications) has been used almost all over the world, and are expected to continue to be used in the future. Mobile communication terminal devices operate on batteries. Therefore, in terms of use of them for a longer time, the following are important: mobile communication terminal devices can keep operating even after the voltages supplied by their batteries have fallen; and they consumes smaller amounts of power.

If a battery of a mobile communication terminal device cannot output the voltage required for the device to operate, a DC-DC converter may be used to raise the voltage supplied by the battery, instead. However, use of a DC-DC converter has the following problems. The first is that undesired spurious will occur. The second is that the use of a DC-DC converter leads to the increase in the number of parts constituting the mobile communication terminal device, which increases the production cost. Undesired spurious can disable a mobile communication terminal device for meeting a communication system standard. The rise in the cost largely affects low-cost mobile communication terminal devices which use GSM system and support only small-capacity communications such as conversation by voice and communication by electronic mail. Therefore, from the standpoint of the reduction in cost, it is undesirable to use a DC-DC converter.

Further, a GSM communication system requires that a mobile communication terminal device should be controlled in the level of transmitted power according to a communication distance between a base station and the mobile communication terminal device. This can be achieved by using an output-power-control voltage $V_{apc}$ to control the gain of transmitted power of an RF power amplifier incorporated in the mobile communication terminal device. In addition, to reduce the power consumption, it is necessary to replace an RF power amplifier or RF power transmitter module, which is incorporated in a mobile communication terminal device and consumes a relatively large power, with another one which can operate on a smaller power, thereby to increase the power efficiency.

In general, an RF power amplifier to be incorporated in a mobile communication terminal device is constituted by multiple stages' amplifiers. Usually, the value of quiescent current of each amplification stage of multiple stages' amplifiers is set so that in case that the output-power-control voltage $V_{apc}$ reaches a maximum, the maximum output power $P_{out}$(max) according to the standard for mobile communication systems is achieved.

Further, in general, as to an RF power amplifier constituted by multiple stages' amplifiers, the current densities of quiescent currents (bias currents) which respectively flow through the first-stage amplification transistor, second-stage amplification transistor, and third-stage amplification transistor in response to the same output-power-control voltage $V_{apc}$ are set to be the same value.

As to the RF power amplifier circuit organized in multiple amplification stages, the first-stage amplification transistor has a relatively small device size, the second-stage amplification transistor has a middle device size, and the third- or final-stage amplification transistor has a relatively large device size. In other words, with such RF power amplifier circuit, the amplification transistors of the amplification stages are made larger in device size according to an increase in signal level of RF input signals from the first to final amplification stage through the middle one, and thus PAE (Power Added Efficiency) of the RF power amplifier circuit is improved. If the amplification transistors of the first and middle amplification stages have a device size as large as that the final-stage amplification transistor has, a needlessly larger quiescent current (bias current) in comparison to a small signal level of RF input signals will go through the amplification transistors of the first and middle amplification stages, leading to a drop of PAE of the RF power amplifier circuit. The device capacities of the first-stage amplification transistor, second-stage amplification transistor and third-stage amplification transistor of the RF power amplifier circuit are set so that the power efficiency of each amplification stage reaches the maximum in case that the RF power amplifier circuit generates a maximum output power $P_{out}$(max) according to the standard. Adequate settings of the device capacities of the amplification transistors of the amplification stages of the RF power amplifier circuit, and of the values of current densities of the quiescent currents (bias current) minimize the signal loss of the amplification stages owing to the impedance mismatch in case of producing the maximum output power $P_{out}$(max), and maximize the power efficiency of the amplification stages.

In this way, the device capacities of the amplification transistors of the amplification stages are made larger in the order of the first stage, the middle stage, and the final stage, whereby the device capacities are optimized. As a result, PAE of the RF power amplifier circuit at the time of generating the maximum output power $P_{out}$(max) can be improved.

However, the study made by the inventors has revealed that PAE drops in case that the RF power amplifier circuit generates an output power $P_{out}$ lower than the maximum output power $P_{out}$(max). Now, the cause of the drop of PAE in low and middle power modes will be explained below.

When the output power $P_{out}$ generates by the RF power amplifier circuit lowers below the maximum output power $P_{out}$(max), the signal loss owing to the impedance mismatch of the first and second stages of the preceding amplification stages is increased. As a result, the input voltage amplitude $V_{min}$ of the final amplification stage, i.e. third stage, is made smaller. At that time, the value of quiescent current (bias current) of the final amplification stage, i.e. third stage is also lowered, and the input voltage amplitude $V_{min}$ of the final amplification stage, i.e. third stage is dropped more remarkably. Therefore, the power efficiency of the final amplification stage, i.e. third stage is lowered in low and middle power modes, and thus PAE of the RF power amplifier circuit is dropped. The mechanism of this will be described below in detail.

The power efficiency η of each of the amplification transistors of the first to third stages of the RF power amplifier circuit in case that the amplification transistors are in a class-A operation in which the amplification transistors generate densities $J_{cm}$ of currents with positive- and negative-cycle output signal amplitudes with respect to the current density Jq of quiescent current (bias current) is given by Expression (1).

Now, as the amplification transistors, e.g. field effect transistors are assumed. If the transconductance and input voltage amplitude of each amplification transistor are represented by $g_m$ and $V_{min}$, the density $J_{cm}$ of current with the output signal amplitude concerning each amplification transistor is given by Expression (2).

In the expression, β is a constant depending on the gate size of the transistors, the gate capacitance per unit area, and the mobility of carriers. Substituting the density $J_{cm}$ given by Expression (2) for the density $J_{cm}$ of Expression (1), the following Expression (3) can be gained.

It is clear from Expression (3) that a remarkable reduction of the input voltage amplitude $V_{min}$ of the final amplification stage, i.e. third stage rather than the density Jq of quiescent current (bias current) thereof lowers the power efficiency η of the amplification transistor of the final amplification stage, i.e. third stage. Further, in case of assuming the use of bipolar transistors as the amplification transistors, the decrease of the input voltage amplitude $V_{min}$ causes the reduction of the power efficiency η of the amplification transistors as expected because the mutual conductance $g_m$ is in proportion to the density of quiescent (bias) current density Jq.

The study made by the inventors prior to the invention as described above revealed the problem of drop of PAE of an RF power amplifier including multiple stages' amplifiers in low and middle power modes.

Therefore, prior to the invention, the inventors examined a power control method by which the quiescent current and gain of the next-stage amplifier are controlled in response to an output-power-control voltage $V_{apc}$ according to a continuous function higher than that for the control of the quiescent current and gain of the previous-stage amplifier by at least one in degree.

Figure 21:
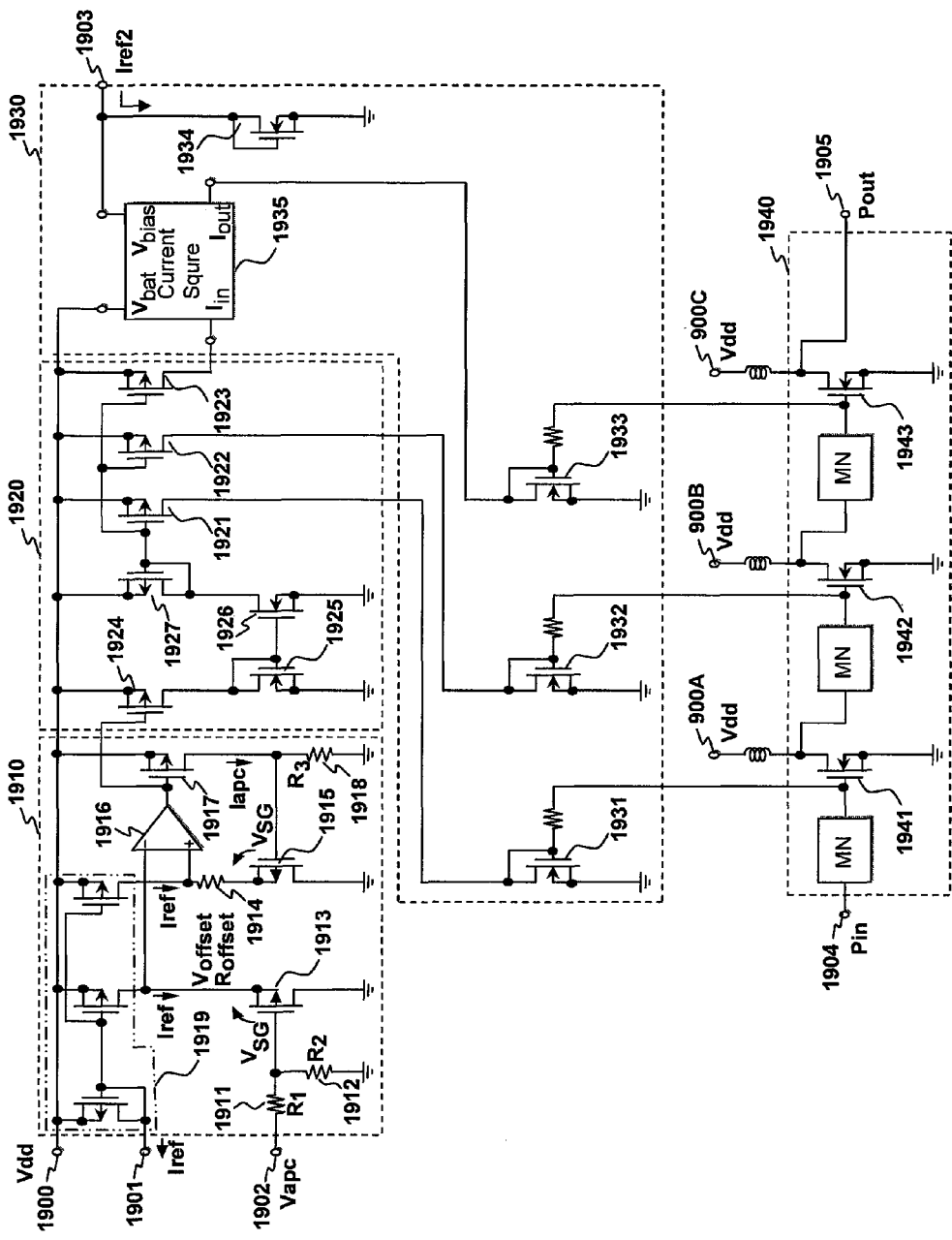
FIG. 21 is a diagram showing the composition of an RF power amplifier circuit which actualizes a power control method including the step of controlling the quiescent current and gain of the next-stage amplifier in response to an output-power-control voltage $V_{apc}$ according to a continuous function higher than that for the control of the quiescent current and gain of the previous-stage amplifier by at least one in degree, provided that the method was examined by the inventors prior to the invention.

FIG. 21 is a diagram showing the composition of an RF power amplifier circuit which actualizes the power control method examined by the inventors prior to the invention.

The RF power amplifier circuit 1940 shown in FIG. 21 is connected with quiescent-current controllers 1910, 1920 and 1930. The RF power amplifier circuit 1940 includes a first-stage amplifier 1941, a second-stage amplifier 1942, and a third-stage amplifier 1943, which are connected to form multiple stages. An RF transmission input signal $P_{in}$ is supplied to an input terminal 1904 of the RF power amplifier circuit 1940. The RF power amplifier circuit 1940 generates an RF transmission output signal $P_{out}$, which is output from an output terminal 1905 thereof. To power-source-voltage terminals 900A, 900B and 900C of the RF power amplifier circuit 1940, a power source voltage $V_{dd}$ is supplied.

To an input terminal of the first-stage amplifier 1941, an RF transmission input signal $P_{in}$ is supplied through an input-stage input matching network (MN). An amplified RF carrier signal arising from an output terminal of the first-stage amplifier 1941 is supplied to an input terminal of the second-stage amplifier 1942 through a middle-stage input matching network (MN). An amplified RF carrier signal arising from an output terminal of the second-stage amplifier 1942 is supplied to an input terminal of the third-stage amplifier 1943 through an output-stage input matching network (MN). Then, an RF transmission output signal $P_{out}$ arises from an output terminal of the third-stage amplifier 1943. Also, in this RF power amplifier circuit 1940, the amplification transistors of the respective amplification stages are increased in device size in the order of the first-stage amplifier 1941 of the top stage, the second-stage amplifier 1942 of the middle stage and the third-stage amplifier 1943 of the final stage.

The quiescent-current controller shown in FIG. 21 is constituted by a voltage-current linear converter circuit 1910, a voltage-current linear conversion coefficient setting circuit 1920, and a current-current continuous function generator circuit 1930.

The voltage-current linear converter circuit 1910 shown in FIG. 21 includes resistances 1911, 1912, 1914 and 1918, P-channel MOS FETs 1913, 1915 and 1917, a current mirror circuit 1919, and an operational amplifier 1916.

In the voltage-current linear converter circuit 1910 of FIG. 21, the output-power-control voltage $V_{apc}$ supplied through the input terminal 1902 is divided by voltage-dividing resistances 1911 and 1912. The divided voltage is supplied to an inverting input of the operational amplifier 1916 through the P-channel MOS FET 1913. An output voltage of the operational amplifier 1916 is fed to the P-channel MOS FET 1917, and an output-power-control current $I_{apc}$ is flowed into the P-channel MOS FET 1917. Further, a combination of the current mirror circuit 1919, P-channel MOS FETs 1913 and 1915 identical in device size, and offset resistance 1914 keeps the output-power-control current $I_{apc}$ from flowing in case of the output-power-control voltage $V_{apc}$ below the offset voltage $V_{offset}$. The offset voltage $V_{offset}$ depends on the product of the resistance value $R_{offset}$ of the resistance 1914 and a reference current $I_{ref}$ flowing through the current mirror circuit 1919, and the resistance ratio of voltage-dividing resistances 1911 and 1912.

The output-power-control current $I_{apc}$ of the voltage-current linear converter circuit 1910 can be determined as described below. In response to the input reference current $I_{ref}$ flowing into the input terminal 1901 of the current mirror circuit 1919, output reference currents $I_{ref}$ are made to flow into the P-channel MOS FETs 1913 and 1915, and resistance 1914 respectively. Therefore, the voltage $V_+$ of the non-inverting input of the operational amplifier 1916, and the voltage $V_-$ of the inverting input thereof are given by Expressions (4) and (5).

In Expressions (4) and (5), $R_3$ represents the resistance value of the resistance 1918; $I_{apc}$ represents a current flowing into the resistance 1918 and P-channel MOS FET 1917; $V_{SG}$ represents a source-gate voltage of the P-channel MOS FETs 1913 and 1915; $R_{offset}$ represents the resistance value of the resistance 1914; $I_{ref}$ represents the output reference current of the current mirror circuit 1919; $R_1$ and $R_2$ represent the resistance values of the resistances 1911 and 61912 respectively; and $V_{apc}$ represents the output-power-control voltage $V_{apc}$ supplied to the input terminal 1902. The operational amplifier 1916 provides the P-channel MOS FET 1917 with an output voltage which causes the voltages $V_+$ and $V_-$ at its two inputs to match with each other. Therefore, the output-power-control current $I_{apc}$ and offset voltage $V_{offset}$ can be determined as presented by the following Expressions (23) and (24) from Expressions (4) and (5); the output-power-control current $I_{apc}$ follows a linear continuous function with respect to the output-power-control voltage $V_{apc}$.

$$I_{apc} = \frac{R_2}{R_3(R_1 + R_2)}(V_{apc} - V_{offset}) \qquad (23)$$

-continued $$V_{offset} = \frac{R_1 + R_2}{R_2} R_{offset} \cdot I_{ref} \quad (24)$$

It is clear from Expression (23) that a linear relationship (according to a linear continuous function) is established between the output-power-control current $I_{apc}$ and output-power-control voltage $V_{apc}$ only in an operational region where the output-power-control voltage $V_{apc}$ is larger than the offset voltage $V_{offset}$. Further, as the voltage $V_+$ at the non-inverting input of the operational amplifier 1916 is larger than the voltage $V_-$ at the inverting input in an operational region where the output-power-control voltage $V_{apc}$ is smaller than the offset voltage $V_{offset}$. Therefore, the output voltage from the operational amplifier 1916 rises close to the power source voltage $V_{dd}$ and the P-channel MOS FET 1917 has no drain current. As a result, the output-power-control current $I_{apc}$ is not allowed to flow. In this way, it becomes possible to avoid that in the condition of operating the RF power amplifier circuit, i.e. not flowing output-power-control current $I_{apc}$ through the circuit, a feeble noise component contained in the output-power-control voltage $V_{apc}$ causes the output-power-control current $I_{apc}$ to flow, thereby activating the RF power amplifier circuit. This is because if the offset voltage $V_{offset}$ is zero, i.e. the resistance value $R_{offset}$ of the resistance 1914 is zero, the output-power-control current $I_{apc}$ in proportion to the voltage of noise which the output-power-control voltage $V_{apc}$ can bring into the circuit is developed.

The voltage-current linear conversion coefficient setting circuit 1920 includes a plurality of current mirror circuits. The quiescent current of the first-stage amplifier 1941 of the top stage in the RF power amplifier circuit 1940 is decided by multiplication of the mirror ratio of the P-channel MOS FETs 1917 and 1924, the mirror ratio of the N-channel MOS FETs 1925 and 1926, and the mirror ratio of the P-channel MOS FETs 1927 and 1921.

The output current of the P-channel MOS FET 1921 of the voltage-current linear conversion coefficient setting circuit 1920 is supplied to the biasing N-channel MOS FET 1931 with its gate and drain connected together in the current-current continuous function generator circuit 1930. The biasing N-channel MOS FET 1931, and the source-grounded N-channel MOS FET of the first-stage amplifier 1941 of the top stage of the RF power amplifier circuit 1940 are current-mirror-connected. Therefore, the quiescent current of the source-grounded N-channel MOS FET of the first-stage amplifier 1941 of the top stage is set by an output current of the P-channel MOS FET 1921. Thus, the quiescent current of the first-stage amplifier 1941 of the top stage forms a linear continuous function with respect to the output-power-control voltage $V_{apc}$.

The output current of the P-channel MOS FET 1922 of the voltage-current linear conversion coefficient setting circuit 1920 is supplied to the biasing N-channel MOS FET 1932 with its gate and drain connected together in the current-current continuous function generator circuit 1930. The biasing N-channel MOS FET 1932, and the source-grounded N-channel MOS FET of the second-stage amplifier 1942 of the middle stage of the RF power amplifier circuit 1940 are current-mirror-connected. Therefore, the quiescent current of the source-grounded N-channel MOS FET of the second-stage amplifier 1942 of the middle stage is set by an output current of the P-channel MOS FET 1922. Thus, the quiescent current of the second-stage amplifier 1942 of the middle stage forms a linear continuous function with respect to the output-power-control voltage $V_{apc}$.

The output current of another P-channel MOS FET 1923 of the voltage-current linear conversion coefficient setting circuit 1920 is supplied to a current-input terminal $I_{in}$ of a current-square circuit 1935 included in the current-current continuous function generator circuit 1930. An output current arising from the current-output terminal $I_{out}$ of the current-square circuit 1935, which is in proportion to the square of input current, is supplied to the biasing N-channel MOS FET 1933 with its gate and drain connected together in the current-current continuous function generator circuit 1930. The biasing N-channel MOS FET 1933, and the source-grounded N-channel MOS FET of the third-stage amplifier 1943 of the final stage of the RF power amplifier circuit 1940 are current-mirror-connected. Therefore, the quiescent current of the source-grounded N-channel MOS FET of the third-stage amplifier 1943 of the final stage is set by an output current of the P-channel MOS FET 1923. Thus, the quiescent current of the third-stage amplifier 1943 of the final stage forms a continuous function of the square of the output-power-control voltage $V_{apc}$.

As the current-square circuit 1935 included in the current-current continuous function generator circuit 1930 of the RF power amplifier circuit shown in FIG. 21, which was examined by the inventors prior to the invention, the current-square circuit 636 is adopted (see FIG. 6).

The current-square circuit 636 shown in FIG. 7 includes a current-square base circuit 710, an error-correction circuit 720, and a current-subtraction circuit 730. The current-square circuit 636 generates an output current $I_{out}$ in proportion to the square of current $I_{in}$ supplied to the input terminal 702, and outputs it from the output terminal 703.

The current-square base circuit 710 includes five P-channel MOS FETs 713, 714, 715, 716 and 717 substantially identical in channel length Lp and channel width Wp, and two N-channel MOS FETs 711 and 712 substantially identical in channel length Ln. The channel width Wn712 of the N-channel MOS FET 712 is set to be substantially double the channel width Wn711 of the N-channel MOS FET 711.

Hence, in response to a bias voltage $V_{bias}$ supplied to the bias-supply terminal 701, a bias current $I_0$ and a bias current $2I_0$ which is double the bias current $I_0$ are flowed through the N-channel MOS FET 711 and N-channel MOS FET 712, respectively. Further, the same current $I_1$ is flowed into the two P-channel MOS FETs 716 and 717, which are current-mirror-connected, and a current $I_2$ is flowed into the P-channel MOS FET 715 connected with the diode-connected P-channel MOS FET 716 with its gate and drain connected together in response to the input current $I_{in}$ supplied to the current-input terminal 702.

Representing the voltage across the diode-connected P-channel MOS FET 716 by $V_1$, the source-drain voltage of the P-channel MOS FET 715 by $V_2$, the source-drain voltage of the P-channel MOS FET 717 by $V_3$, the threshold voltage of the five P-channel MOS FETs 713-717 by $V_{TH}$, and the output current of the current-square base circuit 710 of the current-square circuit 636 by $I_{SQR}$, and further expressing β by $\mu C_{ox} W/L$, where μ is the mobility of carriers, $C_{ox}$ is the gate capacitance per unit area, W is a gate width, and L is a gate length, the relations presented by Expressions (7) to (11) stand up.

From Expressions (8) and (9), the sum of the currents $I_1$ and $I_2$ can be determined as presented by Expression (13).

From Expressions (10) and (13), the sum of the currents $I_1$ and $I_2$ can be determined as presented by Expression (14).

From Expressions (8) and (9), the current $I_{in}$ supplied to the input terminal 702, which is the difference between the currents $I_2$ and $I_1$, can be determined as presented by Expression (15).

Further, Expression (16) can be obtained from Expressions (10) and (15).

Then, Expression (17) can be gained from Expression (16).

On the other hand, Expression (18) can be obtained from Expression (7).

Therefore, Expression (19) can be gained by substituting Expressions (17) and (18) for (14).

The output current $I_{SQR}$ of the current-square base circuit 710 of the current-square circuit 1936 can be determined from Expressions (11) and (19) as presented by Expression (20).

It is clear from Expression (20) that the value of output current $I_{SQR}$ of the current-square base circuit 710 changes continuously in inverse proportion to the value of bias current $I_0$, and in proportion to the square of the value of input current $I_{in}$ to the current-input terminal 702.

However, when the input current $I_{in}$ to the current-input terminal 702 reduces to an extremely small value substantially as small as zero, and then the output current $I_{SQR}$ of the current-square base circuit 710 becomes an extremely small value as small as zero substantially, the voltage at the circuit connection node 718 decreases. The decrease in voltage at the circuit connection node 718 makes it difficult to flow the bias current $2I_0$ through the N-channel MOS FET 712, and thus the output current $I_{SQR}$ of the current-square base circuit 710 ends up containing an error current component. Such error current component has a source voltage fluctuation dependency and a temperature fluctuation dependency.

The error-correction circuit 720 and current-subtraction circuit 730 of the current-square circuit 636 operate so as to compensate an error current component contained in the output current $I_{SQR}$ of the current-square circuit 636. Like the current-square base circuit 710, the error-correction circuit 720 includes five P-channel MOS FETs and two N-channel MOS FETs. However, unlike the current-square base circuit 710, the error-correction circuit 720 is not supplied with the input current $I_{in}$ because the current-input terminal 702 is not attached thereto.

An error-compensating current which is an output of the error-correction circuit 720 is supplied to a current mirror constituted by N-channel MOS FETs 732 and 734 of the current-subtraction circuit 730; the output current $I_{SQR}$ of the current-square base circuit 710 is provided to a current mirror constituted by N-channel MOS FETs 731 and 733 of the subtraction circuit 730. In addition, to a circuit connection node 737 connected with the drain of the N-channel MOS FET 733 of the current mirror, the error-compensating current, which is an output of the error-correction circuit 720, is supplied through the current mirror 736, and the current mirror constituted by the N-channel MOS FETs 732 and 734. Therefore, an error current component contained in the output current $I_{SQR}$ when the value of input current $I_{in}$ supplied to the current-input terminal 702 of the current-square base circuit 710 is extremely small can be canceled by the error-compensating current of output of the error-correction circuit 720 at the circuit connection node 737 connected with the drain of the N-channel MOS FET 733 of the current mirror. In addition, when the input current $I_{in}$ supplied to the current-input terminal 702 of the current-square base circuit 710 has a large value, the output current $I_{SQR}$ of the current-square base circuit 710, which has a value given by Expression (20), is flowed into the current mirror of the subtraction circuit 730 constituted by the N-channel MOS FETs 731 and 733 and through another current mirror 735 constituted by two P-channel MOS FETs, and then output from the output terminal 703 of the current-square circuit 636 as the output current $I_{out}$ of the current-square circuit 636.

Now, it is noted that the reference publication "A CLASS of Analog CMOS Circuits Based on the Square-Law Characteristic of an MOS Transistor in Saturation" presented by KLAAS BULT et al., which has already cited, discloses a technique to generate an output current in proportion to the square of the value of input current according to Expression (20) by use of an analog CMOS circuit.

As described above, the drop of PAE of an RF power amplifier circuit including multiple stages in low and middle power modes can be made smaller adopting a power control method, by which the quiescent current and gain of a next-stage amplifier are controlled in response to an output-power-control voltage $V_{apc}$ according to a continuous function higher than that for the control of those of a previous-stage amplifier by at least one in degree. In this case, it is assumed to use the composition of an RF power amplifier circuit as shown in FIG. 21 and the composition of a current-square circuit as shown in FIG. 7.

The study made by the inventors prior to the invention has revealed that the current-square circuit 636 shown in FIG. 7 has the following problem.

Figure 22:
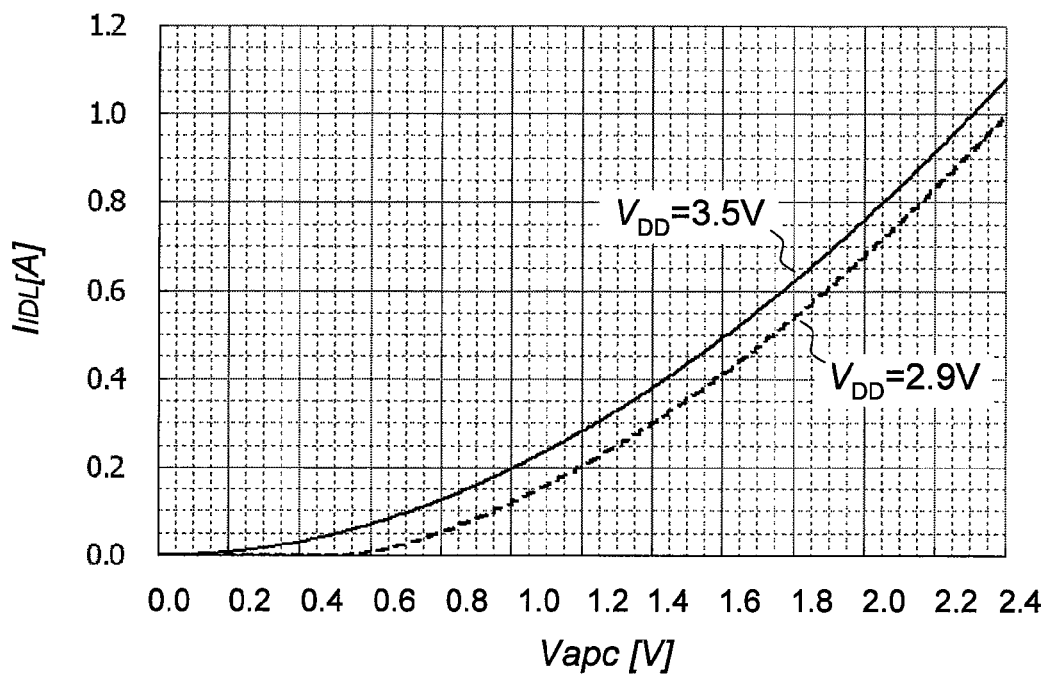
FIG. 22 is a diagram showing results of simulation concerning the quiescent current of the amplifier of the next-stage (third stage) when the power source voltage $V_{DD}$ is 3.5 and 2.9 volts, provided that in this case the composition of an RF power amplifier circuit of FIG. 21 and the composition of a current-square circuit of FIG. 7 are assumed.

FIG. 22 is a diagram showing results of simulation concerning the quiescent current of the amplifier of the next-stage (third stage) when the power source voltage $V_{DD}$ is 3.5 and 2.9 volts, provided that in this case the composition of an RF power amplifier circuit of FIG. 21 and the composition of a current-square circuit of FIG. 7 are assumed.

In the drawing, the horizontal axis corresponds to the output-power-control voltage $V_{apcr}$ and the vertical axis corresponds the quiescent current $I_{IDL}$ of the next-stage amplifier in the third stage. It can be seen from FIG. 22 that when the power source voltage $V_{DD}$ drops from 3.5 volts to 2.9 volts, the quiescent current $I_{IDL}$ of the next-stage amplifier of the third stage lowers.

Figure 23:
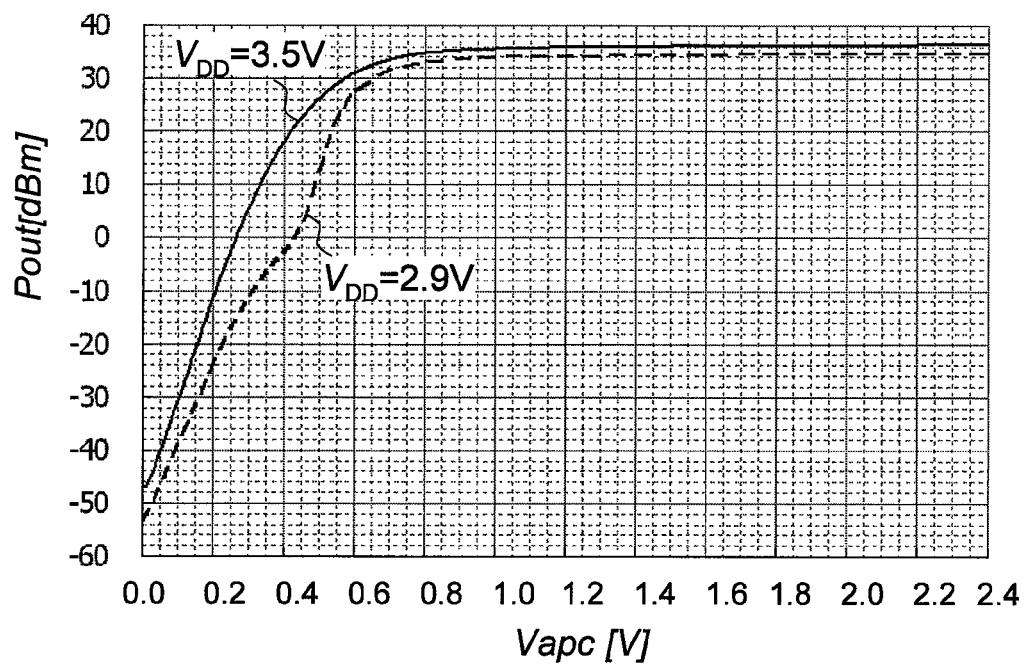
FIG. 23 is a diagram showing results of simulation concerning the transmitted power $P_{out}$ at an output terminal of the amplifier of the next-stage (third stage) when the power source voltage $V_{DD}$ is 3.5 and 2.9 volts, provided that in this case the composition of an RF power amplifier circuit of FIG. 21 and the composition of a current-square circuit of FIG. 7 are assumed.

FIG. 23 is a diagram showing results of simulation concerning the transmitted power $P_{out}$ at the output terminal of the amplifier of the next-stage (third stage) when the power source voltage $V_{DD}$ is 3.5 and 2.9 volts, provided that in this case the composition of an RF power amplifier circuit of FIG. 21 and the composition of a current-square circuit of FIG. 7 are assumed.

In the drawing, the horizontal axis corresponds to the output-power-control voltage $V_{apc}$, and the vertical axis corresponds to the transmitted power $P_{out}$ of the next-stage amplifier of the third stage. It can be seen from FIG. 23 that when the power source voltage $V_{DD}$ drops from 3.5 volts to 2.9 volts, the transmitted power $P_{out}$ in a low power region lowers remarkably.

As already described, in case of using the composition of an RF power amplifier circuit shown in FIG. 21 and the composition of a current-square circuit shown in FIG. 7, the reduction in the power source voltage $V_{dd}$ lowers the quiescent current $I_{IDL}$ and transmitted power $P_{out}$ of the next-stage (third-stage) amplifier. The study on the cause thereof by the inventors revealed that there is the mechanism as follows.

The time when the output current $I_{SQR}$ of the current-square base circuit 710 of the current-square circuit 636 shown in FIG. 7 (corresponding to the current-square circuit 1935 shown in FIG. 21) shows an ideal property as presented by Expression (20) is limited to when the power source voltage $V_{dd}$ is sufficiently high, and MOS FETs included in the current-square base circuit 710 operate in their saturation regions. It is required for the diode-connected transistors 713, 714 and 716 to operate in saturation regions that the source-drain voltage $V_{SD}$ be larger than the threshold voltage $V_{th}$. It is required for the transistors 711, 712, 715 and 717 to operate in saturation regions that the source-drain voltage $V_{SD}$ be larger than the difference between the source-gate voltage $V_{SG}$ and the threshold voltage $V_{th}$, namely $V_{sG}-V_{th}$. In such cases, the value of output current $I_{SQR}$ of the current-square base circuit 710 is changed continuously according to Expression (20) in inverse proportion to the value of the bias current $I_0$, and in proportion to the square of the value of input current $I_{in}$ to the current-input terminal 702.

However, as already described, under the condition where the power source voltage $V_{dd}$ has fallen, the sum of source-drain voltages $V_{SD}$ necessary for e.g. sets of transistors 711, 713 and 714, and 712, 715 and 716 connected in series between the source-voltage terminal 700 and the ground, and included in the current-square base circuit 710 to operate in saturation regions exceed the source voltage. As the amplifier operate in its linear region, the drain current lowers with the decrease in the source-drain voltage $V_{SD}$. Therefore, the bias current $I_0$ and the bias current $2I_0$ double the bias current $I_0$ running through the N-channel MOS FET 711 and N-channel MOS FET 712 respectively in response to the bias voltage $V_{bias}$ supplied to the bias-supply terminal 701 are stopped. In other words, in the current-square base circuit 710, the current flowing through the transistor 711 lowers to below the bias current $I_0$, and the current flowing through the transistor 712 lowers to below the bias current $2I_0$.

The inventors noticed the point that in case of using the composition of an RF power amplifier circuit shown in FIG. 21 and the composition of a current-square circuit shown in FIG. 7, the drop of the source voltage $V_{dd}$ lowers the quiescent current $I_{IDL}$ and transmitted power Pout of the next-stage (third-stage) amplifier according to the mechanism as described above. Now, a preferred embodiment devised in consideration of the noticed point will be described in detail.

[Embodiment 4_1]

<<Composition of RF Power Amplifier Circuit>>

FIG. 13 is a diagram showing the composition of an RF power amplifier circuit according to Embodiment 4_1 of the invention.

The RF power amplifier circuit shown in FIG. 13 includes an N-channel MOS FET Q1 as an amplifier of the final stage of an RF power amplifier circuit having amplifiers of multiple stages. In the RF power amplifier circuit, the MOS FET Q1 has a source coupled to the ground voltage, a gate connected with an input terminal 1123, to which an amplified RF output signal from the preceding stage is supplied, and a drain connected to a source-voltage-supply terminal 1120 through an inductor 1116 and to an output terminal 1124.

The gate of MOS FET Q1 of the final-stage amplifier is connected with a biasing N-channel MOS FET Q2 with the gate and drain connected together through a resistance 1111. The biasing N-channel MOS FET Q2 having its gate and drain connected together is coupled with an output terminal of the current-square-converter circuit 1101. To an input terminal of the current-square-converter circuit 1101, an output terminal of the voltage-current converter circuit 1100 is connected.

<<Composition of the Current-Square-Converter Circuit 1101>>

The current-square-converter circuit 1101 includes six P-channel MOS FETs M1, M2, M3, M4, M30 and M31. Between the input terminal of the current-square-converter circuit 1101 and the source-voltage-supply terminal 1120, the drain-source current path of the transistor M2 with the drain and gate connected together and the drain-source current path of the transistor M1 with the drain and gate connected together are connected in series. Between the ground and the source-voltage-supply terminal 1120, the drain-source current path of the transistor M3 and the drain-source current path of the transistor M31 are connected in series. The gate of the transistor M3 is connected with the drain and gate of the transistor M2. The gate of the transistor M31 is connected with the drain and gate of the transistor M30. Between the output terminal of the current-square-converter circuit 1101 and the source-voltage-supply terminal 1120, the drain-source current path of the transistor M4 is connected. The gate of the transistor M4 is connected to a connection node to which the drain of the transistor M31 and the source of the transistor M3 are connected.

The drain of the transistor M30 is connected to a bias-current-input terminal 1125. A substantially fixed bias current $I_0$ is made to flow into the bias-current-input terminal 1125 by connecting the drain of the source-grounded N-channel MOS FET with gate set to a substantially fixed bias voltage with the bias-current-input terminal 1125. For example, if the device size ratio of the transistor M30 vs. transistor M31 is 1:1, the substantially fixed bias current $I_0$ will be flowed into the transistor M31 and transistor M3 connected in series.

<<Composition and Action of the Voltage-Current Converter Circuit 1100>>

The voltage-current converter circuit 1100, which is supplied with the output-power-control voltage $V_{apc}$, includes a couple of voltage-dividing resistances 1113 and 1114, an operational amplifier OP1, a resistance 1112, a couple of P-channel MOS FETs M10 and M11, and a couple of N-channel MOS FETs M12 and M13. Between the input terminal 1121, which the output-power-control voltage $V_{apc}$ is supplied to, and the ground, the voltage-dividing resistances 1113 and 1114 are connected in series. The connection node, which the voltage-dividing resistances 1113 and 1114 are connected to, is connected with an inverting input of the operational amplifier OP1. The output terminal of the operational amplifier OP1 is connected to gates of the couple of P-channel MOS FETs M10 and M11 commonly. The sources of the couple of P-channel MOS FETs M10 and M11 are connected to the power-source-voltage terminal 1120 commonly. Of the couple of transistors M10 and M11, one transistor M10 has a drain connected to the non-inverting input of the operational amplifier OP1, and through the resistance 1112 to the ground. The other transistor M11 has a drain connected to the gate and drain of the N-channel MOS FET M12, and the gate of the N-channel MOS FET M13 commonly. The transistor M13 has a drain connected to the output terminal of the voltage-current converter circuit 1100.

On application of the output-power-control voltage $V_{apc}$ to the input terminal 1121 of the voltage-current converter circuit 1100, the divided voltage generated by the voltage-dividing resistances 1113 and 1114 is supplied to the inverting input of the operational amplifier OP1. Then, in a circuit constituted by the operational amplifier OP1, P-channel MOS FET M10 and resistance 1112, a current $I_{apc}$ in proportion to the divided voltage flows into a series circuit of the P-channel MOS FET M10 and resistance 1112. Incidentally, a combination of the P-channel MOS FETs M10 and M11, and a combination of the N-channel MOS FETs M12 and M13 each constitute a current mirror circuit. The mirror ratios of the current mirror circuits in the voltage-current converter circuit 1100 are set so as to achieve a quiescent current (bias current) which makes possible to gain the maximum output power $P_{out}$(max) of the standard for mobile communication systems with the RF power amplifier circuit in case that the output-power-control voltage $V_{apc}$ reaches the maximum value $V_{apc}$ (max).

The voltage $V_+$ of the non-inverting input of the operational amplifier OP1, and the voltage $V_-$ of the inverting input are given by the following Expressions (25) and (26):

$$V_+ = R_2 \cdot I_{apc}, \tag{25}$$

and $$V_- = V_{apc} \frac{R_4}{R_3 + R_4}. \tag{26}$$

An output voltage is supplied to the gate of the P-channel MOS FET M10 so that the voltage $V_+$ of the non-inverting input of the operational amplifier OP1, and the voltage $V_-$ of the inverting input are equal to each other. Therefore, from Expressions (25) and (26), the output-power-control current $I_{apc}$ can be presented by:

$$I_{apc} = \frac{R_4 \cdot V_{apc}}{R_2 \cdot (R_3 + R_4)}. \tag{27}$$

As to the voltage-current converter circuit 1100, when the device size ratio of the P-channel MOS FETs M10 and M11 is $N_{10}:N_{11}$ and the device size ratio of the N-channel MOS FETs M12 and M13 is $N_{12}:N_{13}$, the output current $I_{IN}$ flowing through the output terminal of the voltage-current converter circuit 1100 can be determined by:

$$I_{IN} = \frac{N_{13} \cdot N_{11} \cdot R_4 \cdot V_{apc}}{N_{12} \cdot N_{10} \cdot R_2 \cdot (R_3 + R_4)}. \tag{28}$$

As presented by Expressions (27) and (28), the output-power-control current $I_{apc}$ and output current $I_{IN}$ of the voltage-current converter circuit 1100 each follow a linear continuous function of the output-power-control voltage $V_{apc}$.

Particularly, to gain the maximum output power $P_{out}$ (max) of the standard with the RF power amplifier circuit, the value of the maximum output current $I_{IN}$(max) is set so that the four MOS transistors M1 to M4 of the current-square-converter circuit 1101, which the maximum output current $I_{IN}$(max) of the voltage-current converter circuit 1100 is supplied to, operate in subthreshold regions in case that the output-power-control voltage $V_{apc}$ reaches the maximum value $V_{apc}$(max).

<<Action of the Current-Square-Converter Circuit 1101>>

As described above, the value of the maximum output current $I_{IN}$ (max) of the voltage-current converter circuit 1100 supplied to the current-square-converter circuit 1101 is set so that the four MOS transistors M1 to M4 included in the current-square-converter circuit 1101 operate in subthreshold regions.

In the meantime, the subthreshold characteristics of a MOS transistor are described in the following reference publication:

Behzad Razavi (translation director, Tadahiro Kuroda): "Design of Analog CMOS Integrated Circuit" Basic Part, pp. 32-33, 7th impression, Mar. 10, 2006, Maruzen Co. Ltd.

According to the publication, under the condition that the voltage $V_{GS}$ between the gate and source of a MOS transistor is below the threshold voltage Vth, the drain current $I_D$ does not reach zero according to a weak inversion layer, and the drain current $I_D$ decreases exponentially with the reduction in the gate-source voltage $V_{GS}$.

It is termed "subthreshold leak current", and determined according to the following expression:

$$I_D = I_{SO} \cdot \exp\left(\frac{V_{GS}}{\zeta V_T}\right), \tag{29}$$

where $I_{SO}$ and $\zeta$ are constants depending on a MOS transistor manufacturing process, and particularly $\zeta(>1)$ is an error coefficient which shows how it deviates from an ideal value. Further, the thermal voltage $V_T$ is given by $V_T=kT/q$, where k is the Boltzmann constant, T is an absolute temperature, and q is an amount of charge of electrons. The constant $I_{SO}$ shall be herein referred as "saturation current".

The subthreshold leak current of a MOS transistor given by Expression (29) shows a characteristic curve similar to the $I_C/V_{BE}$ characteristic curve of a bipolar transistor, where $V_{BE}$ is the voltage between the base and emitter, and $I_C$ is collector current $I_C$. Specifically, under the condition the gate-source voltage $V_{GS}$ of a MOS transistor is lower than the threshold voltage Vth, the drain current $I_D$ decreases at a constant rate. Assuming the error coefficient $\zeta$ of a typical value and a room temperature, a drop of about 80 mV of the source-gate voltage $V_{GS}$ decreases the drain current $I_D$ by an order of magnitude.

<<Subthreshold Characteristic of MOS Transistor>>

FIG. 14 is a diagram for explaining the subthreshold characteristic of a MOS transistor.

FIG. 14 shows results of simulation of the characteristic curve of source-gate voltage $V_{SG}$ vs. drain current $I_D$ of a P-channel MOS FET having a device size the same as the device size of the four MOS transistors M1 to M4 included in the current-square-converter circuit 1101 shown in FIG. 13. As shown in the drawing, the threshold voltage Vth is about 1.2 volts.

The operational region Reg1 where the source-gate voltage $V_{SG}$ is lower than the threshold voltage Vth is a subthreshold region where the drain current $I_D$ does not reach zero owing to a weak inversion layer, and the value of drain current $I_D$ depends on the subthreshold leak current.

The operational region Reg2 where the source-gate voltage $V_{SG}$ is higher than the threshold voltage Vth is a saturation region where the value of drain current $I_D$ follows a square characteristic curve owing to a strong inversion layer.

As described above, the maximum output current $I_{IN}$(max) is set to a value so that the four MOS transistors M1 to M4 of the current-square-converter circuit 1101 operate in the subthreshold regions.

Further, the following expression is gained from Expression (29):

$$V_{GS} = \zeta V_T \ln\left(\frac{I_D}{I_{SO}}\right). \tag{30}$$

It can be seen from Expression (30) that the gate-source voltage $V_{GS}$ of a MOS transistor which shows the subthreshold characteristic depends on the ratio of the drain current $I_D$ to the saturation current $I_{SO}$. It is important that the condition of the gate-source voltage $V_{GS}$ lower than the threshold voltage Vth is maintained by setting the upper limit of the ratio of the drain current $I_D$ to the saturation current $I_{SO}$ in Expression (30) in case that the maximum output current $I_{IN}$(max) of the voltage-current converter circuit 1100 is supplied to the current-square-converter circuit 1101 in response to the maximum value $V_{apc}(\text{max})$ of the output-power-control voltage $V_{apc}$.

FIG. 15 is a diagram showing results of simulation of the characteristics the four MOS transistors M1 to M4 included in the current-square-converter circuit 1101 of FIG. 13, which shows that the four MOS transistors M1 to M4 can operate in the subthreshold regions within a predetermined range of the output-power-control voltage $V_{apc}$.

In the simulation shown by FIG. 15, the resistance values R2, R3 and R4 of the resistances 1112, 1113 and 1114 of the voltage-current converter circuit 1100 are as follows: R2=4.6 kΩ; R3=5 kΩ; and R4=5 kΩ. Further, the bias current $I_0$ is set to a value of $I_0$=25 μA. The device size ratio of the transistors M10 and M11 is $N_{10}:N_{11}$=4:1, and that of the transistors M12 and M13 is $N_{12}:N_{13}$=8:3.

Moreover, the gate length L and gate width W of the four MOS transistors M1 to M4 are set as follow:

L=2 μm, and

W=240 μm.

Further, in the simulation shown by FIG. 15, the output-power-control voltage $V_{apc}$ is changed in a range of 0.0 to 2.4 volts. In this range, the source-gate voltage $V_{SG}$ of the transistor M3 supplied with a substantially fixed bias current $I_0$ is kept at about 1.0 volt below the threshold voltage Vth of about 1.2 volts. Therefore, it can be seen that the transistor M3 operates in the subthreshold region. Further, in the range of changing the output-power-control voltage, the source-gate voltages $V_{SG}$ of the transistors M1, M2 and M4 in response to a change of the output current $I_{IN}$ of the voltage-current converter circuit 1100 are varied with a change of the output-power-control voltage $V_{apc}$. However, even when so changed, they are limited to values lower than the threshold voltage Vth of about 1.2 volts. Therefore, it can be seen that the transistors M1, M2 and M4 also operate in the subthreshold regions within the range of the changing the output-power-control voltage. Hence, to gain the maximum output power $P_{out}(\text{max})$ of the standard with the RF power amplifier circuit in the changing range as shown in FIG. 15, the maximum value $V_{apc}(\text{max})$ of the output-power-control voltage $V_{apc}$ is set to e.g. 2.4 volts. Thus, it becomes possible for the four MOS transistors M1 to M4 of the current-square-converter circuit 1101 of FIG. 13 to operate in the subthreshold regions in response to the output-power-control voltage $V_{apc}$ of or below the maximum value $V_{apc}(\text{max})$ at all times.

Therefore, assuming that a substantially fixed amount of bias current $I_0$ is flowed into the combination of the transistors M31 and M3 connected in series in the current-square-converter circuit 1101 of FIG. 13, the following expression can be derived in connection with source-gate voltages $V_{SG}$ of the four MOS transistors M1 to M4 of the current-square-converter circuit 1101.

$$V_{SGM1} + V_{SGM2} = V_{SGM3} + V_{SGM4} \quad (31)$$

Applying the relation presented by Expression (30) to Expression (31), the following expression is derived.

$$\zeta V_T \ln\left(\frac{I_{IN}}{I_{SO}}\right) + \zeta V_T \ln\left(\frac{I_{IN}}{I_{SO}}\right) = \zeta V_T \ln\left(\frac{I_0}{I_{SO}}\right) + \zeta V_T \ln\left(\frac{I_{SQR}}{I_{SO}}\right) \quad (32)$$

Specifically, in the current-square-converter circuit 1101 of FIG. 13, the output current $I_{IN}$ of the voltage-current converter circuit 1100 is flowed through the combination of the transistors M1 and M2 connected in series; a substantially fixed amount of bias current $I_0$ is flowed through the transistor M3; the output current $I_{SQR}$ of the current-square-converter circuit 1101 is flowed through the transistor M3.

The following expression is gained from Expression (32):

$$\ln\left(\frac{I_{IN} I_{IN}}{I_{SO} I_{SO}}\right) = \ln\left(\frac{I_0 I_{SQR}}{I_{SO} I_{SO}}\right). \quad (33)$$

Further, following expression is gained from Expression (33):

$$I_{SQR} = \frac{I_{IN}^2}{I_0}. \quad (34)$$

It can be seen from Expression (34) that the output current $I_{SQR}$ of the current-square-converter circuit 1101 changes continuously in inverse proportional to the value of the bias current $I_0$, and in proportion to the square of the output current $I_{IN}$ of the voltage-current converter circuit 1100.

Substituting Expression (28) into Expression (34), then the following expression is derived:

$$I_{SQR} = \frac{(N_{13} \cdot N_{11} \cdot R_4)^2 \cdot V_{apc}^2}{(N_{12} \cdot N_{10} \cdot R_2)^2 \cdot (R_3 + R_4)^2 \cdot I_0}. \quad (35)$$

It can be seen from Expression (35) that the output current $I_{SQR}$ of the current-square-converter circuit 1101 changes continuously in proportion to the square of the output-power-control voltage $V_{apc}$.

As shown in FIG. 13 in connection with the RF power amplifier circuit according to Embodiment 4_1 of the invention, the output current $I_{SQR}$ of the current-square-converter circuit 1101 is supplied to the biasing N-channel MOS FET Q2 with the gate and drain connected together. Therefore, the quiescent current of the MOS FET Q1 of the final-stage amplifier also changes continuously in proportion to the square of the output-power-control voltage $V_{apc}$.

Figure 16:
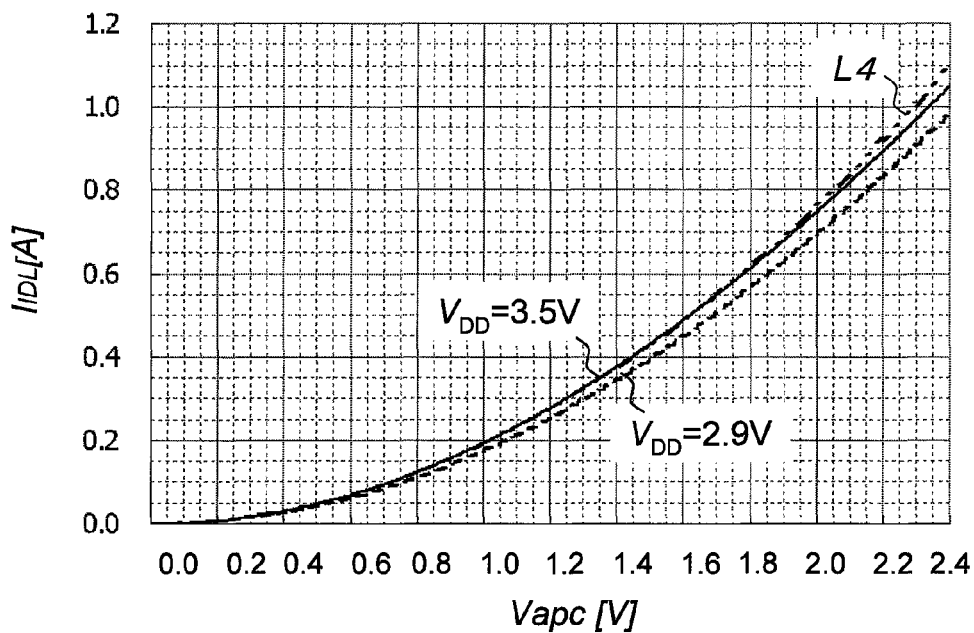
FIG. 16 is a diagram showing results of simulation of the quiescent current of the next-stage (third-stage) amplifier when the source voltages $V_{DD}$ are 3.5 and 2.9 volts in the RF power amplifier circuit according to Embodiment 4_1 of the invention including the voltage-current converter circuit 1100 and current-square-converter circuit 1101 shown in FIG. 13.

FIG. 16 is a diagram showing results of simulation of the quiescent current of the next-stage (third-stage) amplifier when the power source voltages $V_{DD}$ are 3.5 and 2.9 volts in the RF power amplifier circuit according to Embodiment 4_1 of the invention including the voltage-current converter circuit 1100 and current-square-converter circuit 1101 shown in FIG. 13.

In regard to FIG. 16 the horizontal axis corresponds to the output-power-control voltage $V_{apc}$, the vertical axis corresponds to the quiescent current $I_{IDL}$ of the third-stage amplifier of the next-stage, as in FIG. 22. It can be seen from FIG. 16 that a decrease of quiescent current $I_{IDL}$ of the third-stage amplifier of the next-stage in case that the power source voltage $V_{DD}$ lowers from 3.5 to 2.9 volts is smaller than that in the case shown in FIG. 22.

Now, it is noted that in regard to FIG. 16, the curve L4 shows a square characteristic curve according to calculation similar to that for the output current $I_{SQR}$ derived from Expression (35).

Figure 17:
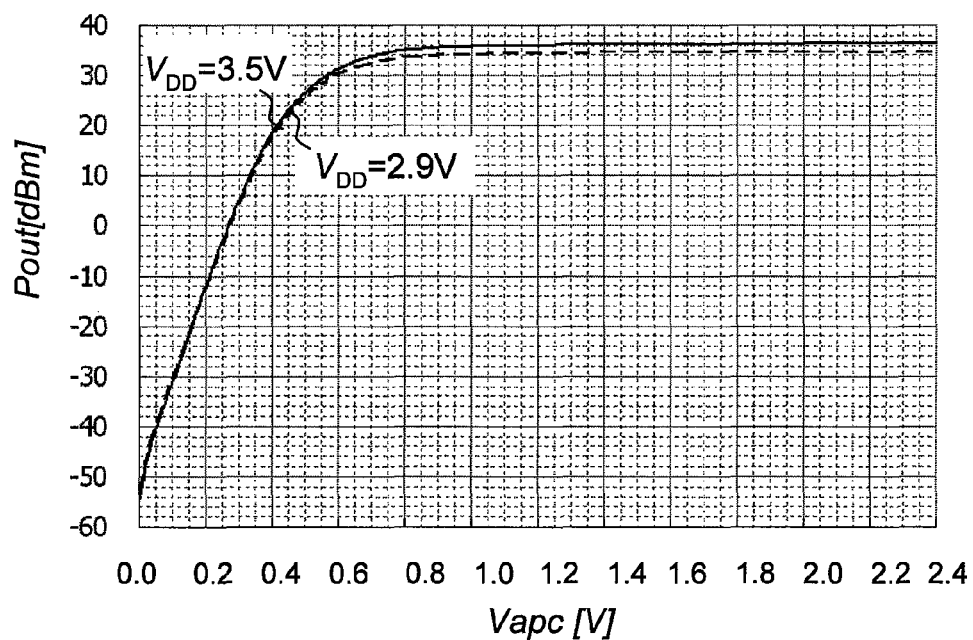
FIG. 17 is a diagram showing results of simulation of the transmitted power $P_{out}$ at the output terminal of the next-stage (third-stage) amplifier when the source voltage $V_{DD}$ is 3.5 and 2.9 volts in the RF power amplifier circuit according to Embodiment 4_1 of the invention including the voltage-current converter circuit 1100 and current-square-converter circuit 1101 shown in FIG. 13.

FIG. 17 is a diagram showing results of simulation of the transmitted power $P_{out}$ at the output terminal of the next-stage (third-stage) amplifier when the source voltage $V_{DD}$ is 3.5 and 2.9 volts in the RF power amplifier circuit according to Embodiment 4_1 of the invention including the voltage-current converter circuit 1100 and current-square-converter circuit 1101 shown in FIG. 13.

In regard to FIG. 17 the horizontal axis corresponds to the output-power-control voltage $V_{apc}$, the vertical axis corresponds to the transmitted power $P_{out}$ of the third-stage amplifier of the next-stage, as in FIG. 22. It can be seen from FIG. 17 that a decrease of the transmitted power $P_{out}$ in case that the power source voltage $V_{DD}$ lowers from 3.5 to 2.9 volts is smaller than that in the case shown in FIG. 22. Particularly, in FIG. 22, the transmitted power $P_{out}$ lowers close to 0 dBm with the power source voltage $V_{DD}$ of 2.9 volts and the output-power-control voltage $V_{apc}$ of 0.4 volts. In contrast, in FIG. 17, a value of the transmitted power $P_{out}$ as high as about 20 dBm can be maintained even with the source voltage $V_{DD}$ of 2.9 volts and the output-power-control voltage $V_{apc}$ of 0.4 volts.

As described above, according to the RF power amplifier circuit according to Embodiment 4_1 of the invention shown in FIG. 13, it becomes possible to make smaller the drop of PAE of an RF power amplifier circuit including multiple amplification stages in low and middle power modes.

[Embodiment 4_2]

<<Another Composition of RF Power Amplifier Circuit>>

FIG. 18 is a diagram showing the composition of an RF power amplifier circuit according to Embodiment 4_2 of the invention.

The RF power amplifier circuit according to Embodiment 4_1 shown in FIG. 13 includes an N-channel MOS FET Q1 and a biasing N-channel MOS FET Q2 with the gate and drain connected together, in which the N-channel MOS FET Q1 belongs to the final-stage amplifier of the RF power amplifier circuit having amplifiers of multiple stages. As the MOS FETs Q1 and Q2, LDMOSFET (Laterally Diffused MOSFET) having a good RF characteristic may be used. However, other kinds of transistors, e.g. BJT (Bipolar Junction Transistor), HBT (Hetero-junction Bipolar Transistor), MESFET (Metal Semiconductor Field Effect Transistor), and HEMT (High Electron Mobility Transistor), may be used.

The composition of an RF power amplifier circuit according to Embodiment 4_2 of the invention shown in FIG. 18 is arranged by replacing N-channel MOS FETs, i.e. the amplification transistor Q1 and the biasing transistor Q2, included in the RF power amplifier circuit according to Embodiment 4_1 shown in FIG. 13 with NPN-type heterojunction bipolar transistors, e.g. HBTs.

In this example, the amplification transistor Q1 and biasing transistor Q2 of the RF power amplifier circuit of FIG. 18 are each formed in a chip of compound semiconductor e.g. GaAs. Further, arranging an output-power-control circuit of the RF power amplifier circuit, including the voltage-current converter circuit 1100 and current-square-converter circuit 1101, in the a CMOS silicon semiconductor chip, an RF power module can be formed.

Now, it is noted that the actions of the RF power amplifier circuit according to Embodiment 4_2 of the invention shown in FIG. 18 are the same as those of the RF power amplifier circuit according to Embodiment 4_1 shown in FIG. 13, and their descriptions are omitted here.

[Embodiment 4_3]

<<RF Power Amplifier Circuit Having Amplifiers of Multiple Stages>>

FIG. 19 is a diagram showing the composition of an RF power amplifier circuit having amplifiers of multiple stages according to Embodiment 4_3 of the invention.

Like the RF power amplifier circuit shown in FIG. 13, the RF power amplifier circuit shown in FIG. 19 includes an N-channel MOS FET Q1, a biasing N-channel MOS FET Q2 with the gate and drain connected together, a resistance 1111, and an inductor 1116, which constitute the final-stage amplifier of the RF power amplifier circuit having amplifiers of multiple stages.

Further, like the RF power amplifier circuit of FIG. 13, the RF power amplifier circuit shown in FIG. 19 includes a voltage-current converter circuit 1100 and a current-square-converter circuit 1101, which are for supplying the biasing N-channel MOS FET Q2 with an output current $I_{SQR}$ as a bias current in response to the output-power-control voltage $V_{apc}$.

The RF power amplifier circuit shown in FIG. 19 further includes an N-channel MOS FET Q715, a biasing N-channel MOS FET Q709 with the gate and drain connected together, a resistance 1706, and an inductor 1718, which constitute the beginning-stage amplifier of the RF power amplifier circuit.

Also, the RF power amplifier circuit shown in FIG. 19 includes an N-channel MOS FET Q716, a biasing N-channel MOS FET Q710 with the gate and drain connected together, a resistance 1707, and an inductor 1719, which constitute the middle-stage amplifier of the RF power amplifier circuit.

Still further, the RF power amplifier circuit shown in FIG. 19 includes two P-channel MOS FETs M21 and M22; gates of the MOS FETs M21 and M22 are supplied with an output voltage from the output terminal of the operational amplifier OP1 of the voltage-current converter circuit 1100, and the sources are connected to the source-voltage-supply terminal 1120 like the two P-channel MOS FETs M10 and M11 of the voltage-current converter circuit 1100. The drains of the transistors M21 and M22 are connected to a biasing transistor Q709 of the top-stage amplifier and a biasing transistor Q710 of the middle-stage amplifier, respectively.

Therefore, the quiescent current of the amplification transistor Q715 of the top-stage amplifier, and the quiescent current of the amplification transistor Q716 of the middle-stage amplifier are each controlled according to a linear continuous function of the output-power-control voltage $V_{apc}$.

In the RF power amplifier circuit shown in FIG. 19, the device sizes of amplification transistors of respective amplification stages are made larger from stage to stage in the order of the amplification transistor Q715 of the top-stage amplifier, the amplification transistor Q716 of the middle-stage amplifier and the amplification transistor Q1 of the final-stage amplifier.

In the RF power amplifier circuit shown in FIG. 19, the quiescent current of the amplification transistor Q1 of the final-stage amplifier is controlled continuously in proportion to the square of the output-power-control voltage $V_{apc}$. Thus, according to the RF power amplifier circuit shown in FIG. 19, it becomes possible to make smaller the drop of PAE of an RF power amplifier circuit including multiple amplification stages in low and middle power modes.

In the RF power amplifier circuit shown in FIG. 19, matching networks (MN) 1712, 1713 and 1714 each including passive elements are connected to the amplification transistor Q715 of the top-stage amplifier, the amplification transistor Q716 of the middle-stage amplifier, and the amplification transistor Q1 of the final-stage amplifier. An RF transmission input signal $P_{in}$ supplied to the input terminal 1701 is fed through the input matching network 1712 to the gate of the amplification transistor Q715 of the top-stage amplifier. A first-stage amplified output signal from the drain of the amplification transistor Q715 of the top-stage amplifier is supplied through the inter-stage matching network 1713 to the gate of the amplification transistor Q716 of the middle-stage amplifier. A first-stage amplified output signal from the drain of the amplification transistor Q716 of the middle-stage amplifier is sent through the inter-stage matching network 1714 to the gate of the amplification transistor Q1 of the final-stage amplifier. Thus, the RF transmission output signal $P_{out}$ arises from the drain of the amplification transistor Q1 of the final-stage amplifier, which is output through the output terminal 1124. The matching networks (MN) 1712, 1713 and 1714 perform conversion of input/output impedances of the amplifiers of the beginning, middle and final stages thereby to reduce the reflection loss of an RF transmission signal owing to an impedance mismatch.

It is noted that as to the RF power amplifier circuit shown in FIG. 19, the amplification transistor Q715 of the beginning-stage amplifier, the amplification transistor Q716 of the middle-stage amplifier, and the amplification transistor Q1 of the final-stage amplifier may be heterojunction bipolar transistors such as HBTs. In this case, the biasing transistors Q709, Q710 and Q2 are replaced with diode-connected heterojunction bipolar transistors, such as base-collector connected HBTs.

[Embodiment 4_4]

<<Composition of RF Power Module>>

FIG. 20 is a block diagram showing the composition of an RF power module according to Embodiment 4_4 of the invention.

The RF power module shown in FIG. 20 supports two frequency bands, namely GSM system low and high bands (GSM900 ranging 880 to 915 MHz, and DCS1800 ranging 1710 to 1785 MHz). Therefore, the RF power module shown in FIG. 20 includes: an RF power transmitter circuit 1810 supporting the low frequency band of GSM900; an RF power transmitter circuit 1820 supporting the high frequency band of DCS1800; a transmitted-power feedback circuit 1830; a signal-route switching circuit 1840; an output-power-control circuit 1815. A mobile phone terminal is assembled by connecting the RF power module with: e.g. a modulator circuit operable to supply RF transmission signals Pin_GSM and Pin_DCS at transmitter-signal input terminals 1800 and 1804; a demodulator circuit operable to demodulate RF received signals Rx_DCS and RX_GSM at received-signal output terminals 1805 and 1807; a baseband signal processing semiconductor IC operable to generate control signals at control terminals 1801, 1802 and 1803; and a sending/receiving antenna at an antenna terminal 1806.

The RF power transmitter circuit 1810 supporting the low frequency band of GSM900 includes: an RF power amplifier 1811; an output matching network 1812; a coupler 1813; a low-pass filter 1814; and an output-power-control circuit 1815. The RF power transmitter circuit 1820 supporting the high frequency band of DCS1800 includes: an RF power amplifier 1821; an output matching network 1822; a coupler 1823; a low-pass filter 1824; and an output-power-control circuit 1815.

The transmitted-power feedback circuit 1830, which is connected with the RF power transmitter circuit 1810 supporting the low band and the RF power transmitter circuit 1820 supporting the high band, includes: power detector circuits 1832 and 1833; an error amplifier 1834; and a circuit switch 1831. The signal-route switching circuit 1840, which is connected with the RF power transmitter circuit 1810 supporting the low band and the RF power transmitter circuit 1820 supporting the high band, includes: an antenna switch 1841; and ESD (Electro-Static Destruction) filters 1842, 1843 and 1844.

In the RF power module shown in FIG. 20, the RF power amplifier 1811 included in the RF power transmitter circuit 1810 supporting the GSM900 frequency band, and the RF power amplifier 1821 included in the RF power transmitter circuit 1820 supporting the DCS1800 frequency band are controlled in the level of transmitted power by the output-power-control circuit 1815 connected with the error amplifier 1834 of the transmitted-power feedback circuit 1830. Specifically, the output-power-control voltage $V_{apc}$ out of the output terminal 1816 of the error amplifier 1834 of the transmitted-power feedback circuit 1830 is supplied to the input control terminal of the output-power-control circuit 1815, and thus the RF power amplifier 1811 supporting the low band, and the RF power amplifier 1821 supporting the high band are controlled in the level of transmitted power.

The RF power amplifier 1811 supporting the low band, and the RF power amplifier 1821 supporting the high band may be each composed of the RF power amplifier circuit according to one of Embodiments 4_1, 4_2 and 4_3 of the invention, which are shown in FIGS. 13, 18 and 19 respectively. As the RF power transmitter circuit 1810 supporting the low band, and the RF power transmitter circuit 1820 supporting the high band can share the transmitted-power feedback circuit 1830 and output-power-control circuit 1815, the RF power module can be reduced in size.

The output matching networks 1812 and 1822, which are connected with output terminals of the RF power amplifiers 1811 and 1821 respectively, have the function of minimizing the reflection loss of an RF transmission signal owing to a load impedance mismatch in connection with the sending/receiving antenna. The couplers 1813 and 1823 have the function of supplying part of RF transmission signals supplied from the output matching networks 1812 and 1822 to the transmitted-power feedback circuit 1830, and feeding almost all of the remaining part of the RF transmission signals to the low-pass filters 1814 and 1824. The low-pass filters 1814 and 1824 have the function of attenuating harmonic distortions caused at the time of amplification of RF transmission signals by the RF power amplifier circuits 1811 and 1821. The power detector circuits 1832 and 1833 have the function of supplying the error amplifier 1834 with detection output voltages $V_{det}$ corresponding to RF signal powers supplied from the couplers 1813 and 1823. The error amplifier 1834 amplifies a difference between an external control voltage $V_{ramp}$ supplied through the control terminal 1803 and the detection output voltage $V_{det}$ from each of the power detector circuits 1832 and 1833, and then generates an output-power-control voltage $V_{apc}$ so as to minimize the difference. Further, the ESD filters 1842, 1843 and 1844 serve to prevent the static electricity coming through external terminals 1807, 1806 and 1805 from destructing the RF power amplifier module, and to attenuate spurious. The antenna switch 1841 performs sending and receiving actions, and switches the signal transmission route of RF signals output or supplied through the antenna terminal 1806 according to sending and receiving actions in the GSM900 frequency band, and sending and receiving actions in the DCS1800 frequency band. Specifically, the antenna switch 1841 functions so that an RF signal output from the RF power transmitter circuit 1810 is conveyed to the antenna terminal 1806 at the time of sending in the GSM900 frequency band; an RF signal supplied through the antenna terminal 1806 is conveyed to the received-signal output terminal 1807 at the time of receiving in the GSM900 frequency band; an RF signal output by the RF power transmitter circuit 1820 is conveyed to the antenna terminal 1806 at the time of sending in the DCS1800 frequency band; a signal supplied through the antenna terminal 1806 is conveyed to the received-signal output terminal 1805 at the time of receiving in the DCS1800 frequency band. The circuit switch 1831 has the functions of switching the actions of the output-power-control circuit 1815, the power detector circuits 1832 and 1833, the error amplifier 1834, and the antenna switch 1841 in response to a sending/receiving action switching signal, and a low/high-sending-frequency-band select signal, supplied to the control terminals 1801 and 1802.

In the sending action, the RF power amplifier module according to this embodiment amplifies, in power, RF transmission signals of the low/high frequency band supplied through the transmitter-signal input terminals 1800 and 1804 to a desired output power level in the RF power transmitter circuits 1810 and 1820, flowes the resultant signals through the signal-route switching circuit 1840, and then outputs RF transmission signals through the antenna terminal 1806. The output power level in the sending action is controlled by indirectly changing the output-power-control voltage $V_{apc}$ from the output terminal 1816 of the error amplifier 1834 by use of the external control voltage $V_{ramp}$ supplied through the control terminal 1803. Further, in the receiving action, RF received signals of the low/high frequency band supplied through the antenna terminal 1806 are conveyed to the received-signal output terminals 1807 and 1805.

In the action of sending an RF transmission signal of the low band, i.e. GSM900 frequency band, the RF power transmitter circuit 1810 supporting the low band, the transmitted-power feedback circuit 1830, and the output-power-control circuit 1815 form a feedback loop. The output-power-control circuit 1815 controls, in response to the output-power-control voltage $V_{apc}$, the transmitted-power level of the RF power amplifier circuit 1811 included in the RF power transmitter circuit 1810 supporting the low band so as to minimize the difference between the external control voltage $V_{ramp}$ supplied to the control terminal 1803, and the detection output voltage $V_{det}$ from the power detector circuit 1832. As a result, it becomes possible to reduce the fluctuation in the transmitted output level of the RF power transmitter circuit 1810 supporting the low band owing to the change in external environment, such as the change in the source voltage, the change in the temperature, and the change in load of the sending/receiving antenna.

In the action of sending an RF transmission signal of the high band, i.e. DCS1800 frequency band, the RF power transmitter circuit 1820 supporting the high band, the transmitted-power feedback circuit 1830, and the output-power-control circuit 1815 form a feedback loop. The output-power-control circuit 1815 controls, in response to the output-power-control voltage $V_{apc}$, the transmitted-power level of the RF power amplifier circuit 1821 included in the RF power transmitter circuit 1820 supporting the high band so as to minimize the difference between the external control voltage $V_{ramp}$ supplied to the control terminal 1803, and the detection output voltage $V_{det}$ from the power detector circuit 1833. As a result, it becomes possible to reduce the fluctuation in the transmitted output level of the RF power transmitter circuit 1820 supporting the high band owing to the change in external environment, such as the change in the power source voltage, the change in the temperature, and the change in load of the sending/receiving antenna.

As to specific circuit compositions for the output matching networks 1812 and 1822, the couplers 1813 and 1823, and the low-pass filters 1814 and 1824, which are included the RF power transmitter circuits 1810 and 1820 of the RF power amplifier module shown in FIG. 20, and the transmitted-power feedback circuit 1830, and the signal-route switching circuit 1840, various compositions may be adopted for them. Therefore, their descriptions are omitted here.

While the invention made by the inventor has been specifically described above focusing on various embodiments thereof, it is not so limited. It is obvious that various changes and modifications may be made without departing from the scope of the invention.

[Other Embodiment]

For example, in regard to the embodiments described with reference to FIGS. 18 and 19, an RF power amplifier circuit may be formed in a monolithic integrated circuit which incorporates CMOSFETs (Complementally MOSFETs). However, the invention is not so limited.

Further, the voltage-current converter circuit 1100 according to each of the embodiments described with reference to FIGS. 13, 18 and 19 may be arranged so that a divided voltage generated by the voltage-dividing resistances 1113 and 1114 is supplied through a P-channel MOS FET to the inverting input of the operational amplifier OP1, and the voltage of the resistance 1112 is provided through a P-channel MOS FET and an offset resistance to the non-inverting input of the operational amplifier OP1 as arranged in the RF power amplifier circuit shown in FIG. 6. If making such arrangement, the offset resistance can prevent a feeble noise component contained in the output-power-control voltage $V_{apc}$ from causing the output-power-control current $I_{apc}$ to flow, and consequently activating the RF power amplifier circuit in the condition where the RF power amplifier circuit is out of action, i.e. the output-power-control current $I_{apc}$ is not made to flow through the circuit.

As to the above embodiments, the examples of application of the invention to the GSM900 frequency band as a low band and the DCS1800 frequency band as a high band has been described mainly. However, the effect of the invention is not achieved exclusively in the application to the GSM900 and DCS1800 frequency bands. The invention is applicable to other GSM frequency bands, such as a GSM850 frequency band (824 to 849 MHz) for the low band, and a PCS1900 frequency band (1850 to 1910 MHz) for the high band.

Further, as to the embodiment described with reference to FIG. 13, for example, it is possible to continuously change the output current $I_{SQR}$ of the current-square-converter circuit 1101 in inverse proportion to the square of the bias current $I_0$, and in proportion to the cube of the output current $I_{IN}$ of the voltage-current converter circuit 1100. In that case, the drain-source current path of a P-channel MOS FET M5 with the drain and gate connected together is connected between the transistors M1 and M2 in the current-square-converter circuit 1101. In addition, the drain-source current path of a P-channel MOS FET M6 with the drain and gate connected together is connected between transistors M31 and M3 in the current-square-converter circuit 1101, and the gate of the transistor M4 is connected to the source of the transistor M6. A circuit formed by connecting the transistors M5 and M6 in the current-square-converter circuit 1101 in the way as described above is herein referred to as "current-cube-converter circuit", and the output current of the current-cube-converter circuit flowed through the transistor M4 is denoted by $I_{CUB}$.

If it is assumed for the current-cube-converter circuit that a substantially fixed bias current $I_0$ is flowed through a group of the transistors M31, M6 and M3 connected in series, the following expression concerning source-gate voltages $V_{SG}$ of the six MOS transistors M1 to M6 of the current-cube-converter circuit is obtained.

$$I_{SQR} = \frac{(N_{13} \cdot N_{11} \cdot R_4)^2 \cdot V_{apc}^2}{(N_{12} \cdot N_{10} \cdot R_2)^2 \cdot (R_3 + R_4)^2 \cdot I_0} \tag{36}$$

Applying the relation presented by Expression (30) to the source-gate voltages $V_{SG}$ of the MOS transistors M1 to M6, the following expression can be obtained.

$$\zeta V_T \ln\left(\frac{I_{IN}}{I_{SO}}\right) + \zeta V_T \ln\left(\frac{I_{IN}}{I_{SO}}\right) + \zeta V_T \ln\left(\frac{I_{IN}}{I_{SO}}\right) = \quad (37)$$

$$\zeta V_T \ln\left(\frac{I_0}{I_{SO}}\right) + \zeta V_T \ln\left(\frac{I_0}{I_{SO}}\right) + \zeta V_T \ln\left(\frac{I_{CUB}}{I_{SO}}\right)$$

That is, in the current-cube-converter circuit, the output current $I_{IN}$ of the voltage-current converter circuit 1100 is flowed through the series-connected transistors M1, M5 and M2; the substantially fixed bias current I0 is flowed through the transistors M3 and M6; and the output current $I_{CUB}$ of the current-cube-converter circuit 1101 is flowed through the transistor M4.

The following expression is derived from Expression (37):

$$\ln\left(\frac{I_{IN} I_{IN} I_{IN}}{I_{SO} I_{SO} I_{SO}}\right) = \ln\left(\frac{I_0 I_0 I_{CUB}}{I_{SO} I_{SO} I_{SO}}\right). \quad (38)$$

Further, the following expression is derived from Expression (38):

$$I_{CUB} = \frac{I_{IN}^3}{I_0^2}. \quad (39)$$

It can be seen from Expression (39) that the output current $I_{CUB}$ of the current-cube-converter circuit 1101 is changed continuously in inverse proportion to the square of the bias current $I_0$, and in proportion to the cube of the output current $I_{IN}$ of the voltage-current converter circuit 1100.

Substituting Expression (28) into Expression (39), then the following expression is obtained.

$$I_{CUB} = \frac{(N_{13} \cdot N_{11} \cdot R_4)^3 \cdot V_{apc}^3}{(N_{12} \cdot N_{10} \cdot R_2)^3 \cdot (R_3 + R_4)^3 \cdot I_0^2} \quad (40)$$

It can be seen from Expression (40) that the output current $I_{CUB}$ of the current-cube-converter circuit 1101 is changed continuously in proportion to the cube of the output-power-control voltage $V_{apc}$.

The invention can be widely adopted for RF power amplifier circuits used for other-than-GSM communication systems including WCDMA (Wide-band Code Division Multiple Access), WiMAX (Worldwide Interoperability for Microwave Access), and LTE (Long Term Evolution), and other frequency bands.

What is claimed is:

1. An RF power amplifier module, comprising:
    a first RF power amplifier circuit operable to amplify an RF transmission input signal of a first frequency band;
    a second RF power amplifier circuit operable to amplify an RF transmission input signal of a second frequency band; and
    an output-power controller,
    wherein the output-power controller includes a first power detector, a second power detector, and an error amplifier,
    wherein the first power detector detects a level of a first RF transmission signal arising from an output terminal of the first RF power amplifier circuit,
    wherein the second power detector detects a level of a second RF transmission signal arising from an output terminal of the second RF power amplifier circuit,
    wherein the error amplifier generates a power control voltage in response to a difference between an external control voltage and a detection output voltage from each of the first and second power detectors,
    wherein the first and second RF power amplifier circuits each include an amplifier and a controller,
    wherein the amplifier responds to an RF transmission input signal accepted through an input terminal, generates an RF transmission output signal, and outputs the signal through an output terminal,
    wherein the controller includes a first control unit and a second control unit,
    wherein the first control unit responds to an output-power-control voltage supplied to a first input control terminal, generates a first output current, and outputs the first current from a first output control terminal,
    wherein the second control unit responds to the first output current from the first control unit supplied to an second input control terminal, generates a second output current for deciding a quiescent current of an amplification transistor of the amplifier, and outputs the second current from a second output control terminal,
    wherein a maximum value of the output-power-control voltage is set to a predetermined voltage value, whereby a maximum value of the first output current arising from the first output control terminal of the first control unit is set to a predetermined current value,
    wherein the second control unit includes a plurality of MOS transistors operable to respond to the first output current from the first control unit and generate the second output current, and
    wherein the plurality of MOS transistors of the second control unit respond to the first output current of the first control unit set to the predetermined maximum value, and operate in respective subthreshold regions.

2. The RF power amplifier module according to claim 1,
    wherein the amplifier is a next-stage amplifier of amplifiers of multiple stages,
    wherein the multiple stages' amplifiers include a previous-stage amplifier operable to supply an amplified RF signal to the next-stage amplifier,
    wherein, in response to the output-power-control voltage, a quiescent current of the previous-stage amplifier is changed continuously according to a first continuous function, and the quiescent current of the next-stage amplifier is changed continuously according to a second continuous function, and
    wherein the second continuous function is higher than the first continuous function by at least one in degree.

3. The RF power amplifier module according to claim 2,
    wherein an amplification transistor of the next-stage amplifier is set to be larger than an amplification transistor of the previous-stage amplifier in device size.

4. The RF power amplifier module according to claim 3,
    wherein the plurality of MOS transistors of the second control unit include a first MOS transistor, a second MOS transistor, a third MOS transistor and a fourth MOS transistor,
    wherein the first and second MOS transistors each have a gate and a drain connected with each other,
    wherein a drain-source current path of the first MOS transistor is connected with a drain-source current path of the second MOS transistor in series, and the first output current from the first control unit can be supplied to the series-connected drain-source current paths,
    wherein the gate of the second MOS transistor is connected with a gate of the third MOS transistor arranged so that a substantially fixed bias current can be flowed therethrough, and a source of the third MOS transistor is connected with a gate of the fourth MOS transistor arranged so that the second output current can be flowed therethrough, and wherein the second output current is a current in proportion to a square of the first output current.

5. The RF power amplifier module according to claim 4, further comprising:

a first biasing transistor; and a second biasing transistor, wherein the first biasing transistor is current-mirror connected with the amplification transistor of the previous-stage amplifier, and the second biasing transistor is current-mirror connected with the amplification transistor of the next-stage amplifier, wherein a first bias current for continuously changing the quiescent current of the previous-stage amplifier according to the first continuous function is supplied to the first biasing transistor, and wherein a second bias current for continuously changing the quiescent current of the next-stage amplifier according to the second continuous function is supplied to the second biasing transistor.

6. The RF power amplifier module according to claim 5, wherein the controller is composed of a monolithic integrated circuit including a CMOS transistor.

7. The RF power amplifier module according to claim 6, wherein the amplification transistor of the previous-stage amplifier, the amplification transistor of the next-stage amplifier, and the first and second biasing transistors are each composed of a MOS transistor.

8. The RF power amplifier module according to claim 6, wherein the amplification transistor of the previous-stage amplifier, the amplification transistor of the next-stage amplifier, and the first and second biasing transistors are each composed of a bipolar transistor.

9. The RF power amplifier module according to claim 7, wherein the MOS transistor is an LDMOS transistor.

10. The RF power amplifier module according to claim 8, wherein the bipolar transistor is a heterojunction ipolar transistor.

* * * * *